United States Patent
Sasaki et al.

(10) Patent No.: US 8,933,327 B2
(45) Date of Patent: Jan. 13, 2015

(54) THIN-FILM PHOTOELECTRIC CONVERTER AND FABRICATION METHOD THEREFOR

(75) Inventors: Toshiaki Sasaki, Otsu (JP); Naoki Kadota, Otsu (JP)

(73) Assignee: Kaneka Corporation, Osaka-shi (JP)

( * ) Notice: Subject to any disclaimer, the term of this patent is extended or adjusted under 35 U.S.C. 154(b) by 251 days.

(21) Appl. No.: 13/061,036

(22) PCT Filed: Aug. 24, 2009

(86) PCT No.: PCT/JP2009/064697
§ 371 (c)(1),
(2), (4) Date: Feb. 25, 2011

(87) PCT Pub. No.: WO2010/024211
PCT Pub. Date: Mar. 4, 2010

(65) Prior Publication Data
US 2011/0146756 A1    Jun. 23, 2011

(30) Foreign Application Priority Data

Aug. 29, 2008 (JP) ................................ 2008-222602

(51) Int. Cl.
| | |
|---|---|
| H01L 31/0232 | (2014.01) |
| H01L 31/18 | (2006.01) |
| H01L 31/075 | (2012.01) |
| H01L 31/028 | (2006.01) |
| H01L 31/076 | (2012.01) |

(52) U.S. Cl.
CPC ............ *H01L 31/075* (2013.01); *H01L 31/028* (2013.01); *H01L 31/076* (2013.01); *H01L 31/1804* (2013.01); *Y02E 10/548* (2013.01); *Y02E 10/547* (2013.01)
USPC .............................. 136/261; 136/252; 438/94

(58) Field of Classification Search
USPC ..................... 136/261, 252; 438/94
See application file for complete search history.

(56) References Cited

U.S. PATENT DOCUMENTS 5,006,180 A * 4/1991 Kanai et al. .................. 136/258
6,180,870 B1    1/2001 Sano et al.
(Continued)

FOREIGN PATENT DOCUMENTS

| JP | 61189632 A | 8/1986 |
|---|---|---|
| JP | 8088189 A | 4/1996 |

(Continued)

OTHER PUBLICATIONS

ISA The International Bureau of WIPO, International Preliminary Report of Patentability, Apr. 21, 2011, 7 pages.

(Continued)

*Primary Examiner* — Golam Mowla
(74) *Attorney, Agent, or Firm* — Alleman Hall McCoy Russell & Tuttle LLP

(57) ABSTRACT

A conventional thin-film photoelectric converter using amorphous germanium or crystalline silicon as a photoelectric conversion layer is problematic in that light having a long wavelength of 1100 nm or more cannot be used for photoelectric conversion, and is inefficient. The problem is solved by a thin-film photoelectric converter including one or more photoelectric conversion units each having a photoelectric conversion layer sandwiched between a p-type semiconductor layer and an n-type semiconductor layer, wherein the photoelectric conversion layer of at least one photoelectric conversion unit includes an intrinsic or weak n-type crystalline germanium semiconductor, and the absorption coefficient of infrared-absorption peak at wave number of 935±5 $cm^{-1}$ of the crystalline germanium semiconductor is less than 6000 $cm^{-1}$. The problem is also solved by a thin-film photoelectric converter having acrystalline germanium semiconductor whose absorption coefficient of infrared-absorption peak at wave number of 960±5 $cm^{-1}$ is less than 3500 $cm^{-1}$.

15 Claims, 40 Drawing Sheets

(56) References Cited

U.S. PATENT DOCUMENTS

| | | | |
|---|---|---|---|
| 6,399,873 B1 * | 6/2002 | Sano et al. | 136/249 |
| 6,835,888 B2 * | 12/2004 | Sano et al. | 136/249 |
| 7,064,263 B2 * | 6/2006 | Sano et al. | 136/249 |

FOREIGN PATENT DOCUMENTS

| | | |
|---|---|---|
| JP | 10125944 A | 5/1998 |
| JP | 2001332503 A | 11/2001 |
| JP | 2004266111 A | 9/2004 |
| JP | 2009141059 A | 6/2009 |

OTHER PUBLICATIONS

Imura, T. et al., "Growth of Hydrogenated Germanium Microcrystal by Reactive Sputtering", Japanese Journal of Applied Physics, vol. 22, No. 8, pp. L505-L507, Aug. 1983, 3 pages.

Ichikawa et al ,"Plasma Semiconductor Process Engineering" Section 5.8.4, Uchida Rokakuho Publishing Co., Ltd., Jul. 2003, pp. 172-179.

ISA Japanese Patent Office, International Search Report of PCT/JP2009/064697, Nov. 10, 2009, 2 pages.

Yasutoshi, Y. et al, "Influence of plasma power and substrate temperature on structure of nanocrystalline germanium carbon thin films by VHF plasma CVD," Journal of Non-Crystalline Solids, vol. 354, pp. 2355-2358, Jan. 28, 2008, 4 pages.

Niu, X. et al, "Growth and properties of nanocrystalline germanium films," Journal of Applied Physics, vol. 98, pp. 096103-1-096103-3, Nov. 4, 2005, 3 pages.

Niu, X. et al, "Growth and Properties of Nanocrystalline Germanium and Germanium-Carbide Films and Devices", Dept. of Electrical and Computer Engineering and Microelectronics Research Center, Iowa State University, pp. 1508-1511, 4 pages, Publication Year 2005.

Takuya, M. et al, "Microcrystalline Si1-xGex Solar Cells Exhibiting Enhanced Infrared Response with Reduced Absorber Thickness," The Japan Society of Applied Physics, pp. 031501-1-031501-3, Mar. 7, 2008, 3 pages.

Niu, X. et al, "Nanocrystalline Germanium and Germanium Carbide Films and Devices," Materials Research Society, vol. 862, pp. A10.2.1-A10.2.6, 2005, 6 pages.

* cited by examiner

THIN-FILM PHOTOELECTRIC CONVERTER AND FABRICATION METHOD THEREFOR

TECHNICAL FIELD

The invention relates to improvements in a thin-film photoelectric converter, and more specifically, relates to improvements of utility efficiency of light having long wavelengths by utilizing a crystalline germanium semiconductor. In the present specification, the terms "crystalline" and "microcrystalline" are also applied to a state in which an amorphous structure is partially included, as has been used in the relevant technical field.

BACKGROUND ART

In recent years, public attention has been focused on a photoelectric converter that converts light to electricity by utilizing a photoelectric effect inside a semiconductor, and development of the device has been vigorously carried out. Among these developments, a silicon-based thin-film photoelectric converter has been promising as a device that can achieve low costs, because it can be formed on a glass substrate or a stainless substrate with a large area, at low temperatures.

This silicon-based thin-film photoelectric converter generally has a structure in which a transparent electrode layer, one or more photoelectric conversion units and aback electrode layer are successively stacked on a transparent insulating substrate. In general, the photoelectric conversion unit has a p-type layer, an i-type layer and an n-type layer that are stacked in this order or in an order reverse to this. When the i-type photoelectric conversion layer, which occupies its main portion, is made of an amorphous material, the unit is referred to as an amorphous photoelectric conversion unit, and when the i-type layer is made of a crystalline material, the unit is referred to as a crystalline photoelectric conversion unit.

The photoelectric conversion layer is a layer that absorbs light and then generates an electron and hole pair. In general, in such a silicon-based thin-film photoelectric converter of a pin junction, the i-type layer serves as a photoelectric conversion layer. The i-type layer serving as the photoelectric conversion layer occupies a main portion of the film thickness of the photoelectric conversion unit.

Ideally, the i-type layer is an intrinsic semiconductor layer containing no conductivity type determining impurities. However, even when a layer contains a trace amount of impurities, it functions as an i-type layer of the pin junction when its Fermi level is located substantially in the center of a forbidden band; therefore, this is referred to as a substantially i-type layer. In general, the substantially i-type layer is formed without adding a conductivity type determining impurity to a raw material gas. In this case, the conductivity type determining impurity may be contained therein within a permissible range that allows the layer to function as the i-type layer. Further, the substantially i-type layer may be formed by intentionally adding a trace amount of conductivity type determining impurity so as to remove influences given to the Fermi level by impurities derived from the atmospheric air and underlying layer.

As a method for improving the conversion efficiency of the photoelectric converter, a photoelectric converter having a structure referred to as a stacked-type, in which two or more photoelectric conversion units are stacked, has been known. In this method, a front photoelectric conversion unit containing a photoelectric conversion layer having a large optical forbidden band width is placed on a light incident side of a photoelectric converter, and behind this, a rear photoelectric conversion unit containing a photoelectric conversion layer (for example, made of an Si—Ge alloy or the like) having a small optical forbidden band width is successively placed so that a photoelectric converting process covering a wide wavelength range of incident light can be obtained; thus, by effectively utilizing incident light, the conversion efficiency for a converter as a whole can be improved.

In the case of a double-junction type thin-film photoelectric converter in which, for example, an amorphous silicon photoelectric conversion unit and a crystalline silicon photoelectric conversion unit are stacked, wavelengths of light that can be photoelectrically converted by the i-type amorphous silicon (a-Si) are limited to about 700 nm on a long wavelength side; however, the i-type crystalline silicon can photoelectrically convert light with wavelengths longer than those, that is, up to about 1100 nm. Here, an amorphous silicon photoelectric conversion layer made from amorphous silicon has a relatively greater light absorption coefficient, and thus a film thickness of about 0.3 µm is enough to absorb light that is sufficient for photoelectric conversion. On the other hand, the crystalline silicon photoelectric conversion layer made from crystalline silicon has a relatively smaller light absorption coefficient in comparison with that of amorphous silicon, and thus its thickness is preferably set to about 2 to 3 µm or more so as to sufficiently absorb light having long wavelengths as well. That is, the crystalline silicon photoelectric conversion layer normally needs to have a thickness that is about 10 times larger than that of the amorphous silicon photoelectric conversion layer. Additionally, in the case of this double-junction type thin-film photoelectric converter, the photoelectric conversion unit located on the light incident side is referred to as a top cell, and the photoelectric conversion unit located on the rear side is referred to as a bottom cell.

In addition, a triple-junction type thin-film photoelectric converter provided with three photoelectric conversion units may also be used. In the present specification, the photoelectric conversion units of the triple-junction type thin-film photoelectric converter are referred to as a top cell, a middle cell and a bottom cell, in succession from the light incident side. By using the triple-junction stacked-type thin-film photoelectric converter, the open circuit voltage (Voc) can be made higher, with the short circuit current density (Jsc) being set lower, so that in comparison with the double-junction type, the film thickness of an amorphous silicon photoelectric conversion layer of the top cell can be made thinner. For this reason, it is possible to suppress photodegradation of the top cell. In addition, by making the band gap of the photoelectric conversion layer of the middle cell narrower than that of the top cell, and also wider than that of the bottom cell, incident light can be utilized more effectively.

As an example of the triple-junction stacked-type thin-film photoelectric converter, a thin-film photoelectric converter in which amorphous silicon germanium (a-SiGe) is used for the photoelectric conversion layer of the middle cell, with an a-Si photoelectric conversion unit/an a-SiGe photoelectric conversion unit/an a-SiGe photoelectric conversion unit being stacked in this order, or a thin-film photoelectric converter, with an a-Si photoelectric conversion unit/an a-SiGe photoelectric conversion unit/a crystalline silicon photoelectric conversion unit being stacked in this order, may be proposed. By appropriately adjusting the Ge concentration of the a-SiGe film, the band gap of the i-type a-SiGe of the photoelectric conversion layer of the middle cell can be controlled to a value between those of the top cell and the bottom cell. In the case where the a-SiGe photoelectric conversion layers are used for both of the middle cell and the bottom cell, the Ge concentration of the bottom cell is preferably made higher than that of the middle cell.

However, it has been confirmed that in comparison with a-Si, the a-SiGe layer, which is an alloy layer, has a higher defect density with its semiconductor characteristics being deteriorated, and also has an increase in defect density due to irradiation with light. For this reason, the triple-junction stacked-type thin-film photoelectric converter in which a-SiGe is used for the photoelectric conversion layer of the middle cell or the bottom cell is insufficient in improving the efficiency, in comparison with the double-junction thin-film photoelectric converter. Moreover, since the photodegradation of a-SiGe is serious, a problem arises that, although the triple-junction stacked-type thin-film photoelectric converter is used, it is not possible to sufficiently suppress the photodegradation.

In the case where the a-SiGe photoelectric conversion unit is used as the bottom cell, the wavelength of light that can be photoelectrically converted is limited to about 900 nm in a long wavelength side, and in the case where the amorphous silicon photoelectric conversion unit is used as the bottom cell, the wavelength of light that can be photoelectrically converted is limited to about 1100 nm in the long wavelength side. Therefore, the wavelength to be utilized on the long wavelength side is the same as the wavelength of a double-junction thin-film photoelectric converter, which fails to provide improvements, resulting in a problem that the improvement of the conversion efficiency of the triple-junction thin-film photoelectric converter is insufficient.

Prior Art Example 1

Non-Patent Document 1 has disclosed a single-junction thin-film photoelectric converter using weak n-type microcrystalline germanium for the photoelectric conversion layer. The thin-film photoelectric converter has a stacked structure in which a stainless substrate/n-type amorphous silicon/i-type amorphous silicon/a gradient composition layer of microcrystalline silicon germanium/a weak n-type microcrystalline germanium photoelectric conversion layer/a gradient composition layer of microcrystalline silicon germanium/a p-type microcrystalline silicon layer/ITO are successively stacked. The characteristics of the thin-film photoelectric converter are: open circuit voltage Voc=0.22 V, short circuit current density Jsc=25 mA/cm$^2$, fill factor FF=0.36, and conversion efficiency Eff=2.0%, and the wavelength that exerts a quantum efficiency of 10% on a long wavelength side is about 1080 nm, with the wavelength that exerts a quantum efficiency of 5% being set to 1130 nm. The microcrystalline germanium photoelectric conversion layer is formed by using an ECR remote plasma enhanced CVD method that uses a microwave discharge.

Prior Art Example 2

Non-Patent Document 2 has disclosed a single-junction thin-film photoelectric converter in which microcrystalline silicon germanium having a Ge composition of 0% to 35% at the maximum is used as the photoelectric conversion layer. More specifically, the thin-film photoelectric converter has a stacked structure in which a glass substrate/concave-convex ZnO/p-type microcrystalline silicon/a photoelectric conversion layer of i-type microcrystalline silicon germanium/an n-type microcrystalline silicon layer/ZnO/Ag are successively stacked. The characteristics of the thin-film photoelectric converter are such that the Jsc and Eff are maximized at a Ge concentration of 20% in the microcrystalline silicon germanium film, and Voc=0.427 V, Jsc=24.1 mA/cm$^2$, FF=0.616, and Eff=6.33%. When the Ge composition in the film is increased to 20% or more, any of the Voc, Jsc and FF are lowered to cause a reduction in the Eff. In particular, when the Ge concentration in the film is set to 30% or more, the FF is extremely lowered, and the FF becomes about 0.4 at a Ge concentration of 35%, with the Eff being reduced to about 2%. In addition, even in the case of the maximum Ge concentration of 35%, the wavelength at which the quantum efficiency is set to 10% is about 1050 nm.

PRIOR ART DOCUMENTS

Non-Patent Documents

Non-Patent Document 1: Xuejun Niu, Jeremy Booher and Vikran L. Dalal, "Nanocrystalline Germanium and Germanium Carbide Films and Devices", Materials Research Society Symposium Proceedings, Vol. 862, A10.2 (2005).
Non-Patent Document 2: Takuya Matsui, Chia-Wen Chang, Tomoyuki Takada, Masao Isomura, Hiroyuki Fujiwara and Michio Kondo, "Microcrystalline Si1−xGex Solar Cells Exhibiting Enhanced Infrared Response with Reduced Absorber Thickness", Japanese Applied Physics Express, vol. 1, 032501-1-3, 2008.

DISCLOSURE OF THE INVENTION

Problems to be Solved by the Invention

In a thin-film photoelectric converter in which an a-SiGe photoelectric conversion unit or a crystalline silicon photoelectric conversion unit is used as a bottom cell for a double-junction or triple-junction stacked-type thin-film photoelectric converter, the upper limit of a wavelength to be utilized on a long wavelength side is 900 to 1100 nm, with the result that light with long wavelengths is insufficiently utilized to cause a problem that improvements of the conversion efficiency is insufficient.

In addition, in the thin-film photoelectric converter having microcrystalline Ge as the photoelectric conversion layer, a problem arises that the FF is low to cause a reduction in the conversion efficiency. Furthermore, since the upper limit of wavelengths of light with long wavelengths that can be photoelectrically converted is about 1080 nm, a problem arises that sufficient improvements are not obtained.

In a thin-film photoelectric converter having microcrystalline SiGe as a photoelectric conversion layer, any of the Voc, Jsc and FF are lowered when the Ge concentration in the film is set to 20% or more, resulting in a problem of an abrupt reduction in the Eff. Another problem is that when a microcrystalline silicon germanium film having a Ge concentration up to 35% is used, the upper limit of wavelengths of light that can be photoelectrically converted is about 1050 nm which result in insufficient improvements.

In view of the above-mentioned problems, an object of the invention is to provide a thin-film photoelectric converter that has good characteristics so that even light with long wavelengths of 1100 nm or more can be utilized.

Means for Solving the Problems

A photoelectric convertor of the invention includes one or more photoelectric conversion units, and each photoelectric conversion unit includes a photoelectric conversion layer sandwiched between a p-type semiconductor layer and an n-type semiconductor layer. A photoelectric conversion layer of at least one of the photoelectric conversion units includes an intrinsic or weak n-type crystalline germanium semiconductor, and the crystalline germanium semiconductor has an absorption coefficient of an infrared-absorption peak at a wave number of 935±5 cm$^{-1}$ of less than 6000 cm$^{-1}$. Although the origin of an infrared-absorption peak at the wave number of 935±5 cm$^{-1}$ has not been identified, it is considered to be derived from germanium hydride or germanium oxide in a polymer or cluster state, and by suppressing this infrared-absorption peak to a low level, dense crystalline germanium can be formed so that the characteristics of the thin-film photoelectric converter can be improved.

Further, the crystalline germanium semiconductor preferably has an absorption coefficient of an infrared-absorption peak at a wave number of 960±5 cm$^{-1}$ of less than 3500 cm$^{-1}$. Although the origin of an infrared-absorption peak at the wave number of 960±5 cm$^{-1}$ has not been identified as well, it is considered to be derived from germanium hydride or germanium oxide in a polymer or cluster state as described above, and by suppressing this infrared-absorption peak to a low level, dense crystalline germanium can be formed so that the characteristics of the thin-film photoelectric converter can be improved.

The crystalline germanium semiconductor preferably has an intensity ratio between a (220) peak and a (111) peak measured by X-ray diffraction that is set to 2 or more. By increasing a (220) orientation, crystalline germanium is allowed to form columnar-shaped crystals in a direction perpendicular to the substrate so that the crystal size in the film thickness direction becomes greater to allow a photoelectric conversion electric current to easily flow, thereby improving characteristics of the thin-film photoelectric converter.

The photoelectric conversion layer may have a structure in which a substantially intrinsic crystalline silicon semiconductor and the crystalline germanium semiconductor are stacked. The crystalline silicon semiconductor is allowed to function as a foundation layer so that the crystallinity of a crystalline germanium semiconductor stacked thereon is improved, and/or defects in an interface between the conductive type layer and the crystalline germanium semiconductor are reduced; thus, the characteristics of the thin-film photoelectric converter can be improved. Alternatively, by forming a crystalline silicon semiconductor on the crystalline germanium semiconductor, defects in an interface relative to an opposite conductivity type layer formed thereon are reduced so that the characteristics of the thin-film photoelectric converter can be improved.

Further, the photoelectric convertor may be formed as a triple-junction stacked-type photoelectric convertor provided with three photoelectric conversion units, in which a first photoelectric conversion unit having an amorphous silicon semiconductor as the photoelectric conversion layer, a second photoelectric conversion unit having a crystalline silicon semiconductor as the photoelectric conversion layer, and a third photoelectric conversion unit including the crystalline germanium semiconductor as the photoelectric conversion layer are successively stacked from a light incident side. With this structure, solar light within a wide wavelength range can be utilized to achieve a high Voc so that the characteristics of the thin-film photoelectric converter can be improved.

The thin-film photoelectric convertor of the invention may be manufactured by forming the crystalline germanium semiconductor by using a high-frequency discharging plasma enhanced CVD method using a frequency of from 10 to 100 MHz. The crystalline germanium semiconductor is preferably formed at a substrate temperature of 250° C. or more. Further, the crystalline germanium semiconductor is preferably formed at a high-frequency power density of 550 mW/cm$^2$ or more.

More specifically, as a high-frequency plasma enhanced CVD device for use in forming a crystalline germanium semiconductor, a plasma enhanced CVD device provided with a substrate-side electrode placed together with a substrate and a high-frequency electrode can be used. In this case, the distance (ES) between the high-frequency electrode and the substrate is preferably set to 12 mm or less. Further, the high-frequency electrode is preferably a hollow cathode-type electrode.

It is preferable that, upon forming the crystalline germanium semiconductor, neither a Ge atom light emission peak having a peak at a wavelength of 265 nm±2 nm nor a Ge atom light emission peak having a peak at a wavelength of 304 nm±2 nm is detected in an emission spectrum of a high-frequency discharging plasma.

Further, the crystalline germanium semiconductor is preferably formed at a pressure of 800 Pa or more upon forming.

A refractive index of the crystalline germanium semiconductor in the thin-film photoelectric converter of the invention is preferably set to 4.0 or more, more preferably to 4.7 or more, and further preferably to 4.9 or more, relative to light having a wavelength of 600 nm.

Effects of the Invention

By setting the absorption coefficient of an infrared-absorption peak at 935±5 cm$^{-1}$ of the crystalline germanium semiconductor of a photoelectric conversion layer to less than 6000 cm$^{-1}$, it is considered that formation of germanium hydride or germanium oxide in a polymer or cluster state can be suppressed so that dense crystalline germanium is formed; thus, light having long wavelengths exceeding 1100 nm can be utilized by the thin-film photoelectric converter, and the FF is enhanced so that the characteristics of the thin-film photoelectric converter are improved.

Furthermore, by setting a refractive index relative to a wavelength of 600 nm of the crystalline germanium semiconductor to 4.0 or more, preferably, to 4.7 or more, more preferably, to 4.9 or more, dense crystalline germanium is formed; thus, light having long wavelengths exceeding 1100 nm can be utilized by the thin-film photoelectric converter, and the FF is enhanced so that the characteristics of the thin-film photoelectric converter are improved.

EMBODIMENTS OF THE INVENTION

Figure 1:
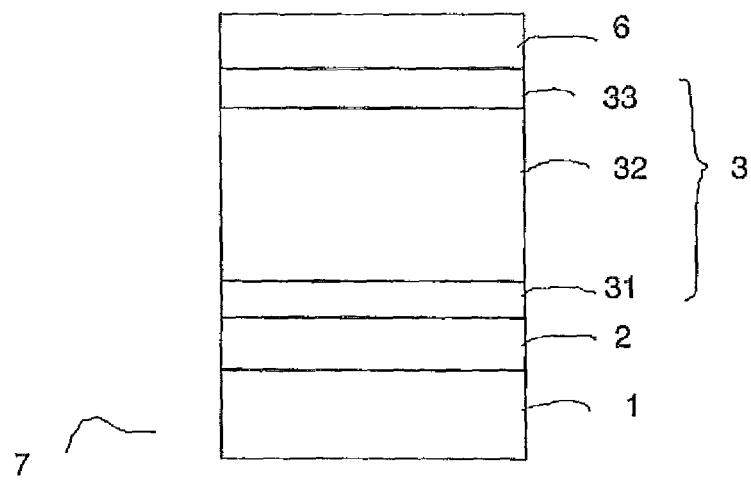
FIG. 1 is a schematic cross-sectional view that shows a single-junction thin-film photoelectric converter in accordance with one embodiment of the invention.

Referring to the drawings, preferred embodiments of the invention will be described in the following. In the drawings of the invention, dimensional relationships, such as thickness and length, are properly altered on demand for clearness and simplicity of the drawings, and do not correspond to actual dimensions. In addition, in the respective drawings, the same reference numerals represent the same members or the corresponding portions.

Figure 27:
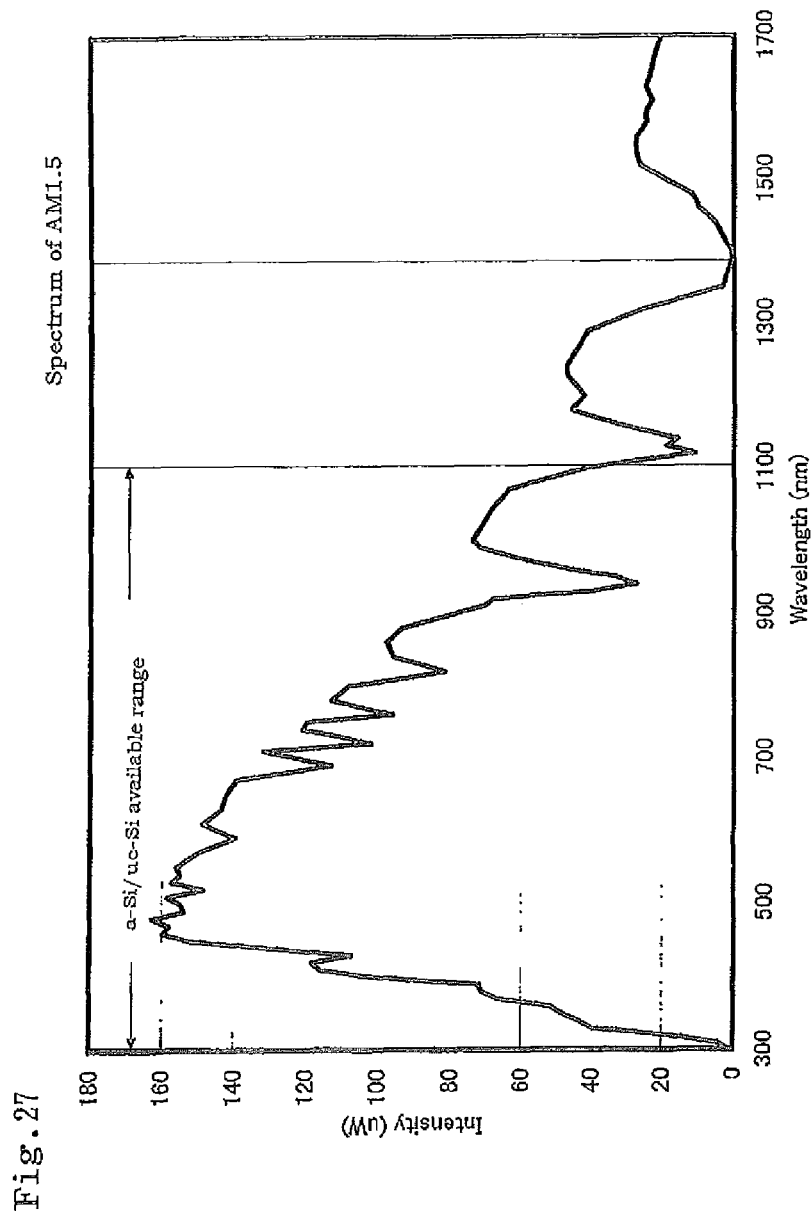
FIG. 27 illustrates a standard solar light spectrum at Air Mass 1.5 illumination conditions.

In order to improve the conversion efficiency of a thin-film photoelectric converter, the present inventors have studied a method for utilizing light having a long wavelength exceeding 1100 nm, which has not been utilized in a conventional silicon-based thin-film photoelectric converter, for photoelectric conversion. FIG. 27 shows a standard solar light spectrum at Air Mass 1.5 illumination conditions. The irradiation intensity of solar light has its maximum value near a wavelength of 550 nm, and the intensity decreases as the wavelength becomes longer. As can be seen, the irradiation intensity does not monotonically decrease, but has minimum values near wavelengths of 900 nm, 1100 nm and 1400 nm, due to influences from oxygen and vapor in the air. For this reason, it has been found that, even when the upper limit of the wavelength of the quantum efficiency of a thin-film photoelectric converter is extended from 1100 nm toward a long wavelength side by several tens of nanometers, an increase in the power generation current of the thin-film photoelectric converter is small, since there are minimum values of irradiation intensity of solar light.

Therefore, research efforts have been vigorously made so as to find a photoelectric conversion layer material that exerts good photoelectric conversion efficiency with a light absorbing property up to around 1300 nm. As a result, it has been found that by setting the absorption coefficient in an infrared-absorption peak at 935±5 cm$^{-1}$ of a crystalline germanium semiconductor to less than 6000 cm$^{-1}$, a desirable photoelectric conversion layer capable of utilizing light having a long wavelength exceeding 1100 nm can be achieved.

As described in Prior Art Example 2, microcrystalline silicon germanium (referred to also as μc-SiGe) causes the characteristics of the thin-film photoelectric converter to abruptly drop as the Ge concentration in the film increases. This is presumably because that, together with the increase in Ge concentration in the μc-SiGe film, defects also increase.

Moreover, as described in Prior Art Example 2 similarly, even when the Ge concentration in the film increases, the quantum efficiency on the long wavelength side is not improved so much. It has been known that crystallization becomes difficult as the Ge concentration in the film of μc-SiGe increases, and for this reason, when the Ge concentration is high, the crystallinity is deteriorated to cause an increase in amorphous portion, resulting in an increase in a band gap and a subsequent reduction in the absorption coefficient of the long wavelength.

Figure 28:
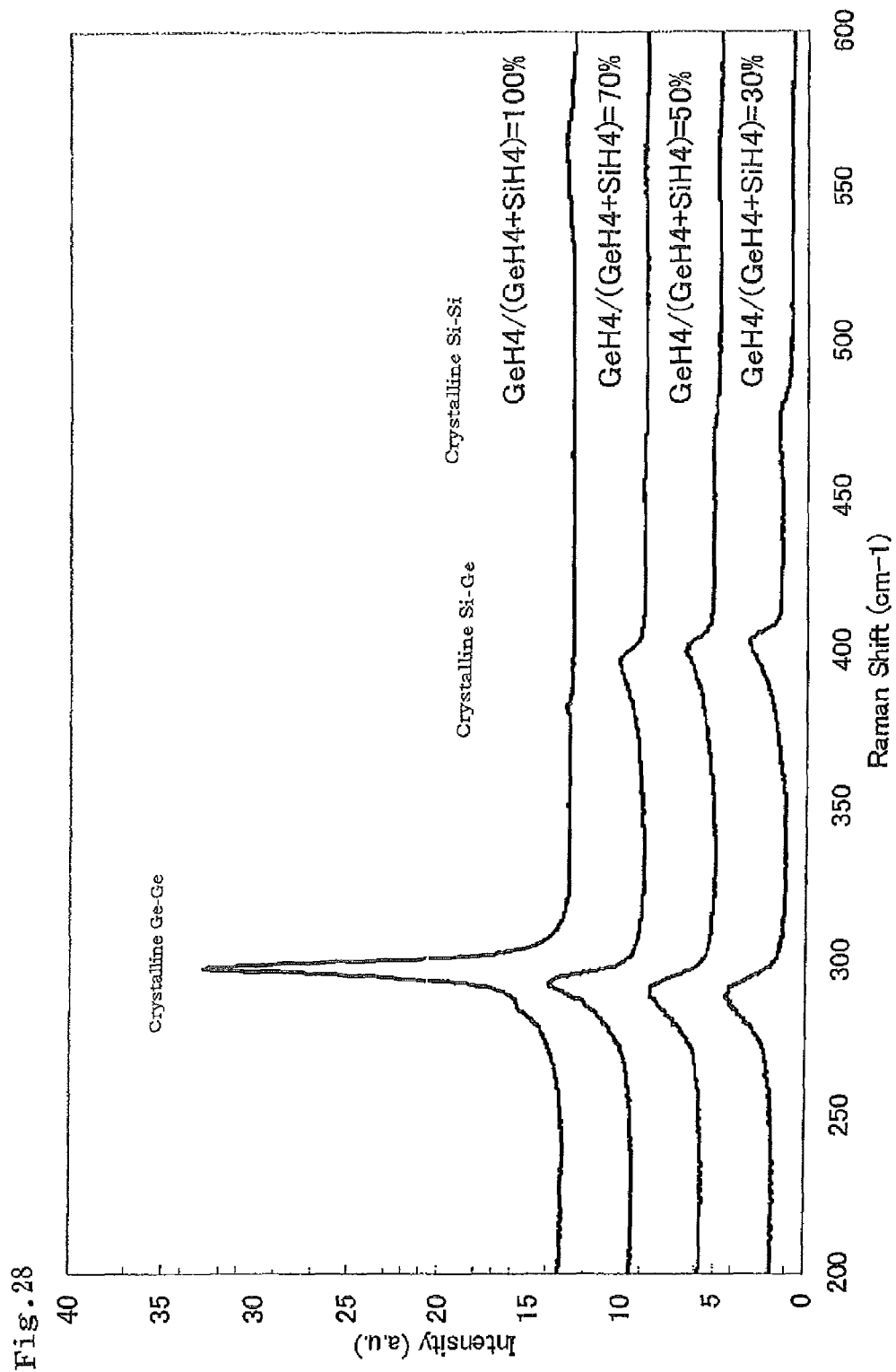
FIG. 28 illustrates a Raman scattering spectrum of Reference Experimental Example 1.

As Reference Experimental Example 1, using SiH$_4$ and GeH$_4$ as raw material gases with H$_2$ being used as a diluting gas, a μc-SiGe semiconductor thin film and a crystalline germanium semiconductor thin film were formed on a glass substrate by using a high-frequency plasma enhanced CVD device of 13.56 MHz. A semiconductor thin film was formed on a glass substrate under the condition that GeH$_4$ flow ratio, GeH$_4$/(GeH$_4$+SiH$_4$), was being varied from 30% to 100%, while an H$_2$ dilution ratio was constantly set as H$_2$/(SiH$_4$+GeH$_4$)=2000. FIG. 28 shows its Raman scattering spectrum. As a result, peaks, derived from the crystal Ge—Ge or the crystal Si—Ge of the Raman scattering spectrum of crystalline silicon germanium of GeH$_4$/(GeH$_4$+SiH$_4$)=30 to 70%, were weak, while a crystal Ge—Ge peak intensity of crystalline germanium of GeH$_4$/(GeH$_4$+SiH$_4$)=100% became four to five times stronger. In other words, according to conventional common sense, it has been considered that, since the crystallinity is deteriorated as the Ge concentration of a μc-SiGe film increases, the crystallization of thin-film germanium is difficult; however, it was found that contrary to expectations, good crystallinity is obtained in crystalline germanium of GeH$_4$/(GeH$_4$+SiH$_4$)=100%.

Figure 29:
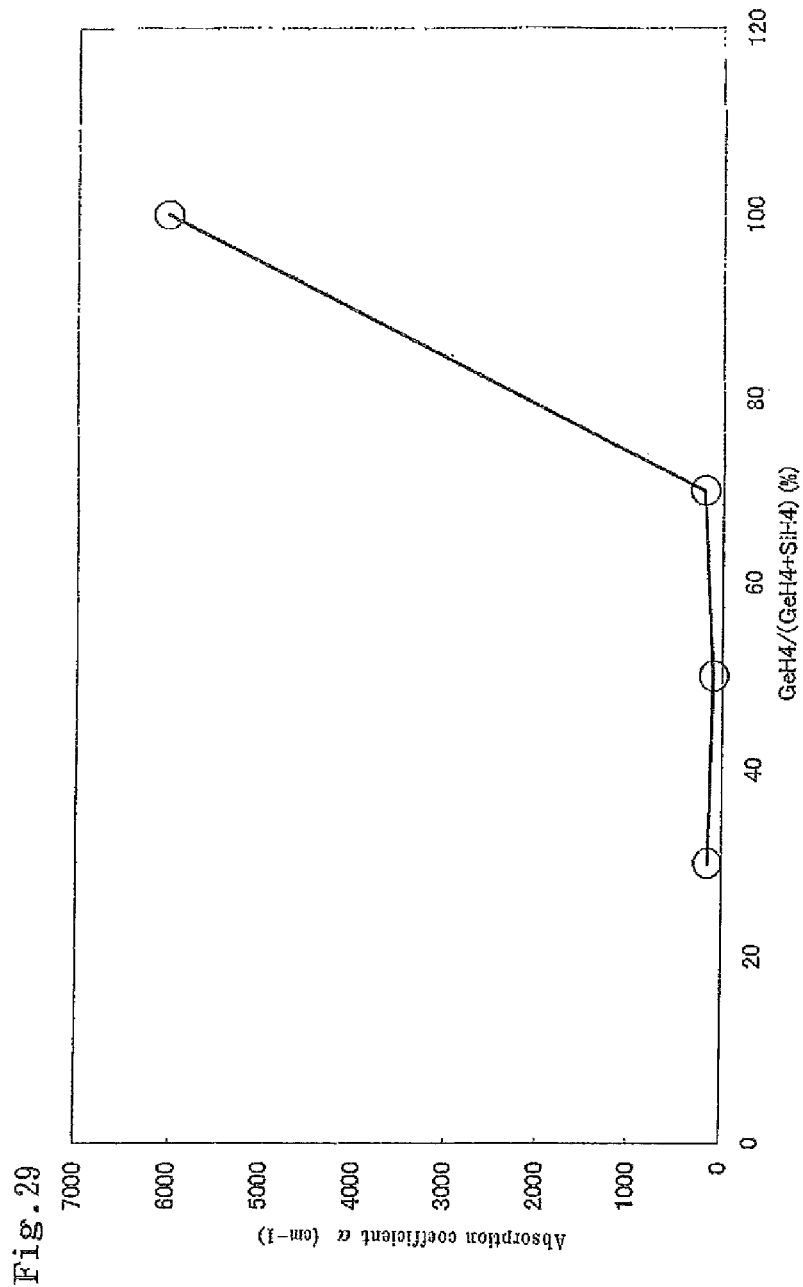
FIG. 29 shows an absorption coefficient at a wavelength of 1300 nm relative to a $GeH_4$ gas ratio, $GeH_4/(GeH_4+SiH_4)$, of a crystalline silicon germanium semiconductor thin film and a crystalline germanium semiconductor thin film.

FIG. 29 shows an absorption coefficient at a wavelength of 1300 nm relative to a GeH$_4$ gas ratio, GeH$_4$/(GeH$_4$+SiH$_4$), of the μc-SiGe semiconductor thin film and the crystalline germanium semiconductor thin film in Reference Experimental Example 1. Although the rate of Ge increases in the range of GeH$_4$/(GeH$_4$+SiH$_4$)=30 to 70%, the absorption coefficient is kept substantially constant. In contrast, in crystalline germanium of GeH$_4$/(GeH$_4$+SiH$_4$)=100%, its absorption coefficient abruptly increases to exhibit a high absorption coefficient exceeding 6000 cm$^{-1}$. This is caused by high crystallinity of crystalline germanium.

Based upon the studies above, it is found that, in an attempt to effectively utilize light having a long wavelength up to 1300 nm, not μc-SiGe, but crystalline germanium can be used for obtaining a desirable absorption coefficient.

As a conventional example in which microcrystalline germanium is used for a photoelectric conversion layer, the non-patent document shown as Prior Art Example 1 is proposed. However, the FF of the thin-film photoelectric converter is as low as 0.36, and the conversion efficiency is also as low as 2.0%. In addition, in Prior Art Example 1, the quantum efficiency becomes 10% at a wavelength of 1080 nm, and the quantum efficiency is 0.5% at a wavelength of 1300 nm, which is insufficient for utilizing light having a long wavelength.

Therefore, as a result of vigorous studies for improving characteristics of a crystalline germanium semiconductor, it was found that, by setting the absorption coefficient of an infrared-absorption peak at 935±5 cm$^{-1}$ to less than 6000 cm$^{-1}$, the above-mentioned problems can be solved. Although the origin of an infrared-absorption peak at the wave number of 935±5 cm$^{-1}$ has not been identified, it is considered to be derived from germanium hydride or germanium oxide in a polymer or cluster state. By suppressing this infrared-absorption peak to a low level, dense crystalline germanium can be formed so that the characteristics of the thin-film photoelectric converter can be improved. Further, the absorption coefficient of an infrared-absorption peak at 960±5 cm$^{-1}$ is preferably set to less than 3500 cm$^{-1}$, Conventionally, with respect to the infrared-absorption peak of amorphous germanium (a-Ge), for example, Non-Patent Document 3 (G. Lucovsky, S. S. Chao, J. Yang, J. E. Tylor, R. C. Ross and W. Czubatyj, "Chemical bonding of hydrogen and oxygen in glow-discharge-deposited thin films of a-Ge: H and a-Ge (H,O), Phys. Rev. B, vol. 31, No. 4, pp.

2190-2197, 1985) has given a detailed report. Infrared-absorption peaks identified by Non-Patent Document 3 include: a Ge—H bond (1880 cm$^{-1}$, 560 cm$^{-1}$), a (Ge—H2), bond (2000 cm$^{-1}$, 825 cm$^{-1}$, 765 cm$^{-1}$, 560 cm$^{-1}$), a Ge—O—Ge bond (750 cm$^{-1}$, 500 cm$^{-1}$, 300 cm$^{-1}$), a (Ge—O—Ge), bond (860 cm$^{-1}$, 560 cm$^{-1}$, 300 cm$^{-1}$) and an H—Ge—O bond (670 cm$^{-1}$). However, with respect to peaks of the above-mentioned wave numbers of 935 cm$^{-1}$ and 960 cm$^{-1}$, no reports have been given.

In Non-Patent Document 1 of Prior Art Example 1, no descriptions have been given on the infrared-absorption peaks of microcrystalline germanium. However, in Prior Art Example 1, a microwave plasma enhanced CVD method is used for forming microcrystalline germanium, and it is considered that oxygen is contained in the film as impurities. It has been well known by one skilled in the art that, when the microwave plasma enhanced CVD method is used, oxygen tends to be incorporated into the amorphous silicon film or microcrystalline silicon film as impurities. This is because, in the microwave plasma enhanced CVD method, (1) since a quartz tube is used for introducing microwaves, the surface of quartz is exposed to plasma to be etched, with the result that oxygen derived from quartz tends to be mixed in the film as impurities, or (2) since a film-forming process is carried out at a low pressure (0.665 Pa, in Prior Art Example 1) in the microwave plasma enhanced CVD method, the resulting film tends to be influenced by residual gases and isolated gases from the wall surface, with the result that oxygen derived from the air and water tend to be incorporated into the film as impurities. Therefore, it is considered that, also in the microcrystalline germanium obtained by the microwave plasma enhanced CVD method of Prior Art Example 1, oxygen is contained in the film as impurities. In fact, Non-Patent Document 1 of Prior Art Example 1 includes the description "All the films as grown were n type, probably due to oxygen doping from residual gases in the reactor." Therefore, the microcrystalline germanium of Prior Art Example 1 is considered to include a GeO bond due to oxygen impurities, and also have an absorption coefficient of 6000 cm$^{-1}$ or more of an infrared-absorption peak at 935±5 cm$^{-1}$ and an absorption coefficient of 3500 cm$^{-1}$ or more of an infrared-absorption peak at 960±5 cm$^{-1}$.

FIG. 1 is a schematic cross-sectional view that shows a single-junction thin-film photoelectric converter in accordance with one embodiment of the invention. A transparent electrode layer 2, a crystalline germanium photoelectric conversion unit 3 and a back electrode layer 6 are disposed on a transparent substrate 1 in this order.

As the transparent substrate 1 to be used in a photoelectric converter of a type in which light is made incident on the substrate side, a plate-shaped member or a sheet-shaped member made of glass, a transparent resin or the like is used. In particular, it is preferable to use a glass plate as the transparent substrate 1 because the resulting substrate is allowed to have high transmittance at low costs.

That is, since the transparent substrate 1 is arranged at the light incident side of the thin-film photoelectric converter, it is preferably made as transparent as possible so as to transmit as much solar light as possible to be absorbed in the photoelectric conversion unit. For the same purpose, anti-reflection coating is preferably formed on the light incident surface of the transparent substrate 1 so as to reduce light reflection loss on the incident surface of solar light.

The transparent electrode layer 2 is preferably made from a conductive metal oxide such as SnO$_2$ or ZnO, and preferably formed by using a method such as a CVD method, a sputtering method or a vapor deposition method. The transparent electrode layer 2 is preferably provided with fine irregularities on its surface so as to exert an effect of increasing scattering of the incident light.

The crystalline germanium photoelectric conversion unit 3 is formed, for example, by disposing a p-type layer, a photoelectric conversion layer and an n-type layer in this order by a plasma enhanced CVD method. More specifically, for example, a p-type microcrystalline silicon layer 31 doped with 0.01 atomic % or more of boron, a substantially i-type or weak n-type crystalline germanium photoelectric conversion layer 32 and an n-type microcrystalline silicon layer 33 doped with 0.01 atomic % or more of phosphorus are disposed in this order.

The crystalline germanium photoelectric conversion layer 32 is made of an intrinsic or weak n-type semiconductor. Upon forming the crystalline germanium photoelectric conversion layer, a gas containing a conductivity type determining impurity element is not used. Nevertheless, crystalline germanium sometimes comes to exhibit the weak n-type characteristics, and this is presumably because that crystalline germanium easily absorbs impurities derived from the air, such as oxygen, in the film. As the index for the weak n-type semiconductor applicable to the photoelectric conversion layer, the carrier concentration of crystalline germanium found by the Hall-effect measurement is preferably set to 10$^{17}$ cm$^{-3}$ or less, and the mobility is preferably set to 1 cm$^2$/(V·s) or more. When the carrier concentration is too high, a dark current in the photoelectric converter increases to cause an increase in leak current and a subsequent reduction in FF of the photoelectric converter.

It is important to set an absorption coefficient of the infrared-absorption peak at the wave number of 935±5 cm$^{-1}$ of the crystalline germanium photoelectric conversion layer 32 to a range from 0 cm$^{-1}$ or more and less than 6000 cm$^{-1}$, preferably, from 0 cm$^{-1}$ or more and less than 5000 cm$^{-1}$, more preferably, from 10 cm$^{-1}$ or more and less than 2500 cm$^{-1}$. Although the origin of an infrared-absorption peak at the wave number of 935±5 cm$^{-1}$ has not been identified, it is considered to be derived from germanium hydride or germanium oxide in a polymer or cluster state, and by suppressing this infrared-absorption peak to a low level, dense crystalline germanium can be formed so that the characteristics of the thin-film photoelectric converter can be improved. As will be described as to FIGS. 22 and 23 later, when the absorption coefficient of the infrared-absorption peak at the wave number of 935±5 cm$^{-1}$ becomes less than 6000 cm$^{-1}$, the short circuit current density (Jsc) and the quantum efficiency at a wavelength of 1300 nm are abruptly increased and improved so that the Jsc is allowed to have a high value of 30 mA/cm$^2$ or more, and the quantum efficiency is also allowed to exhibit a value of 5% or more. The conversion efficiency (Eff) is less than 1% in the case of the absorption coefficient of 6000 cm$^{-1}$ or more; in contrast, in the case where the absorption coefficient is set to less than 6000 cm$^{-1}$, the Eff abruptly increases to exhibit a high Eff value of 3% or more. Moreover, in the case where the absorption coefficient of the infrared-absorption peak at the wave number of 935±5 cm$^{-1}$ becomes less than 5000 cm$^{-1}$, the Eff value exceeds 3.5%, which forms a desirable state. In the case where the absorption coefficient of the infrared-absorption peak at the wave number of 935±5 cm$^{-1}$ is set in the range from 10 cm$^{-1}$ or more and less than 2500 cm$^{-1}$, the Eff value exceeds 4.5%, which forms a more desirable state. Optimally, the absorption coefficient of the infrared-absorption peak at the wave number of 935±5 cm$^{-1}$ is desirably set to 0 cm$^{-1}$. In this case, however, since the infrared-absorption coefficient is reduced, the film formation tends to be influenced by diffusion of impurities from the electrode layer (the transparent electrode layer or the back electrode layer) and the conductive type layer (the p-type layer or the n-type layer) when the temperature is too high upon forming the crystalline germanium semiconductor; therefore, when the temperature upon forming the film is taken into consideration, the absorption coefficient of the infrared-absorption peak at the wave number of 935±5 cm$^{-1}$ is more desirably set to 10 cm$^{-1}$ or more.

In addition, an absorption coefficient of an infrared-absorption peak at a wave number of 960±5 cm$^{-1}$ is preferably set to 0 cm$^{-1}$ or more and less than 3500 cm$^{-1}$, more preferably to 0 cm$^{-1}$ or more and less than 3000 cm$^{-1}$, and further more preferably to 10 cm$^{-1}$ or more and less than 1300 cm$^{-1}$. Although the origin of an infrared-absorption peak at the wave number of 960±5 cm$^{-1}$ has not been identified as well, it is considered to be derived from germanium hydride or germanium oxide in a polymer or cluster state as described above, and by suppressing this infrared-absorption peak to a low level, dense crystalline germanium can be formed so that the characteristics of the thin-film photoelectric converter can be improved. As will be described as to FIGS. 22 and 23 later, when the absorption coefficient of the infrared-absorption peak at the wave number of 960±5 cm$^{-1}$ becomes less than 3500 cm$^{-1}$, the short circuit current density (Jsc) and the quantum efficiency at a wavelength of 1300 nm are abruptly increased and improved so that the Jsc is allowed to have a high value of 30 mA/cm$^2$ or more, and the quantum efficiency is also allowed to exhibit a value of 5% or more. Moreover, the conversion efficiency (Eff) is less than 1% in the case of the absorption coefficient of 3500 cm$^{-1}$ or more; in contrast, in the case where the absorption coefficient is set to less than 3500 cm$^{-1}$, the Eff abruptly increases to exhibit a high Eff value of 3% or more. Moreover, in the case where the absorption coefficient of the infrared-absorption peak at the wave number of 960±5 cm$^{-1}$ becomes less than 3000 cm$^{-1}$, the Eff value exceeds 3.5%, which forms a desirable state. In the case where the absorption coefficient of the infrared-absorption peak at the wave number of 960±5 cm$^{-1}$ becomes less than 1300 cm$^{-1}$, the Eff value exceeds 4.5%, which forms a more desirable state. Optimally, the absorption coefficient of the infrared-absorption peak at the wave number of 960±5 cm$^{-1}$ is desirably set to 0 cm$^{-1}$. In this case, however, since the infrared-absorption coefficient is reduced, the film formation tends to be influenced by diffusion of impurities from the electrode layer (the transparent electrode layer or the back electrode layer) and the conductive type layer (the p-type layer or the n-type layer) when the temperature is too high upon forming the crystalline germanium semiconductor; therefore, when the temperature upon forming the film is taken into consideration, the absorption coefficient of the infrared-absorption peak at the wave number of 960±5 cm$^{-1}$ is more desirably set to 10 cm$^{-1}$ or more.

The infrared-absorption spectrum of the infrared ray can be measured by FTIR (Fourier Transform Infrared Spectroscopy). For example, the infrared-absorption spectrum can be measured by using the following sequence of processes. (1) A film is formed on a crystal silicon substrate having a high resistance value of 1 Ω·cm or more under the same film-forming conditions as those of the photoelectric conversion layer, and the infrared-ray transmission spectrum thereof is measured. (2) The transmittance of the sample is divided by the transmittance of the crystal silicon substrate without the film so that the transmission spectrum of only the crystalline germanium film is found. (3) Since the transmission spectrum obtained in the above-mentioned (2) includes influences of interference and offset, a base line is drawn by connecting areas having no absorption to each other, and the transmission spectrum is divided by the transmittance of the base line. (4) Lastly, an absorption coefficient α is found from the following formula.

$$\alpha = -\frac{1}{d}\ln\left\{\frac{-2T_S + \sqrt{4T_s^2 + (1-T_S)^2(1+T_S)^2 \Delta T}}{(1-T_S)^2 \Delta T}\right\}$$ [Formula 1]

In this formula, d represents a film thickness, $T_s$ represents a transmittance of the crystal silicon substrate that is equal to 0.53, and ΔT represents a transmittance of the film found in the above-mentioned (3). Moreover, by using an ATR crystal, an infrared-absorption spectrum of each of the glass substrate, the transparent electrode layer and the crystalline germanium film formed on the metal electrode layer can be obtained. By preliminarily finding a transmission spectrum of the film on the crystal silicon substrate and a calibration curve of a spectrum obtained by using the ATR crystal, the infrared-absorption coefficient can be obtained from the spectrum measured using the ATR crystal.

Figure 26:
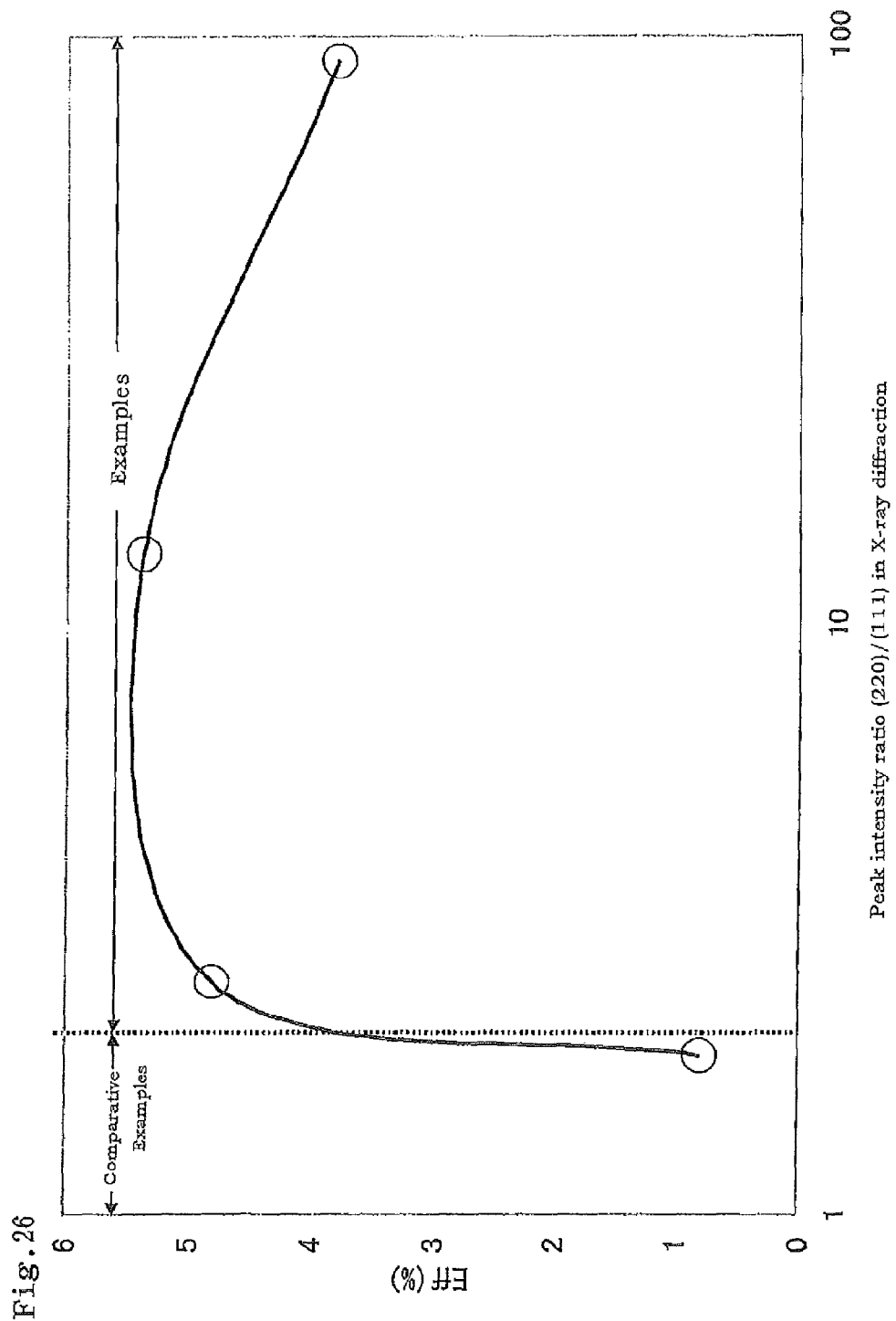
FIG. 26 shows a conversion efficiency Eff of a thin-film photoelectric converter relative to the peak intensity ratio (220)/(111) measured by the X-ray diffraction of the crystalline germanium photoelectric conversion layer.

In the crystalline germanium photoelectric conversion layer 32, an intensity ratio between a (220) peak and a (111) peak measured by the X-ray diffraction is preferably set to 2 or more. By increasing a (220) orientation, crystalline germanium is allowed to form columnar crystals in a direction perpendicular to the substrate so that the crystal size in the film thickness direction becomes greater to allow a photoelectric conversion electric current to easily flow, thereby improving characteristics of the thin-film photoelectric converter. As shown in FIG. 26 to be described later, in the case where the (220)/(111) peak intensity ratio is less than 2, the Eff becomes less than 1%, while in the case where the (220)/(111) peak intensity ratio becomes 2 or more, the Eff abruptly increases to exhibit a high Eff value of 4% or more. Since, in the case where the (220)/(111) peak intensity ratio further increases to exceed 70, the Eff becomes less than 4%, the (220)/(111) peak intensity ratio is desirably set to 70 or less.

Figure 39:
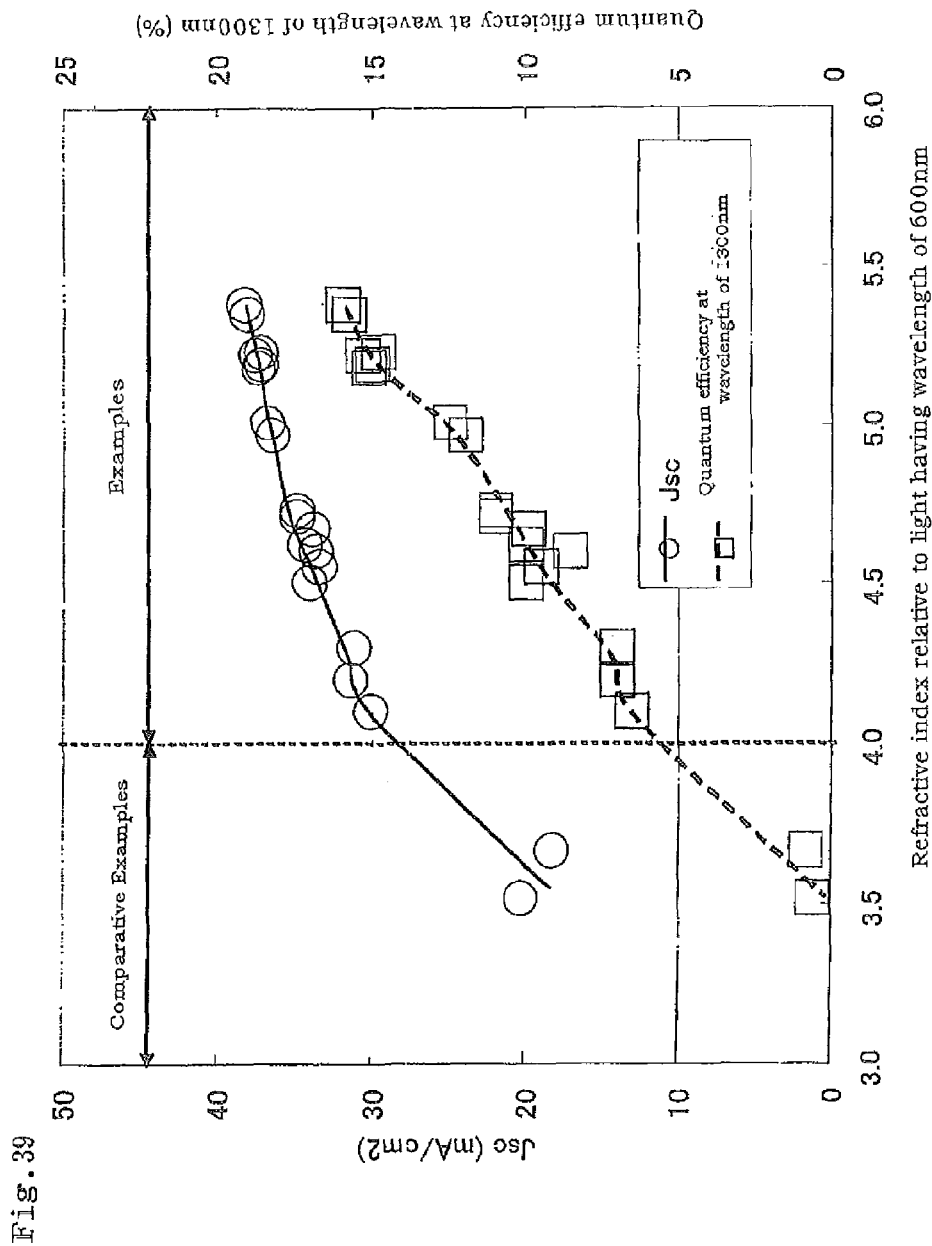
FIG. 39 shows a short circuit current density Jsc and a quantum efficiency at a wavelength of 1300 nm of a thin-film photoelectric converter relative to a refractive index at a wavelength of 600 nm of a crystalline germanium photoelectric conversion layer.
Figure 40:
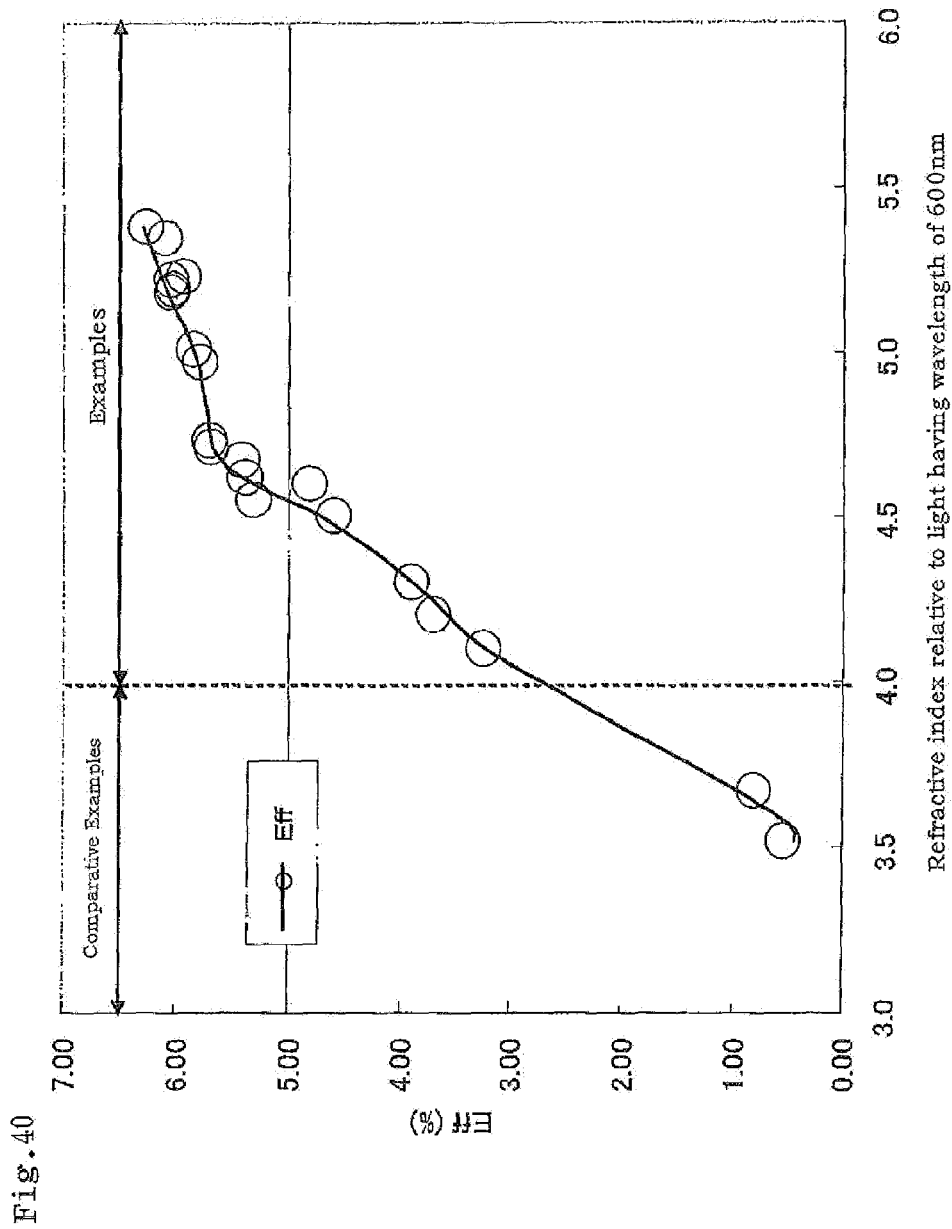
FIG. 40 shows a conversion efficiency Eff of a thin-film photoelectric converter relative to a refractive index at a wavelength of 600 nm of a crystalline germanium photoelectric conversion layer.

In the germanium photoelectric conversion layer 32, the refractive index relative to light having a wavelength of 600 nm is preferably set to 4.0 or more. As shown in FIG. 39, when the refractive index of the crystalline germanium photoelectric conversion layer increases, the quantum efficiency (η@1300) at a wavelength of 1300 nm and the short circuit current density (Jsc) increase, and when the refractive index becomes 4.0 or more, η@1300 increases up to 5% or more so that long wavelength light rays up to 1100 nm can be utilized for power generation. At this time, the short circuit current density (Jsc) can be obtained as a high value of 30 mA/cm$^2$ or more. When the refractive index is set to 4.9 or more, the Jsc becomes higher to exhibit a value of 35 mA/cm$^2$ or more, which is a desirable state. By setting the refractive index to 4.0 or more, dense crystalline germanium can be formed so that long wavelength light rays exceeding 1100 nm can be utilized. As shown in FIG. 40, when the refractive index is 4.0 or more, the Eff becomes 3.0% or more. When the refractive index is increased to 4.7, the Eff abruptly increases, and when the refractive index is further increased, the Eff increases moderately. Therefore, the refractive index is more preferably set to 4.7 or more, and by setting the refractive index to 4.7 or more, the Eff is allowed to increase stably. In this case, an Eff value of 5.7% or more can be obtained. Since the crystalline germanium semiconductor is allowed to have a characteristic peak in refractive index near a wavelength of 600 nm, a difference in film characteristics can be determined with high sensitivity by using the refractive index of this wavelength.

Figure 41:
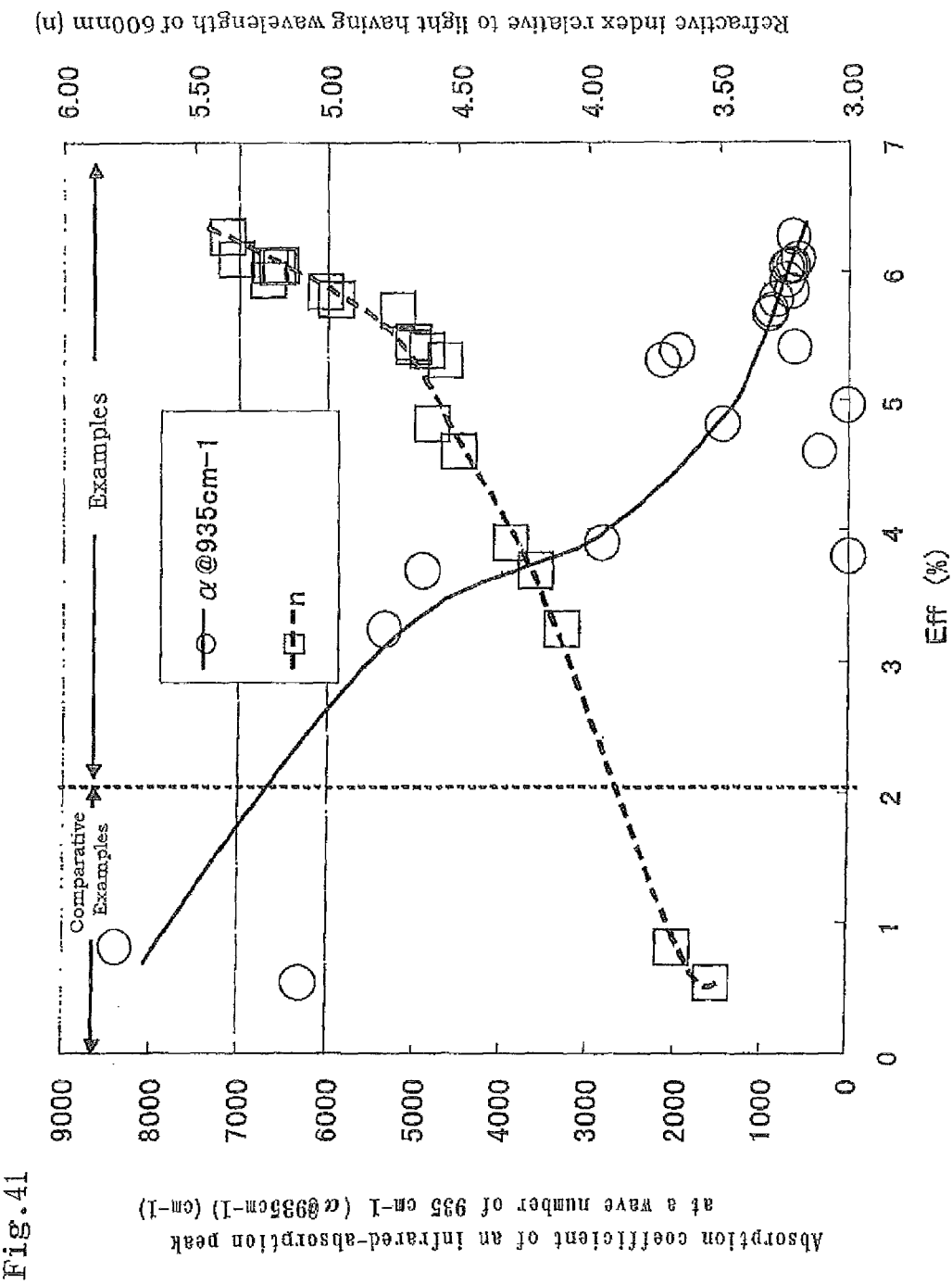
FIG. 41 shows an absorption coefficient at 935 cm$^{-1}$ (a@935 cm$^{-1}$) obtained by FTIR and a refractive index (n) relative to light having a wavelength of 600 nm of a crystalline germanium photoelectric conversion layer, relative to an Eff of a single-junction photoelectric converter having a crystalline germanium photoelectric conversion layer.

FIG. 41 shows an absorption coefficient at 935 cm$^{-1}$ ($\alpha$@935 cm$^{-1}$) obtained by FTIR and a refractive index (n) relative to light having a wavelength of 600 nm of a crystalline germanium photoelectric conversion layer, relative to an Eff of a single-junction photoelectric converter with a crystalline germanium photoelectric conversion layer. The absorption coefficient ($\alpha$@935 cm$^{-1}$) decreases as the Eff increases. However, in the case of the Eff of about 3.7% or more, the absorption coefficient ($\alpha$@935 cm$^{-1}$) starts to fluctuate within a range from 0 to 3000 cm$^{-1}$, thereby losing a clear correlation with the Eff. The absorption coefficient at 960 cm$^{-1}$ has the same tendency, and decreases until the Eff reaches about 3.7%, and when the Eff further increases, it has greater fluctuation.

In contrast, as to the refractive index (n) relative to light having a wavelength of 600 nm, the value n monotonically increases as the Eff increases. This tendency is exerted even when the Eff becomes 3.7% or more, thereby providing a desirable correlation.

Therefore, upon determining the quality of the crystalline germanium semiconductor, a general determination as to whether or not the Eff is 3.7% or less is desirably made based upon the absorption coefficient of 935 cm$^{-1}$ or 960 cm$^{-1}$ obtained by the FTIR. In the case where an attempt is made to determine whether or not a higher conversion efficiency can be obtained, the refractive index relative to light having a wavelength of 600 nm is preferably used as a determination index.

In the case of single crystal germanium, the refractive index relative to light having a wavelength of 600 nm is 5.6. By setting the refractive index to 5.6 or less, the refractive index is made smaller than refractive index of single crystal germanium, and it becomes possible to desirably determine the fact that contamination by impurities of heavy elements, such as heavy metals, is suppressed.

The refractive index relative to light having a wavelength of 600 nm can be measured by using spectral ellipsometry. A crystalline germanium semiconductor, formed under the same conditions as those of the photoelectric converter, is formed on glass or a crystal silicon wafer, and by using the spectral ellipsometry, the refractive index can be measured. Alternatively, the photoelectric converter can be removed by wet etching, and the back electrode can be removed by plasma etching, and the measurement can be carried out by the spectral ellipsometry. In this case, by further carrying out the etching, the measurement is carried out, with a crystalline germanium semiconductor being exposed to the outermost surface, and this method is desirable so as to improve precision.

The crystalline germanium photoelectric conversion layer is desirably formed by using a high-frequency plasma enhanced CVD method, with GeH$_4$ and H$_2$ being used as reaction gases, for example. In this case, the H$_2$/GeH$_4$ ratio is preferably set in a range from 200 to 5000. When the H$_2$/GeH$_4$ ratio is smaller than 200, the crystal volume fraction is deteriorated to undesirably cause an amorphous state; in contrast, when the H$_2$/GeH$_4$ ratio is greater than 5000, the film-deposition rate is lowered to cause a reduction in productivity. In order to obtain good crystallinity and an industrially permissible film-deposition rate, the H$_2$/GeH$_4$ ratio is desirably set in a range from 500 to 2000.

In order to form a crystalline germanium photoelectric conversion layer uniformly in a large area by using a plasma enhanced CVD method, it is preferable to use a frequency of 10 to 100 MHz, with a capacitive coupling type parallel-plane electrode being adopted, rather than using a microwave frequency such as 2.45 GHz. In particular, it is preferable to use 13.56 MHz, 27.12 MHz and 40 MHz, the application of which has been industrially admitted. The high-frequency power density is desirably set to 200 mW/cm$^2$ or more so as to accelerate crystallization. Since the absorption coefficient of an infrared-absorption peak at the wave number of 935±5 cm$^{-1}$ can be easily set to less than 6000 cm$^{-1}$, the high-frequency power density is desirably set to 550 mW/cm$^2$ or more.

Figure 30:
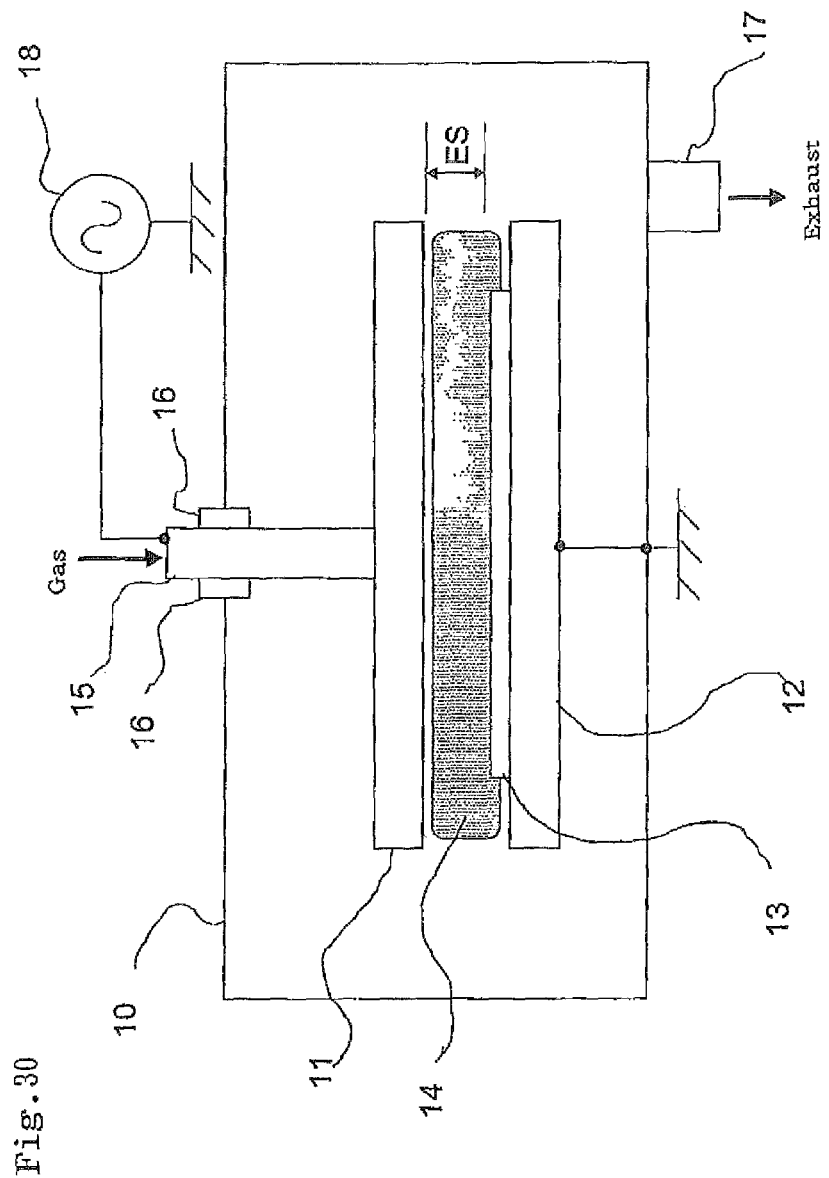
FIG. 30 is a conceptual drawing that shows a plasma enhanced CVD device relating to production processes of the invention.

More specifically, as the high-frequency plasma enhanced CVD device for use in forming a crystalline germanium semiconductor, a plasma enhanced CVD device, provided with a substrate-side electrode with a substrate placed thereon and a high-frequency electrode, can be used. FIG. 30 is a conceptual drawing that shows an example of a plasma enhanced CVD device. A vacuum chamber 10 is provided with a high-frequency electrode 11 and a substrate-side electrode 12 that faces therewith, and by generating a plasma 14 between the electrodes, a film-forming process is carried out. The substrate-side electrode 12 on which a substrate 13 is placed is desirably designed to have an inner heater so as to heat the substrate 13. To the high-frequency electrode 11, a high-frequency power is applied by a high-frequency power supply 18 and a gas introduction tube 15 also used for electric connection. The gas introduction tube 15 is insulated from a wall face of the vacuum chamber 10 by an insulating member 16. Preferably, the high-frequency electrode 11 is also used as a so-called shower plate which uniformly supplies a gas from a large number of pores that are opened like a shower. In this case, a distance (ES) between the high-frequency electrode and the substrate is preferably set to 12 mm or less. By setting the ES to 12 mm or less, the refractive index of the crystalline germanium semiconductor increases as will be described later, so that a dense film can be obtained and the characteristics of the thin-film photoelectric converter are improved. Gases inside the vacuum chamber are discharged through an exhaust pipe 14.

Figure 31:
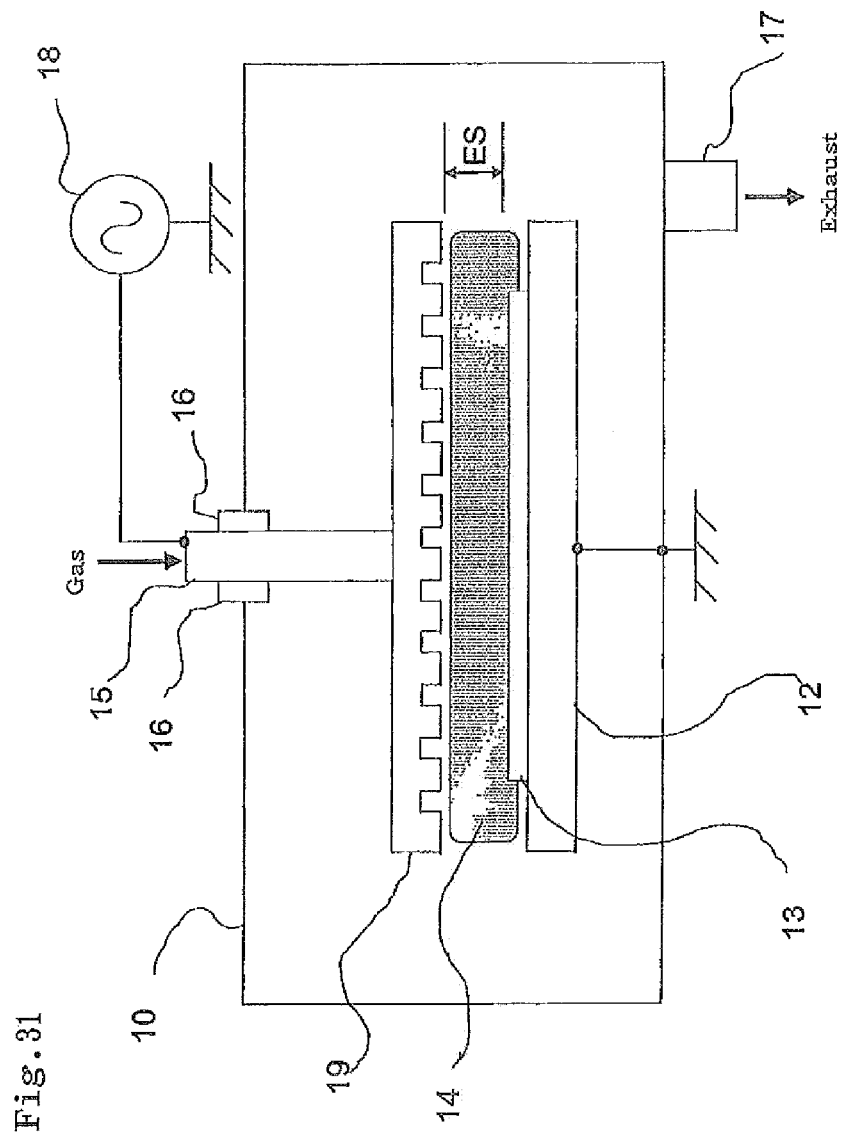
FIG. 31 is a conceptual drawing that shows a plasma enhanced CVD device provided with a hollow cathode-type electrode relating to the production processes of the invention.

The high-frequency electrode is desirably prepared as a hollow cathode-type electrode. FIG. 31 is a conceptual drawing of an example of a plasma enhanced CVD device in which a hollow cathode-type electrode 19 is used as the high-frequency electrode. In the case where the high-frequency electrode is prepared as a normal flat-plate electrode, when the ES is reduced to 12 mm or less, a plasma is only slightly generated between the electrodes, and in its extreme case, no film is allowed to adhere to the substrate. In contrast, in the case where the high-frequency electrode is prepared as the hollow cathode-type electrode, even in the case of the ES of 12 mm or less, a plasma is generated between the electrodes in a stable manner so that a dense crystalline germanium semiconductor can be formed uniformly. Further, in comparison with the flat-plate electrode, the application of the hollow cathode-type electrode makes the refractive index of the crystalline germanium semiconductor higher so that a more dense crystalline germanium semiconductor can be formed. In this case, the hollow cathode-type electrode refers to an electrode having concave sections having a cylinder shape or a rectangular parallelepiped shape on its surface. In the case of the cylinder shape, the size of each concave section is preferably set to 0.1 mm to 10 mm in diameter (a) and 0.1 mm to more than a dozen millimeters in depth (b), with an aspect ratio, that is, a ratio (b/a) of the depth and the diameter, being preferably set to 0.2 to 5, more preferably to 0.5 to 2. In the case of the rectangular parallelepiped shape also, one side of each concave section is preferably set to 0.1 mm to 10 mm and the depth (b) is set to 0.1 mm to more than a dozen millimeters, with an aspect ratio, that is, a ratio of the depth and any one of the sides, being preferably set to 0.2 to 5, more preferably to 0.5 to 2. Since the concave section having a comparatively large aspect ratio of 0.2 to 5 is prepared, an electron density of plasma becomes higher in the concave section so that a plasma is easily generated, and the plasma is subsequently generated between the electrodes in a stable manner even when the ES is set to 12 mm or less. The aspect ratio is desirably set to 2 or less because this ratio allows the thickness of the high-frequency electrode to be made thinner, and the electrode easily formed, and in order to increase the electron density, the ratio is more preferably set to 0.5 or more. It is preferable to form a plurality of concave sections of the hollow cathode-type electrode uniformly on almost the entire surface thereof that faces the substrate of the high-frequency electrode.

In the case where the hollow cathode-type electrode is also used as the shower plate, each of gas-supplying holes may be formed in the concave section of the hollow cathode, or each of gas-supplying holes may be formed in a position different from the concave section of the hollow cathode. From the viewpoints of an easy machining process and an increase in the numbers of the concave sections and the gas-supplying holes per unit area, the gas-supplying holes are preferably disposed in the concave sections of the hollow cathode.

With respect to the high-frequency plasma for use in manufacturing a crystalline germanium semiconductor, it is preferable that neither a Ge atom light emission peak having a peak in wavelengths of 265 nm±2 nm nor a Ge atom light emission peak having a peak in wavelengths of 304±2 nm, due to an excited germanium atom (Ge*), is detected in its emission spectrum. It is considered that the Ge atom serving as active species having high reactivity causes a chain reaction with a GeH$_4$ raw material gas in a plasma, as indicated by formula (2), to generate a polymer or a cluster containing a plurality of Ge atoms.

$$Ge+GeH_4 \rightarrow Ge_2H_x$$

$$Ge_2H_x+GeH_4 \rightarrow Ge_3H_y$$

$$Ge_3H_y+GeH_4 \rightarrow Ge_4H_z \quad \text{Formula (2)}$$

When no Ge atom light emission peak is detected, it is found that there are only few Ge atoms serving as active species having high reactivity, and the generation of a polymer and a cluster in the plasma is suppressed, with the result that a dense crystalline germanium semiconductor is formed and characteristics of the resulting photoelectric converter can be improved.

Figure 32:
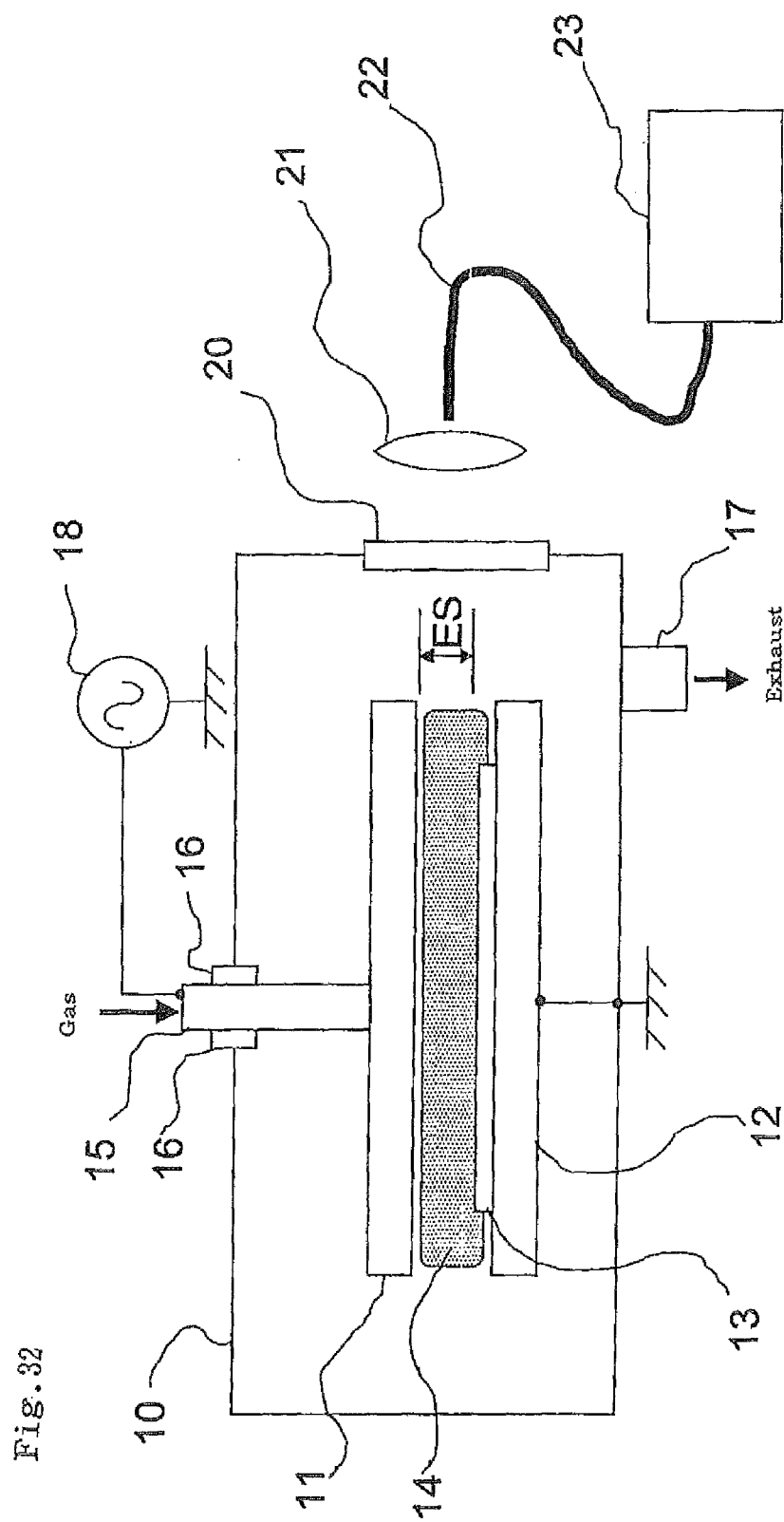
FIG. 32 is a conceptual drawing that shows an emission spectrum measuring device relating to the production process of the invention.

FIG. 32 is a conceptual drawing that shows an example of an emission spectrum measuring device. A window 20, made of quartz glass, is attached to the above-mentioned plasma enhanced CVD device, and light emission of a plasma is converged by a lens 21 made of quartz, and directed to an optical fiber 22 so that an emission spectrum is obtained by a spectrometer 23. Since the light emission peak of a Ge atom is within ultraviolet ray wavelength range, the window 20, the lens 21 and the optical fiber 22 are preferably made of quartz so as to transmit ultraviolet rays. In the measurement of examples of the present application, a fiber multichannel spectrometer USB4000 manufactured by Ocean Optics, Inc. was used as the spectrometer 23. The measurable wavelength range is set to 200 to 850 nm.

Figure 33:
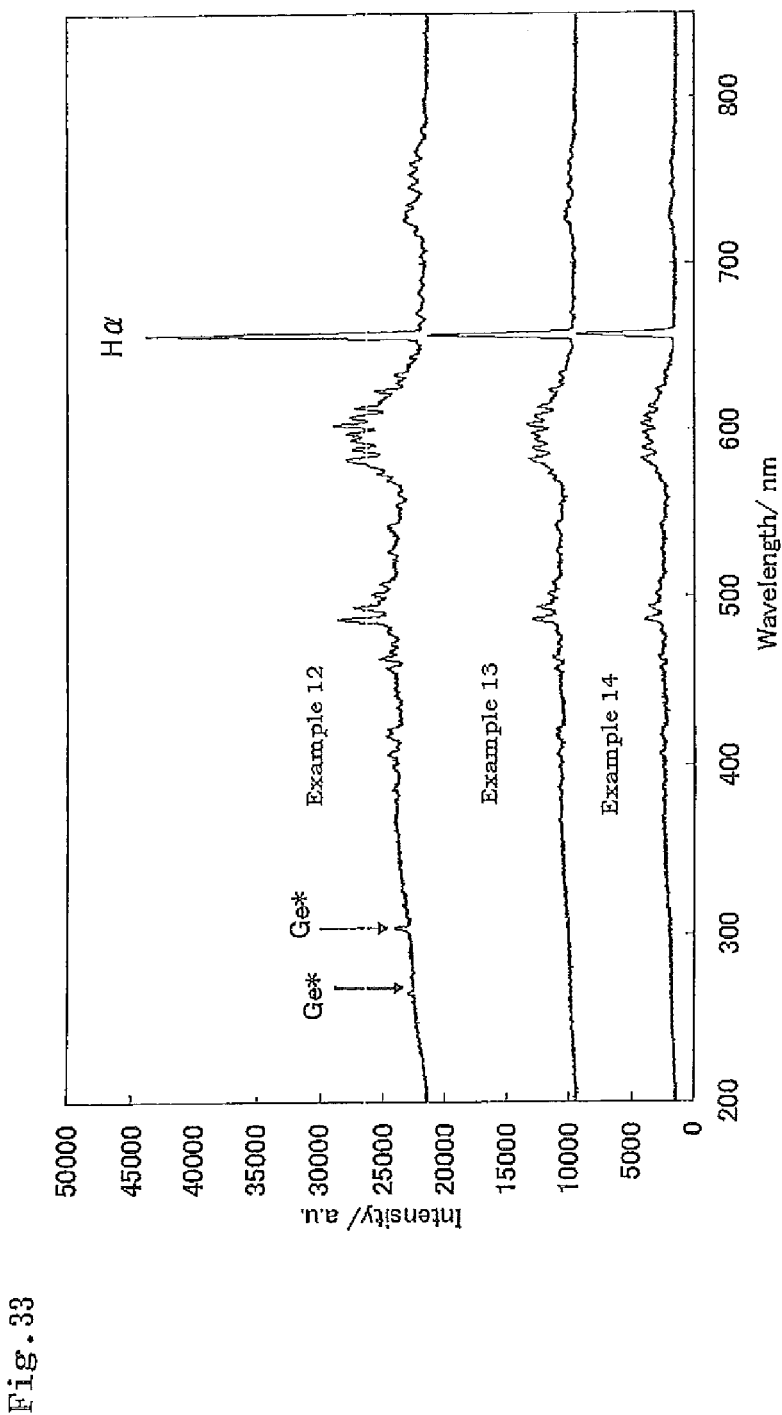
FIG. 33 illustrates an emission spectrum to be used upon forming a crystalline germanium photoelectric conversion layer in accordance with Examples 12, 13 and 14 of the invention.
Figure 34:
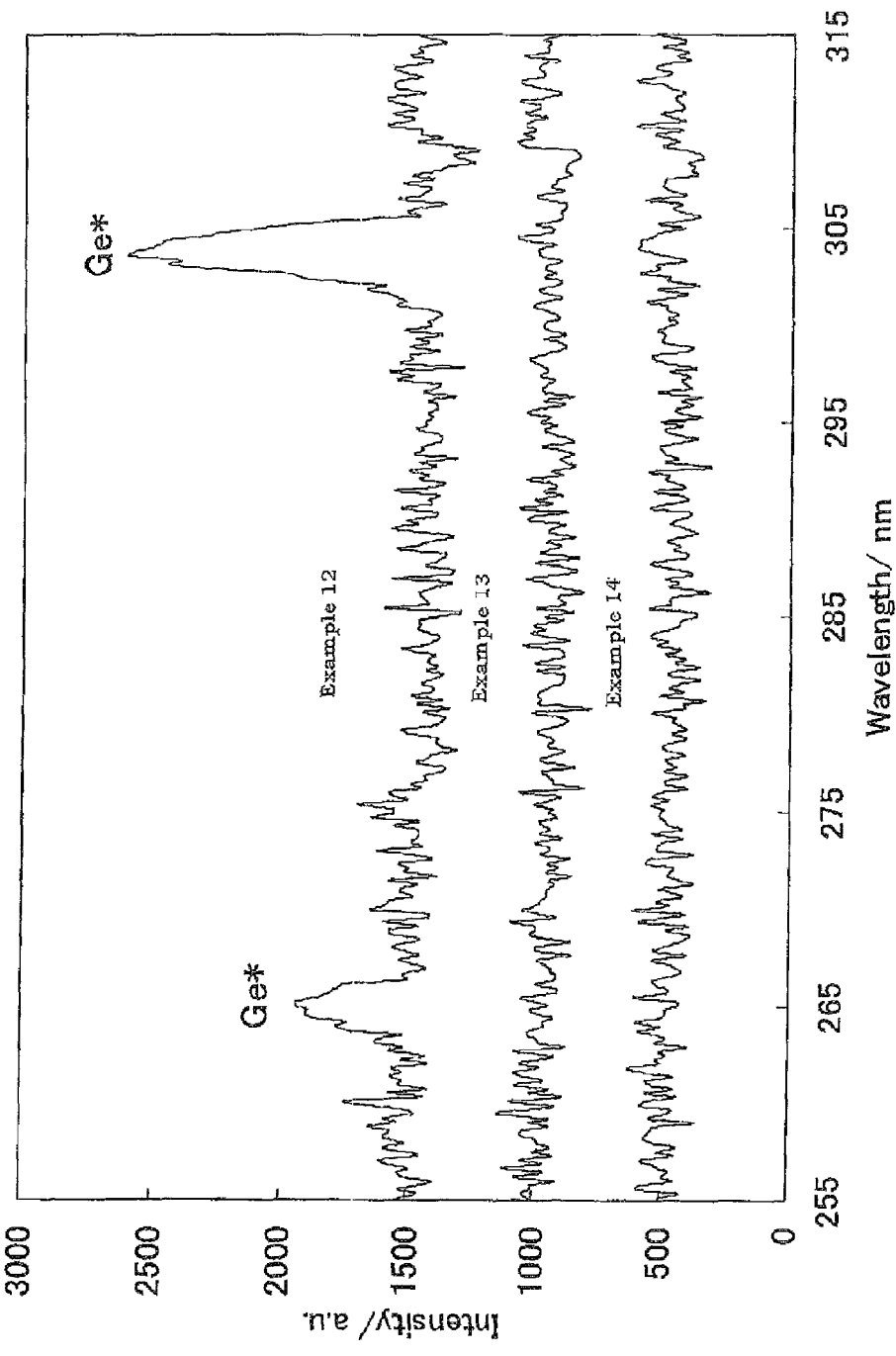
FIG. 34 illustrates another emission spectrum to be used upon forming a crystalline germanium photoelectric conversion layer in accordance with Examples 12, 13 and 14 of the invention.

FIGS. 33 and 34 show emission spectra in the case where a Ge atom light emission peak is detected (Example 12 to be described later) and in the case where no Ge atom light emission peak is detected (Examples 13 and 14 to be described later), respectively. FIG. 33 shows measured spectra over the entire wavelength area (200 to 850 nm). An Hα peak derived from hydrogen atoms can be seen in each of Examples 12, 13 and 14. In addition, a large number of peaks derived from hydrogen molecules are recognized. A Ge atom light emission peak is observed at a position indicated by Ge* only in Example 12. FIG. 34 shows the wavelengths near the Ge atom light emission peak in an enlarged manner, and further illustrates a spectrum from which a base line is subtracted. As the base line, a straight line, formed by connecting a start point at a wavelength of 255 nm and a terminal point at a wavelength of 315 nm, was used. In Example 12, Ge atom light emission peaks are clearly recognized at a wavelengths of 265 nm and 304 nm. In each of the cases, the half-value width is about 2.5 nm. In contrast, in Examples 13 and 14, no Ge atom light emission peak is detected. In the present application, the fact that no Ge atom light emission peak is detected is defined that no signals other than noise levels are found in a spectrum from which the base line has been subtracted in any of wavelengths of 265 nm±2 nm and 304 nm±2 nm. More specifically, only the peaks having a half-value width of 1 nm or less are found in any of the wavelengths of 265 nm±2 nm and 304 nm±2 nm.

Upon forming a crystalline germanium photoelectric conversion layer, the substrate temperature is desirably set to 200° C. or more in order to suppress generation of powder during the forming process. Since the absorption coefficient of the infrared-absorption peak at the wave number of 935±5 cm$^{-1}$ can be easily set to less than 6000 cm$^{-1}$, the substrate temperature is preferably set to 250° C. or more. In order to suppress diffusion of impurities from the conductive type layer into the photoelectric conversion layer, the substrate temperature is preferably set to 500° C. or less, more preferably to 400° C. or less.

Figure 37:
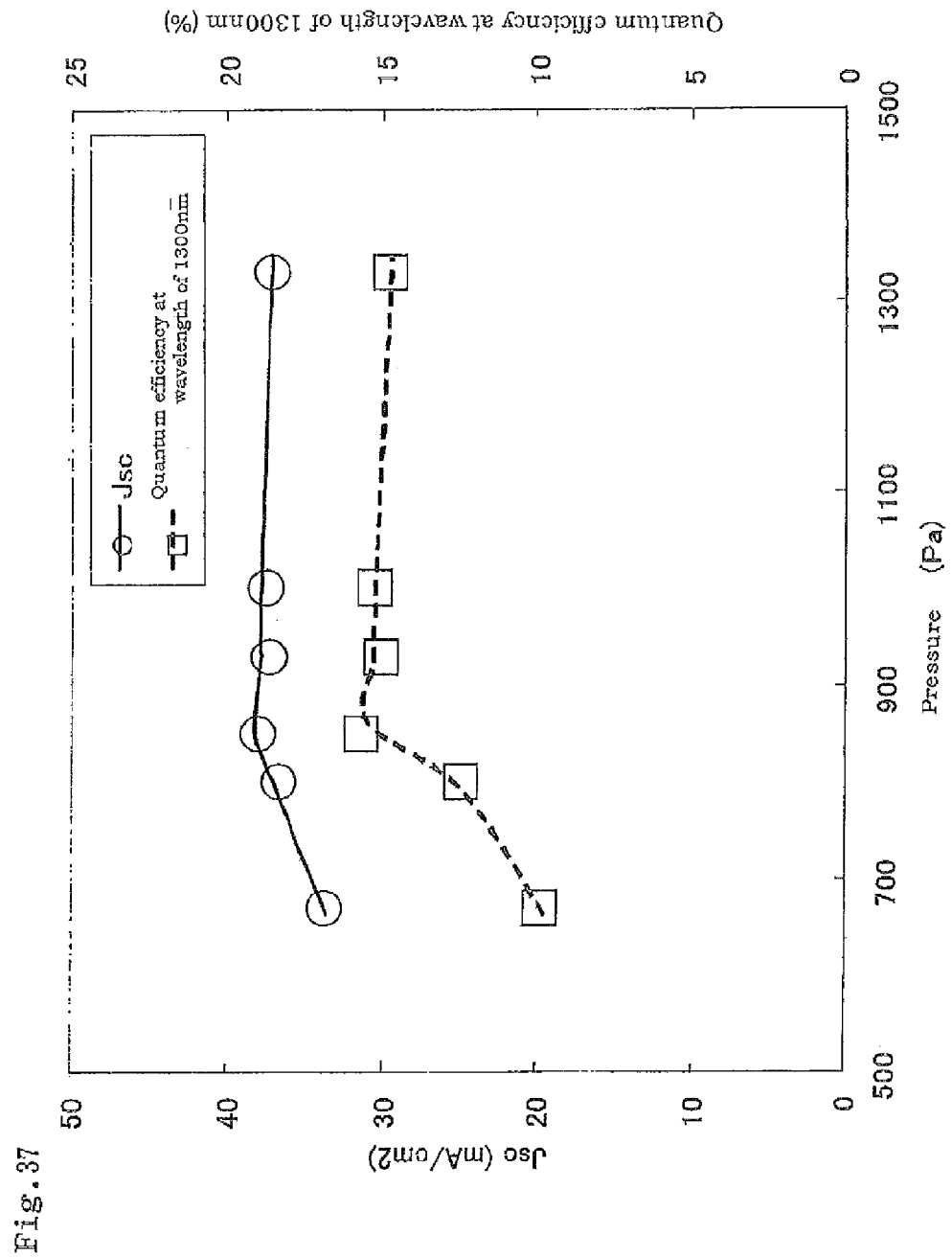
FIG. 37 shows a short circuit current density Jsc and a quantum efficiency at a wavelength of 1300 nm of a thin-film photoelectric converter relative to a pressure to be used upon forming a crystalline germanium photoelectric conversion layer.
Figure 38:
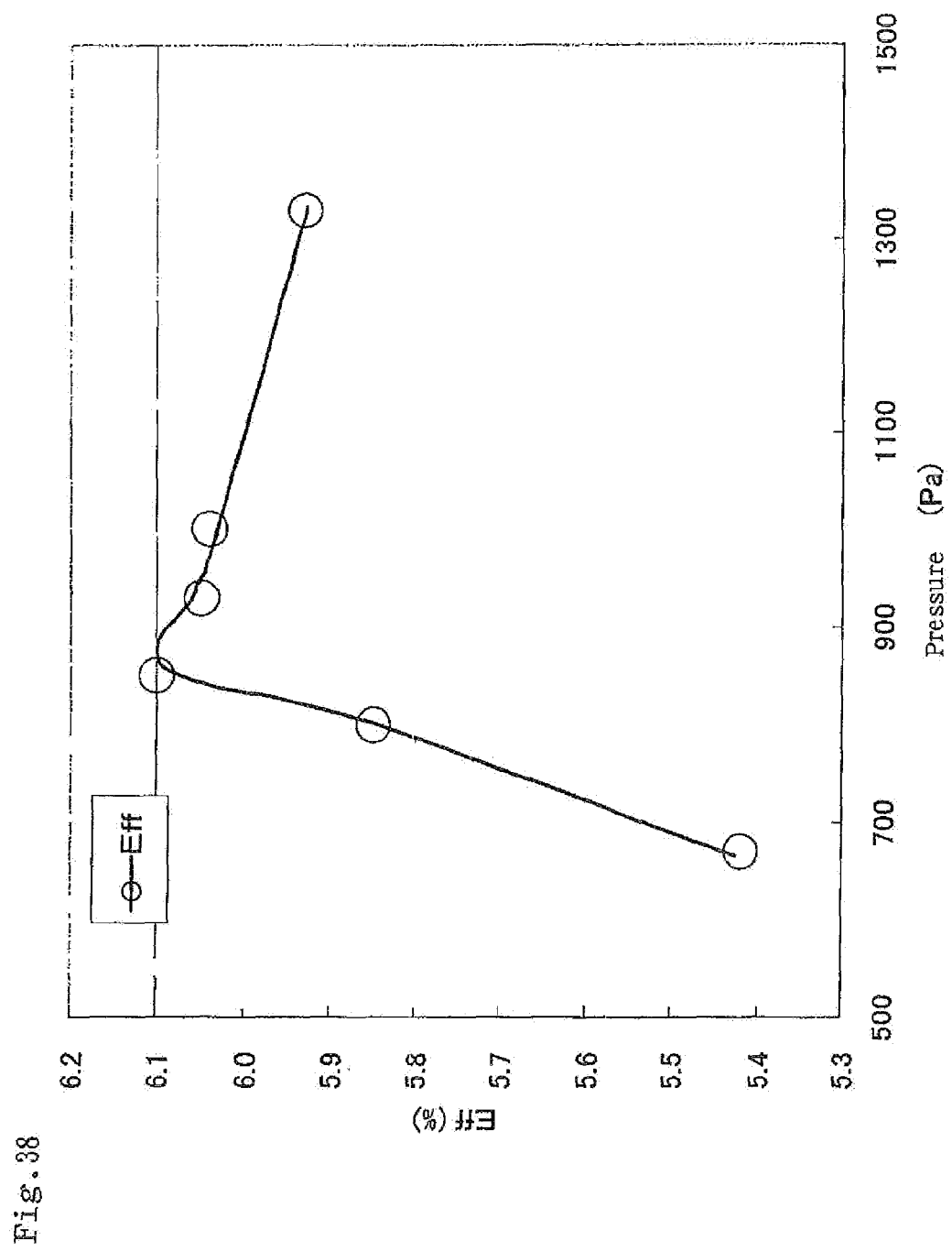
FIG. 38 shows a conversion efficiency Eff of a thin-film photoelectric converter relative to a pressure to be used upon forming a crystalline germanium photoelectric conversion layer.

Further, upon forming a crystalline germanium photoelectric conversion layer, the pressure is desirably set to 40 Pa or more and 200 Pa or less in order to provide good crystallinity. Furthermore, in order to improve the uniformity upon forming a layer with a large area, the pressure is desirably set to 200 Pa or more and 1500 Pa or less. In order to satisfy both of good crystallinity and a high film-deposition rate, the pressure is preferably set to 800 Pa or more and 1330 Pa or less. As shown in FIGS. 37 and 38 to be described later, it is preferable to set the film deposition pressure of 800 Pa or more, since the Jsc of the photoelectric converter is allowed to exhibit a high value of 35 mA/cm$^2$ or more. It is more preferable to set the film deposition pressure of 800 Pa or more and 1330 Pa or less, since the Eff is allowed to exhibit a high value of 5.8% or more. It is further preferable to set the film deposition pressure of 850 Pa or more and 1000 Pa or less, since the Eff exhibits a value of 6% or more.

As the back electrode layer 6, at least one metal layer made from at least one material selected from Al, Ag, Au, Cu, Pt and Cr is preferably formed by using a sputtering method or a vapor deposition method. Moreover, a layer made from a conductive oxide such as ITO, SnO$_2$, or ZnO may be formed between the photoelectric conversion unit and the metal layer (not shown).

Figure 3:
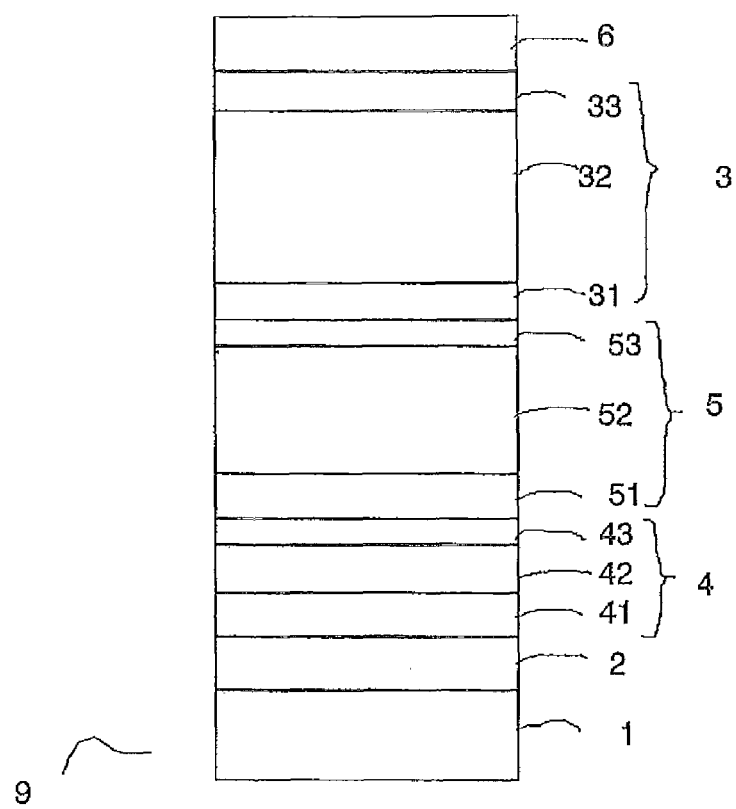
FIG. 3 is a schematic cross-sectional view that shows a triple-junction thin-film photoelectric converter in accordance with still another embodiment of the invention.

FIG. 3 is a cross-sectional view that schematically shows a triple-junction thin-film photoelectric converter in accordance with another embodiment of the invention. This thin-film photoelectric converter has a structure in which, between the transparent electrode layer 2 and the crystalline germanium photoelectric conversion unit 3 of the single-junction thin-film photoelectric converter of FIG. 1, an amorphous silicon photoelectric conversion unit and a crystalline silicon photoelectric conversion unit are successively formed. That is, from the light-incident side, an amorphous silicon photoelectric conversion unit serving as a top cell, a crystalline silicon photoelectric conversion unit serving as a middle cell and a crystalline germanium photoelectric conversion unit serving as a bottom cell are successively formed.

The substrate, the transparent electrode layer, the crystalline germanium photoelectric conversion unit serving as the bottom cell, and the back electrode layer can be formed by using the same structures and the same methods as those in the case of FIG. 1.

An amorphous silicon photoelectric conversion unit 4 serving as the top cell is formed by using a plasma enhanced CVD method, for example, by stacking a p-type layer, an i-type layer and an n-type layer in this order. More specifically, a p-type amorphous silicon carbide layer 41 doped with 0.01 atomic % or more of boron, a substantially i-type amorphous silicon photoelectric conversion layer 42, and an n-type microcrystalline silicon layer 43 doped with 0.01 atomic % or more of phosphorus are disposed in this order.

The crystalline silicon photoelectric conversion unit 5 serving as the middle cell is formed by stacking, for example, a p-type layer, an i-type layer and an n-type layer in this order by a plasma enhanced CVD method. More specifically, a p-type microcrystalline silicon layer 51 doped with 0.01 atomic % or more of boron, a substantially i-type crystalline silicon photoelectric conversion layer 52, and an n-type microcrystalline silicon layer 53 doped with 0.01 atomic % or more of phosphorus are disposed in this order.

Additionally, in FIG. 3, a triple-junction thin-film photoelectric converter is shown; however, it will be understood that, by placing the crystalline germanium photoelectric conversion unit on the photoelectric conversion unit that is farthest from the light incident side, a thin-film photoelectric converter in which a double-junction photoelectric conversion unit or a four- or more-junction photoelectric conversion unit is stacked can be obtained.

Although FIG. 1 shows a thin-film photoelectric converter on which light is made incident from the substrate side, it will be understood that the invention is effectively applied also to a thin-film photoelectric converter on which light is made incident from the side opposite to the substrate. In the case where light is made incident thereon from the side opposite to the substrate, for example, an arrangement may be made so that a substrate, a back electrode layer, a crystalline germanium photoelectric conversion unit and a transparent electrode layer are stacked in this order. In this case, the crystalline germanium photoelectric conversion unit is preferably formed by stacking an n-type layer, a crystalline germanium photoelectric conversion layer and a p-type layer in this order.

It will be understood that the invention is effectively applied also to an integrated-type thin-film photoelectric converter in which a series-connected structure is formed on the same substrate by using a laser patterning process. In the case of the integrated-type thin-film photoelectric converter, the structure in which light is made incident on the substrate side as shown in FIG. 1 is preferably used because the laser patterning process is easily carried out thereon.

EXAMPLES

In the following, the invention will be described in more detail based upon Examples of the invention and Comparative Examples of the prior art. In the respective drawings, similar members are indicated by the same reference numerals, and the overlapped explanations thereof will be omitted. Additionally, it will be understood that the invention is not limited to the following Examples and various changes may be made within the scope not departing from the gist of the invention.

Example 1

A single-junction thin-film photoelectric converter 7 having a structure shown in FIG. 1 was manufactured as Example 1. As a transparent substrate 1, a glass substrate having a thickness of 0.7 mm was used. On the transparent substrate 1, an $SnO_2$ film having an average thickness of 700 nm, with fine pyramid-shaped surface irregularities contained therein, was formed by a thermal CVD method. Further, a ZnO film doped with Al was formed thereon with a thickness of 20 nm by using a sputtering method so that a transparent electrode layer 2 in which $SnO_2$ and ZnO were stacked was formed. The resulting transparent electrode layer 2 had a sheet resistivity of about 9 Ω/square. The haze ratio measured by using a illuminant C was 12%, and an average level difference d of the surface irregularities was about 100 nm. The haze ratio was measured based upon JIS K7136.

On this transparent electrode layer 2, a crystalline germanium photoelectric conversion unit 3 was manufactured by using a capacitive coupling type high-frequency plasma enhanced CVD device provided with a parallel-plate electrode with a frequency of 13.56 MHz, whose conceptual drawing is shown in FIG. 30. After a p-type microcrystalline silicon layer 31 had been formed thereon with a thickness of 10 nm with $SiH_4$, $H_2$ and $B_2H_6$ being introduced therein as reaction gases, a crystalline germanium photoelectric conversion layer 32 was formed with a thickness of 2.0 μm by introducing $GeH_4$ and $H_2$ therein as reaction gases. At this time, the flow ratio of $H_2/GeH_4$ was set to 2000 times, the substrate temperature was set to 300° C., the pressure was set to 800 Pa, and the high-frequency power density was set to 300 mW/cm². The distance (ES) between the electrodes was 12 mm. Thereafter, by introducing $SiH_4$, $H_2$ and $PH_3$ as reaction gases, an n-type microcrystalline silicon layer 53 was formed thereon with a thickness of 15 nm so that a crystalline germanium photoelectric conversion unit 3 was formed.

Figure 4:
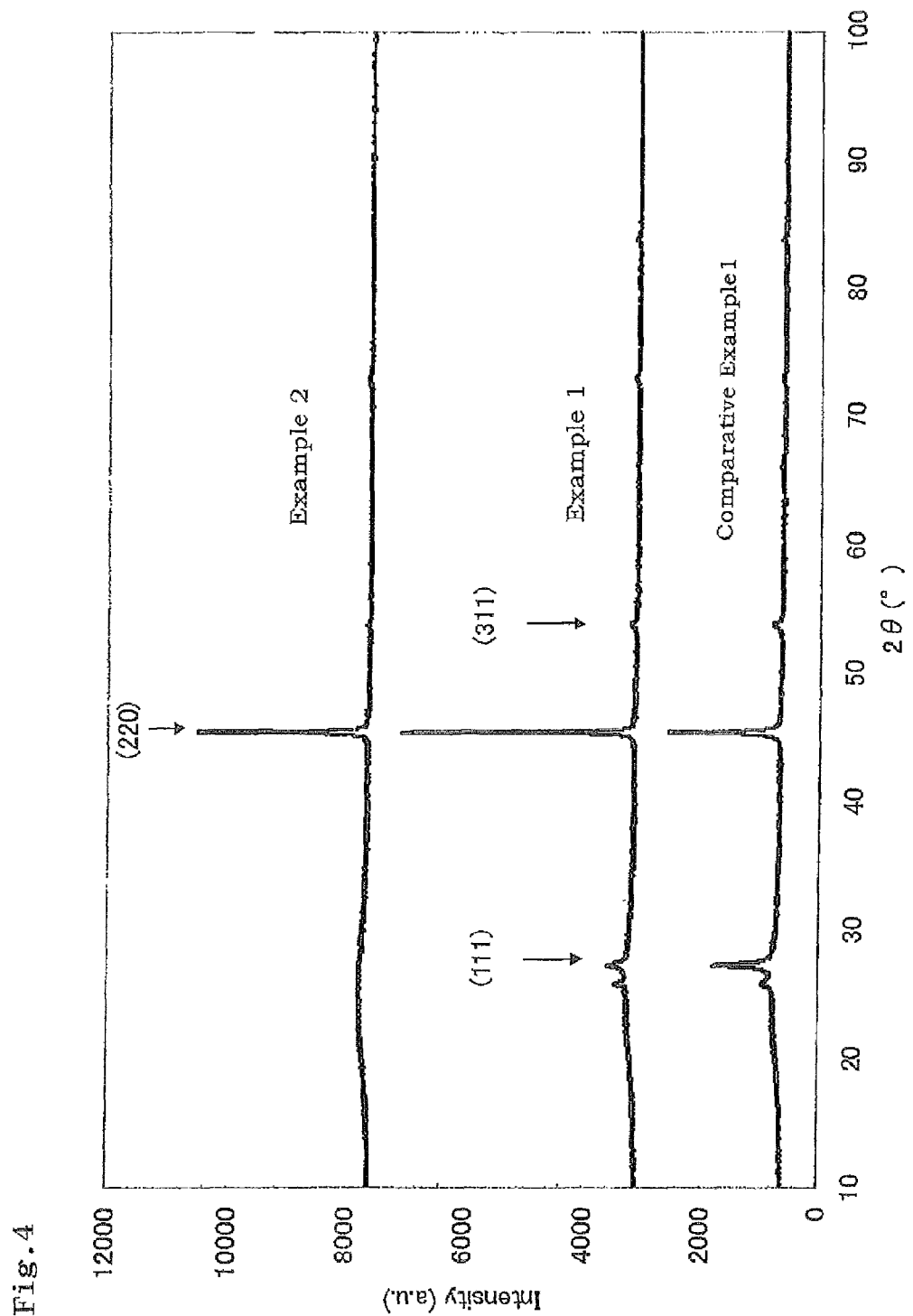
FIG. 4 illustrates an X-ray diffraction spectrum of a crystalline germanium photoelectric conversion layer of Examples 1 and 2, and Comparative Example 1.
Figure 5:
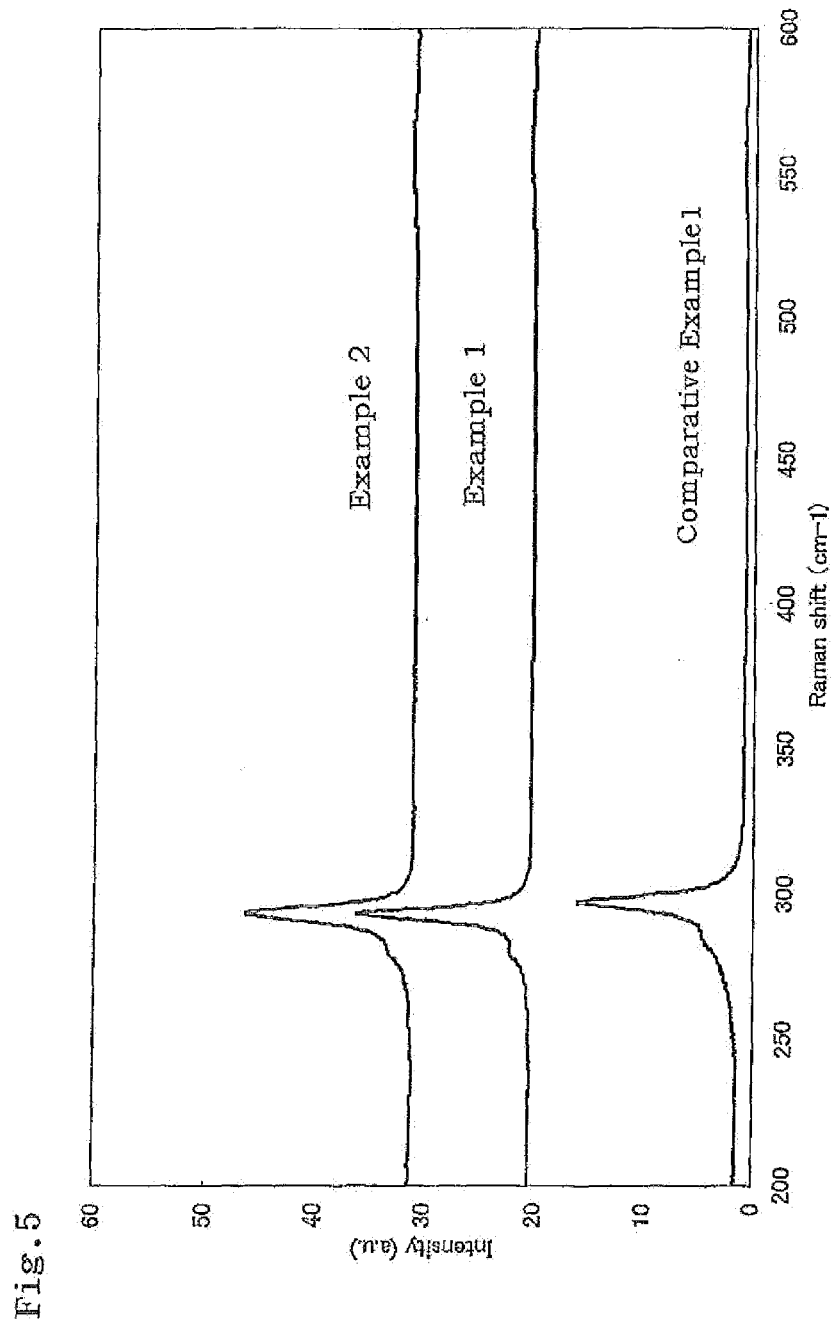
FIG. 5 illustrates a Raman scattering spectrum of a crystalline germanium photoelectric conversion layer of Examples 1 and 2, and Comparative Example 1.

A crystalline germanium layer was formed on the glass substrate under the same conditions as those described above, and measurement was carried out based upon transmission spectrum and reflection spectrum so that an absorption coefficient of 8300 cm$^{-1}$ was obtained at a wavelength of 1300 nm, which exhibited a high absorption coefficient relative to light with long wavelengths. FIG. 4 shows an X-ray diffraction spectrum measured by a θ-2θ method. Sharp peaks in (111), (220), and (311) orientations were observed so that its crystallization state was confirmed. The (220) peak intensity was the strongest, and the peak intensity ratio of (220)/(111) was 13. The crystal grain size found by a half-value width of the (220) peak was 63 nm. A Raman scattering spectrum is shown in FIG. 5. A sharp peak in a TO mode of a crystal Ge—Ge bond was observed near 300 cm$^{-1}$, thereby indicating a crystallization. In addition, when Hall-effect measurement was carried out, the crystalline germanium layer exhibited a weak n-type, and the carrier density was $1.9 \times 10^{16}$ cm$^{-3}$, with the mobility being set to 3.0 cm²/(V·s). The refractive index relative to light at a wavelength of 600 nm, measured by using spectral ellipsometry, was 4.62.

Figure 6:
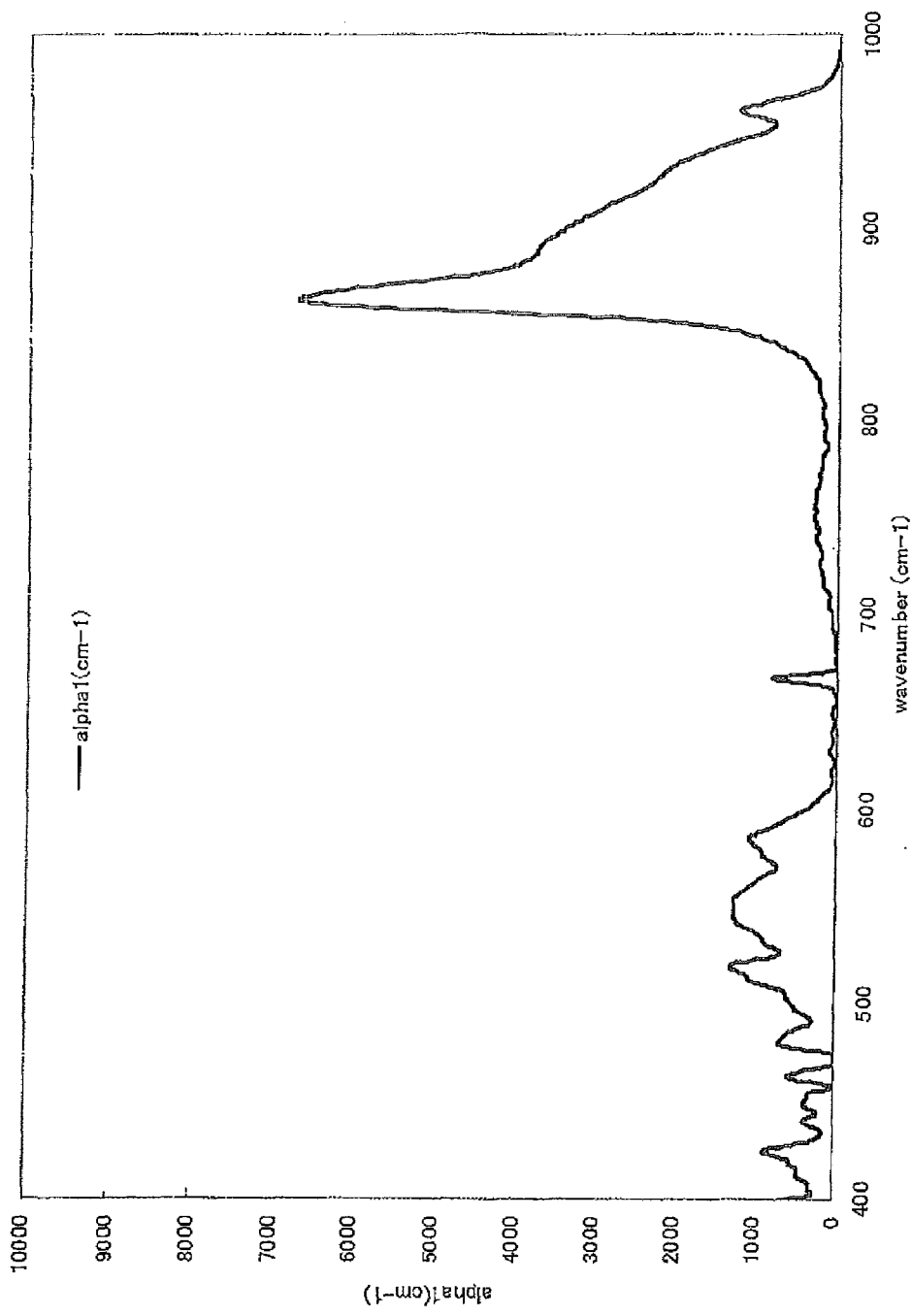
FIG. 6 illustrates an infrared-absorption spectrum of a crystalline germanium photoelectric conversion layer of Example 1.

A crystalline germanium layer was formed on the crystal silicon substrate under the same conditions as those of the above-mentioned thin-film photoelectric converter, and an infrared-absorption spectrum, which is shown in FIG. 6, was measured by FTIR. Absorption peaks or shoulders were recognized at 560 cm$^{-1}$, 755 cm$^{-1}$, 860 cm$^{-1}$, 935 cm$^{-1}$ and 960 cm$^{-1}$. The peak at 560 cm$^{-1}$ was derived from a Ge—H bond, and that at 860 cm$^{-1}$ was derived from a (Ge—O—G)$_n$ bond. At 755 cm$^{-1}$, 935 cm$^{-1}$ and 960 cm$^{-1}$, no absorption peaks were identified. The absorption coefficients of the absorption peaks at 935 cm$^{-1}$ and 960 cm$^{-1}$ were 2000 cm$^{-1}$ and 1250 cm$^{-1}$, respectively.

Thereafter, as a back electrode layer 6, an Al doped ZnO film having a thickness of 30 nm and an Ag film having a thickness of 300 nm were successively formed thereon by a sputtering method.

After the formation of the back electrode layer 6, the film formed on the SnO$_2$ film 2 was partially removed by a laser scribe method, and separated into a size of 1 cm$^2$ so that a single-junction thin-film photoelectric converter 7 (light-receiving area: 1 cm$^2$) was manufactured.

The single-junction thin-film photoelectric converter 7 (light-receiving area: 1 cm$^2$) thus obtained was irradiated with light of AM 1.5 with a intensity of light of 100 mW/cm$^2$, and its output characteristics were measured so that, as shown in Example 1 of Table 1, an open circuit voltage (Voc) of 0.270 V, a short circuit current density (Jsc) of 34.4 mA/cm$^2$, a fill factor (FF) of 0.58, and a conversion efficiency (Eff) of 5.4% were obtained. The quantum efficiency at a wavelength of 1300 nm was 10%.

Figure 7:
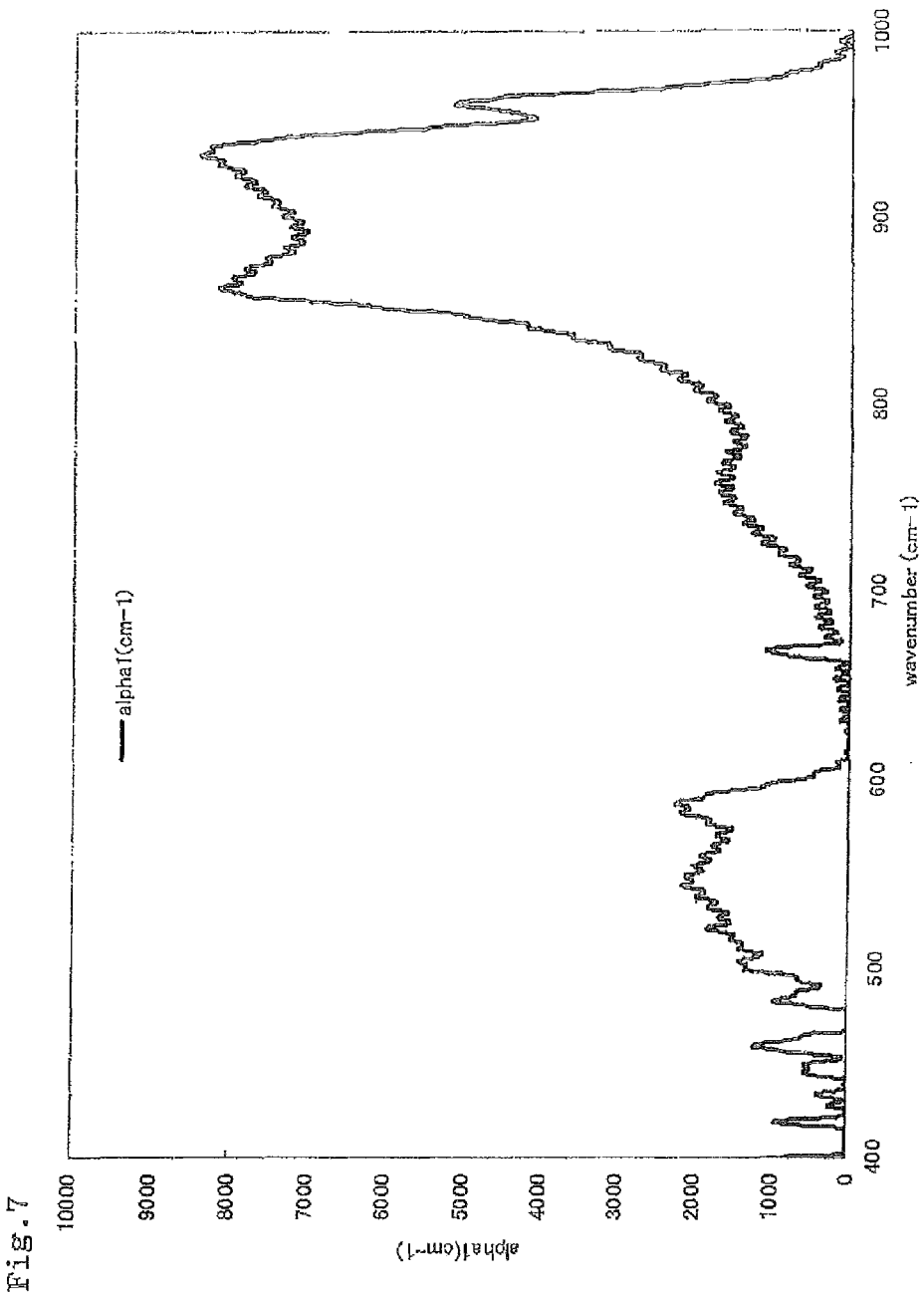
FIG. 7 illustrates an infrared-absorption spectrum of a crystalline germanium photoelectric conversion layer of Comparative Example 1.

A crystalline germanium layer was formed on the crystal silicon substrate under the same conditions as those of the above-mentioned thin-film photoelectric converter, and an infrared-absorption spectrum, which is shown in FIG. 7, was measured by FTIR. Absorption peaks were recognized at wave numbers of 560 cm$^{-1}$, 755 cm$^{-1}$, 860 cm$^{-1}$, 935 cm$^{-1}$ and 960 cm$^{-1}$. The absorption coefficients of the absorption peaks at wave numbers of 935 cm$^{-1}$ and 960 cm$^{-1}$ were 8400 cm$^{-1}$ and 5130 cm$^{-1}$, respectively.

As shown in Table 1, the output characteristics of the photoelectric converter of Comparative Example 1 were measured in the same manner as in Example 1; thus, a Voc of 0.18 V, a Jsc of 18.2 mA/cm$^2$, an FF of 0.25 and an Eff of 0.82% were obtained. The quantum efficiency at a wavelength of 1300 nm was 0.8%.

Summary of Example 1 and Comparative Example 1

Relative to Comparative Example 1, all the parameters in Example 1 were improved, and in particular, the Jsc had a great value exceeding 30 mA/cm$^2$. Moreover, the quantum efficiency relative to long wavelength light of 1300 nm of Example 1 reached 10%, indicating that the long wavelength

TABLE 1

| | Substrate Temperature (° C.) | High-frequency Power Density (mW/cm$^2$) | Voc (V) | Jsc (mA/cm$^2$) | FF | Eff (%) | Quantum Efficiency at Wavelength of 1300 nm (%) | Absorption Coefficient of Infrared-Absorption Peak 935 cm$^{-1}$ (cm$^{-1}$) | 960 cm$^{-1}$ (cm$^{-1}$) |
|---|---|---|---|---|---|---|---|---|---|
| Comparative Example 1 | 200 | 300 | 0.18 | 18.2 | 0.25 | 0.82 | 0.8 | 8400 | 5130 |
| Example 4 | 250 | 300 | 0.23 | 31.5 | 0.51 | 3.7 | 7 | 4900 | 2940 |
| Example 1 | 300 | 300 | 0.27 | 34.4 | 0.58 | 5.4 | 10 | 2000 | 1250 |
| Example 5 | 350 | 300 | 0.25 | 36.1 | 0.55 | 5.0 | 11 | 26 | 33 |
| Example 2 | 400 | 300 | 0.22 | 33.2 | 0.52 | 3.8 | 10.5 | 0 | 0 |

Comparative Example 1

As Comparative Example 1, a single-junction thin-film photoelectric converter similar to that of Example 1 was manufactured. The converter of Comparative Example 1 was manufactured in the same manner as in Example 1, except that the crystalline germanium photoelectric conversion layer of FIG. 1 was formed at 200° C.

An absorption coefficient at a wavelength of 1300 nm, measured in the same manner as in Example 1, was 5000 cm$^{-1}$, which exhibited a high absorption coefficient relative to light with long wavelengths. FIG. 4 shows an X-ray diffraction spectrum measured by a θ-2θ method. Peaks in (111), (220), and (311) orientations were observed so that its crystallization state was confirmed. In Comparative Example 1, a difference in respective peak intensities was small, and the peak intensity ratio of (220)/(111) was 1.8. The crystal grain size found by a half-value width of the (220) peak was 41 nm. A Raman scattering spectrum is shown in FIG. 5. A sharp peak in a TO mode of a crystal Ge—Ge bond was observed near 300 cm$^{-1}$, thereby indicating a crystallization. Moreover, when Hall-effect measurement was carried out, the crystalline germanium layer exhibited a weak n-type, and the carrier density was 3.2×10$^{16}$ cm$^{-3}$, with the mobility being set to 1.3 cm$^2$/(V·s). The refractive index relative to light at a wavelength of 600 nm, measured by using spectral ellipsometry, was 3.67.

light can be utilized. In the crystalline germanium layers of Comparative Example 1 and Example 1, no great difference is observed in Raman scattering spectrum. However, among infrared-absorption peaks, each of the peaks of 935 cm$^{-1}$ and 960 cm$^{-1}$ becomes a half or less in Example 1 in comparison with that of Comparative Example 1. For this reason, it is considered that the crystalline germanium photoelectric conversion layer of Example 1 is less susceptible to the generation of a cluster or a polymer, or germanium oxide so that the characteristics of the thin-film photoelectric converter can be improved. In addition, in the X-ray diffraction spectrum of Example 1, the peak intensity ratio of (220)/(111) exhibits a great value exceeding 10, and it is considered that, although large columnar crystal grains are grown in the film thickness direction, the generated electric current is easily allowed to flow so that the Jsc has a high value exceeding 30 mA/cm$^2$.

Example 2

As Example 2, a single-junction thin-film photoelectric converter similar to that of Example 1 was manufactured. The converter of Example 2 was manufactured in the same manner as in Example 1, except that the crystalline germanium photoelectric conversion layer of FIG. 1 was formed at 400° C.

An absorption coefficient at a wavelength of 1300 nm, measured in the same manner as in Example 1, was 1620 cm$^{-1}$, which exhibited a high absorption coefficient relative to light with long wavelengths. An X-ray diffraction spectrum is shown in FIG. 4. A particularly strong peak in (220) orientation is observed so that its crystallization state was confirmed. The peak intensity ratio of (220)/(111) was 91. The crystal grain size found by a half-value width of the (220) peak was 51 nm. A Raman scattering spectrum is shown in FIG. 5. A sharp peak in a TO mode of a crystal Ge—Ge bond was observed near 300 cm$^{-1}$, thereby indicating a crystallization.

Figure 8:
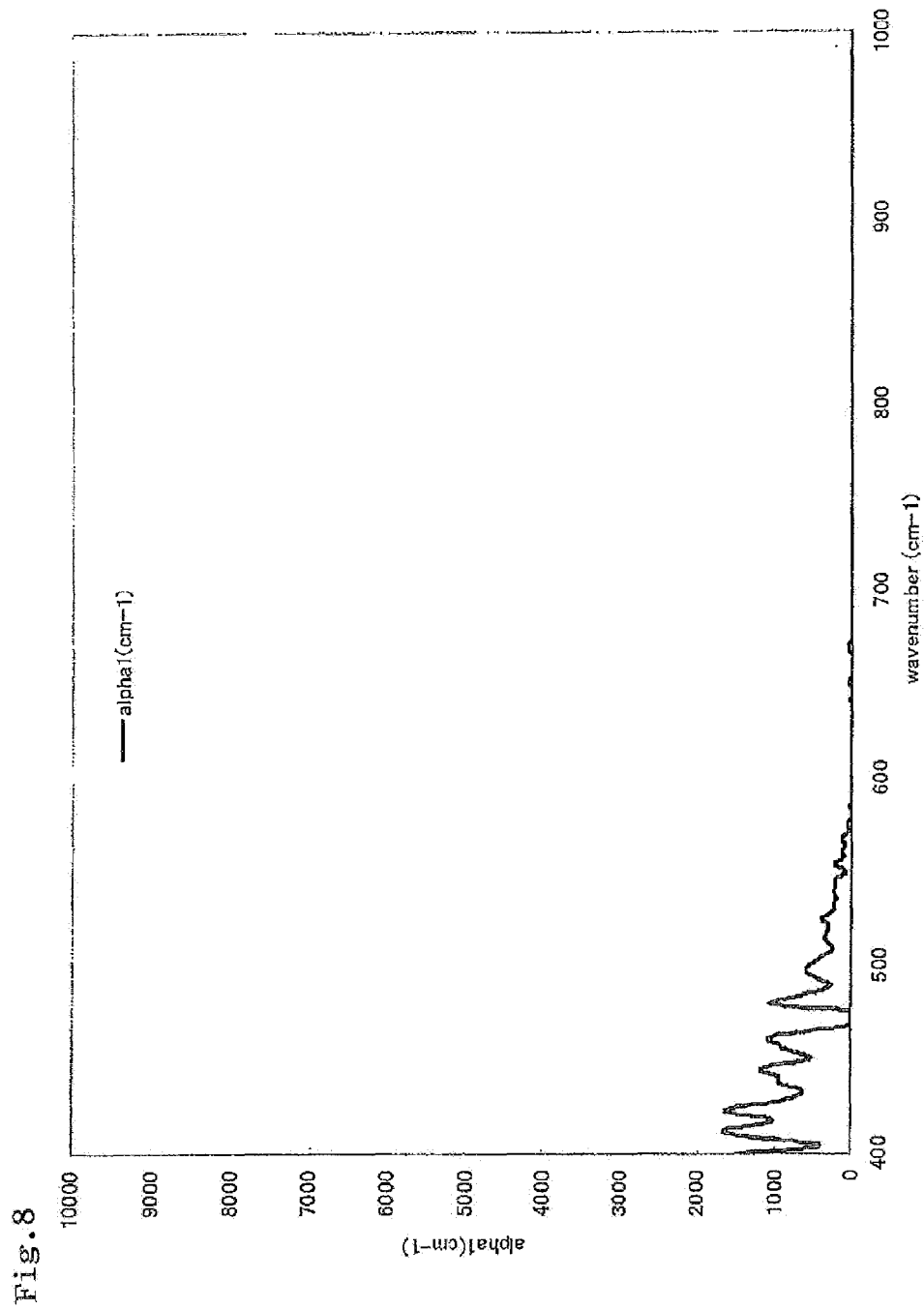
FIG. 8 illustrates an infrared-absorption spectrum of a crystalline germanium photoelectric conversion layer of Example 2.

As shown in FIG. 8, although the infrared-absorption spectrum was measured in the same manner as in Example 1, no absorption peaks were observed at wave numbers of 935 cm$^{-1}$ and 960 cm$^{-1}$.

As shown in Table 1, the output characteristics of the photoelectric converter of Example 2 were measured in the same manner as in Example 1; thus, a Voc of 0.22 V, a Jsc of 33.2 mA/cm$^2$, an FF of 0.52 and an Eff of 3.8% were obtained. The quantum efficiency at a wavelength of 1300 nm was 10.5%.

Summary of Examples 1 and 2 and Comparative Example 1

In Example 2, no absorption peaks were observed at infrared rays of 935 cm$^{-1}$ and 960 cm$^{-1}$, the quantum efficiency of long wavelengths had a high value exceeding 10%, and the Jsc had a high value exceeding 30 mA/cm$^2$. It is considered that the reason why the Eff was slightly lower than that of Example 1 is because diffusion of impurities occurred between the p-type layer and the crystalline germanium layer due to a high film-deposition temperature caused by the reduction in Voc and FF. In each of Examples 1 and 2 and Comparative Example 1, the Raman scattering spectrum of the crystalline germanium layer indicated a crystallization, and no remarkable difference was confirmed. In contrast, with respect to the infrared-absorption peaks at 935 cm$^{-1}$ and 960 cm$^{-1}$ and (220)/(111) peak intensity ratio of the X-ray diffraction, remarkable differences were observed; thus, it was found that upon determining the quality of the crystalline germanium semiconductor, these could be effectively used as determination indexes. Moreover, in comparison with a state where the formation temperature of the crystalline germanium semiconductor was 200° C., the crystalline germanium semiconductor had a low absorption coefficient at each of wave numbers 935 cm$^{-1}$ and 960 cm$^{-1}$ in the cases of 300° C. and 400° C., thereby making it possible to enhance the characteristics of the thin-film photoelectric converter.

Example 3

As Example 3, a single-junction thin-film photoelectric converter similar to that of Example 1 was manufactured. The converter of Example 3 was manufactured in the same manner as in Example 1, except for three points, that is, (1) the crystalline germanium photoelectric conversion layer of FIG. 1 was formed at 200° C., (2) the flow ratio of $H_2$/GeH$_4$ was increased to 500 times, and (3) the high-frequency power density was set to 1100 mW/cm$^2$.

An absorption coefficient at a wavelength of 1300 nm, measured in the same manner as in Example 1, was 8700 cm$^{-1}$, which exhibited a high absorption coefficient relative to light with long wavelengths. Peaks in (111), (220), and (311) orientations were observed in an X-ray diffraction spectrum, so that its crystallization state was confirmed. The peak intensity ratio of (220)/(111) was 2.5. The crystal grain size found by a half-value width of the (220) peak was 40 nm. A sharp peak in a TO mode of a crystal Ge—Ge bond was observed near 300 cm$^{-1}$ in a Raman scattering spectrum, thereby indicating a crystallization.

Figure 9:
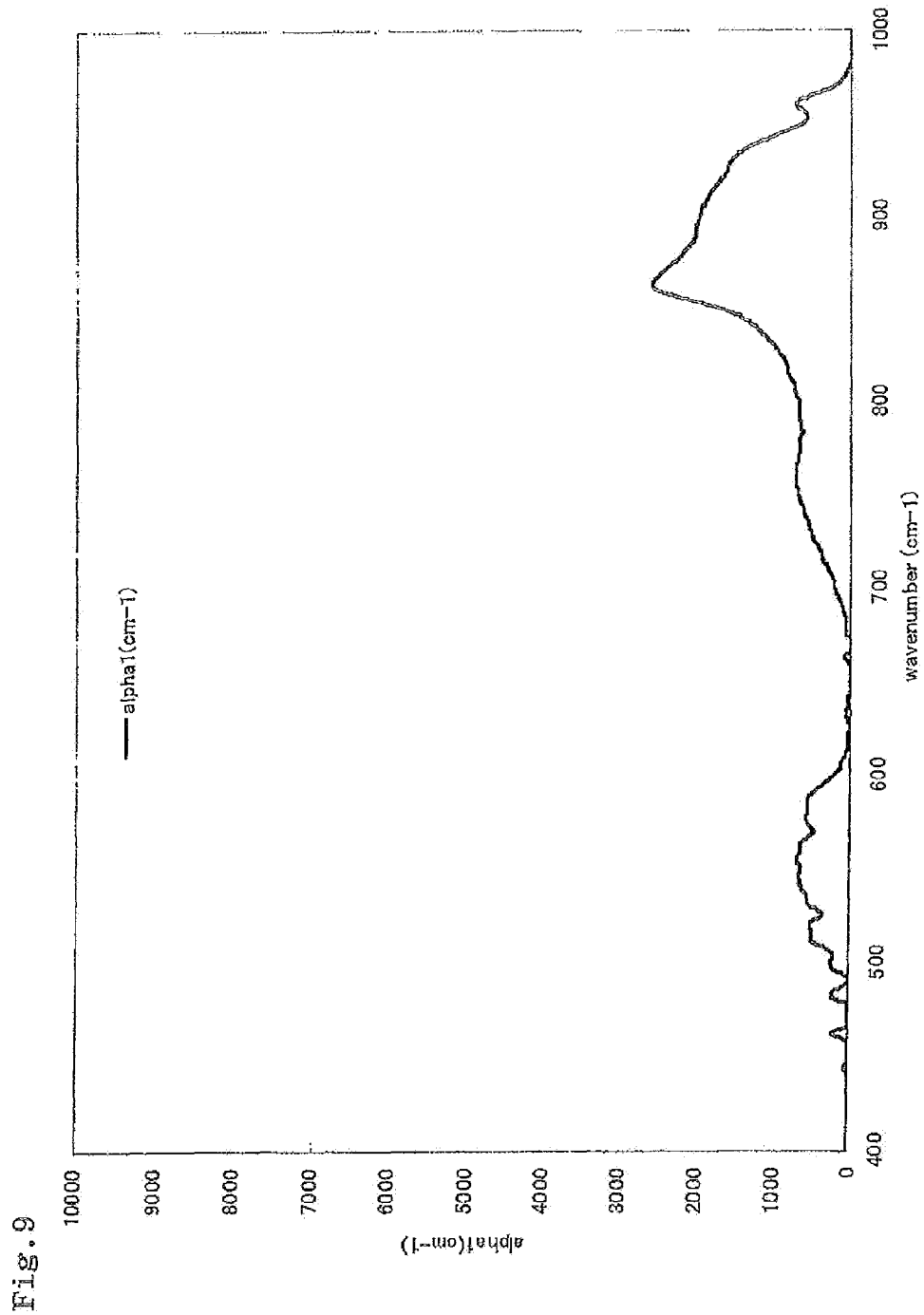
FIG. 9 illustrates an infrared-absorption spectrum of a crystalline germanium photoelectric conversion layer of Example 3.

FIG. 9 shows an infrared-absorption spectrum measured in the same manner as in Example 1. The absorption coefficients of absorption peaks at wave numbers of 935 cm$^{-1}$ and 960 cm$^{-1}$ were 1460 cm$^{-1}$ and 720 cm$^{-1}$, respectively.

As shown in Table 2, the output characteristics of the photoelectric converter of Example 3 were measured in the same manner as in Example 1; thus, a Voc of 0.26 V, a Jsc of 33.7 mA/cm$^2$, an FF of 0.55 and an Eff of 4.8% were obtained. The quantum efficiency at a wavelength of 1300 nm was 8.5%.

TABLE 2

| | Substrate Temperature (° C.) | High-frequency Power Density (Mw/cm$^2$) | Voc (V) | Jsc (mA/cm$^2$) | FF | Eff (%) | Quantum Efficiency at Wavelength of 1300 nm (%) | Absorption Coefficient of Infrared-Absorption Peak | |
|---|---|---|---|---|---|---|---|---|---|
| | | | | | | | | 935 cm$^{-1}$ (cm$^{-1}$) | 960 cm$^{-1}$ (cm$^{-1}$) |
| Comparative Example 2 | 200 | 300 | 0.18 | 20.3 | 0.15 | 0.55 | 0.6 | 6300 | 3700 |
| Example 6 | 200 | 550 | 0.22 | 30.1 | 0.49 | 3.2 | 6.5 | 5350 | 3200 |
| Example 7 | 200 | 850 | 0.24 | 31.3 | 0.52 | 3.9 | 7 | 2840 | 1390 |
| Example 3 | 200 | 1100 | 0.26 | 33.7 | 0.55 | 4.8 | 8.5 | 1460 | 720 |
| Example 8 | 200 | 1400 | 0.25 | 34.1 | 0.54 | 4.6 | 10 | 340 | 170 |

Comparative Example 2

As Comparative Example 2, a single-junction thin-film photoelectric converter similar to that of Example 3 was manufactured. The converter of Comparative Example 2 was manufactured in the same manner as in Example 3, except that the crystalline germanium photoelectric conversion layer of FIG. 1 was revised so as to have a high-frequency power density of 300 mW/cm$^2$.

An absorption coefficient at a wavelength of 1300 nm, measured in the same manner as in Example 1, was 640 cm$^{-1}$, so that in Comparative Example 2, the absorption coefficient of light with long wavelengths was lower than that of Example 3 by 1 digit or more. With respect to the X-ray diffraction spectrum, no peaks were observed in any of (111), (220), and (311) orientations so that its amorphous state was confirmed. No peak intensity ratio of (220)/(111) was measured. With respect to the Raman scattering spectrum, a moderate peak in a TO mode of an amorphous Ge—Ge bond was observed near 280 cm$^{-1}$, thereby indicating an amorphous state.

Figure 10:
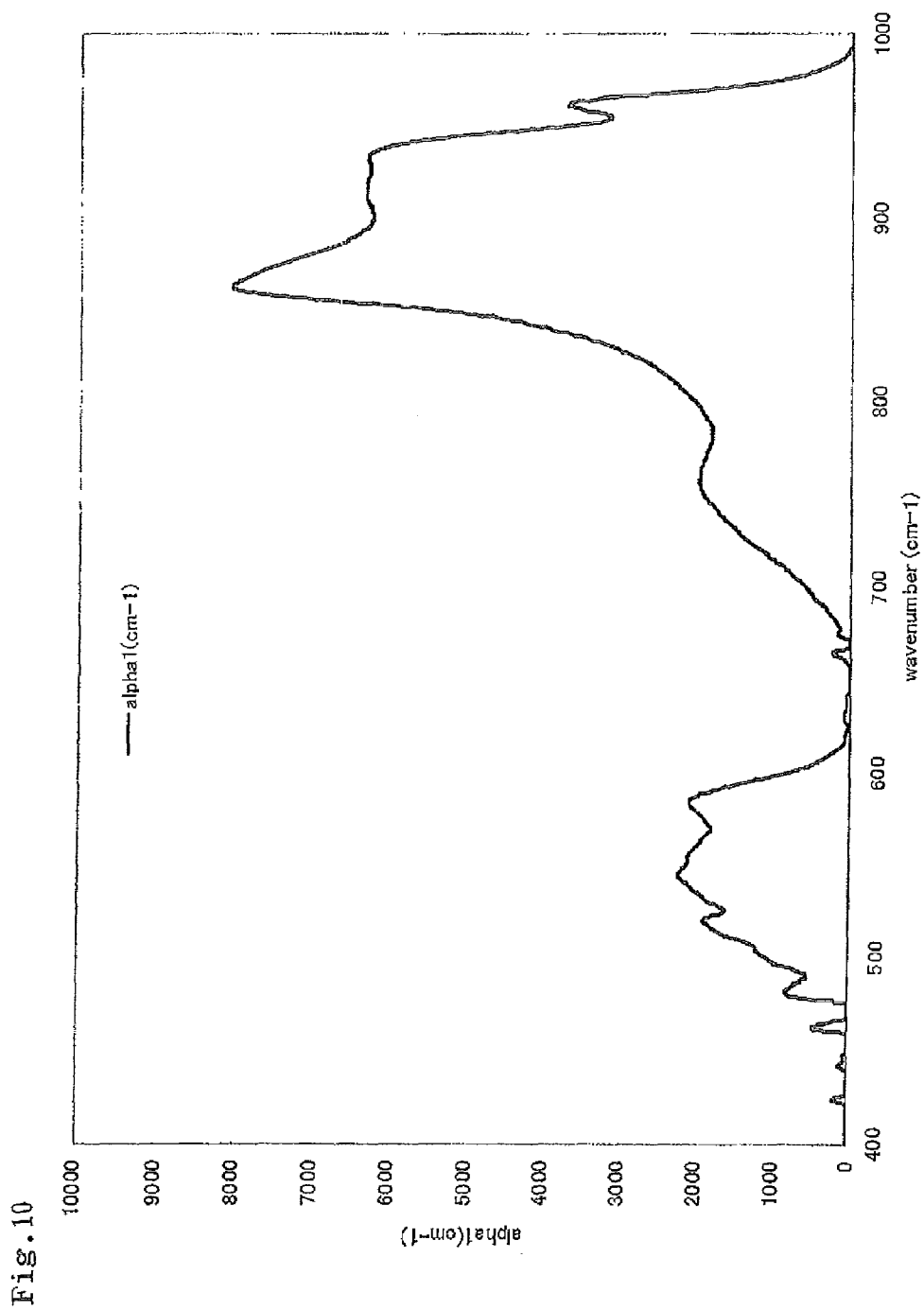
FIG. 10 illustrates an infrared-absorption spectrum of a crystalline germanium photoelectric conversion layer of Comparative Example 2.

An infrared-absorption spectrum measured in the same manner as in Example 1 is shown in FIG. 10. The absorption coefficients of the absorption peaks at wave numbers of 935 cm$^{-1}$ and 960 cm$^{-1}$ were 6300 cm$^{-1}$ and 3700 cm$^{-1}$, respectively.

As shown in Table 2, the output characteristics of the photoelectric converter of Comparative Example 2 were measured in the same manner as in Example 1; thus, a Voc of 0.18 V, a Jsc of 20.3 mA/cm$^2$, an FF of 0.15 and an Eff of 0.55% were obtained. The quantum efficiency at a wavelength of 1300 nm was 0.6%.

Summary of Example 3 and Comparative Example 2

In Example 3, although crystalline germanium was produced at a low substrate temperature of 200° C., the absorption coefficient of an infrared-absorption peak at the wave number of 935 cm$^{-1}$ became less than 6000 cm$^{-1}$ by increasing the high-frequency power density to 1100 mW/cm$^2$ so that characteristics of the thin-film photoelectric converter were improved. The quantum efficiency at a wavelength of 1300 nm reached 8.5% so that the long wavelength light could be utilized, and the Jsc had a high value exceeding 30 mA/cm$^2$.

Examples 4 and 5

As Examples 4 and 5, a single-junction thin-film photoelectric converter similar to that of Example 1 was manufactured. The same manufacturing processes as those of Example 1 were carried out except that the crystalline germanium photoelectric conversion layer of FIG. 1 was formed at 250° C. in Example 4 and that it was formed at 350° C. in Example 5. Further a crystalline germanium layer was formed on the crystalline silicon substrate under the same conditions as those of the photoelectric conversion layer of the thin-film photoelectric converter of Example 1, and an infrared-absorption spectrum was measured by FTIR.

Examples 1, 2, 4, and 5, and Comparative Example 1

With respect to Examples 1, 2, 4 and 5 and Comparative Example 1, the absorption coefficient of the infrared-absorption peak and characteristics of each photoelectric converter relative to the film-deposition temperature of the crystalline germanium photoelectric conversion layer are shown in Table 1.

Figure 11:
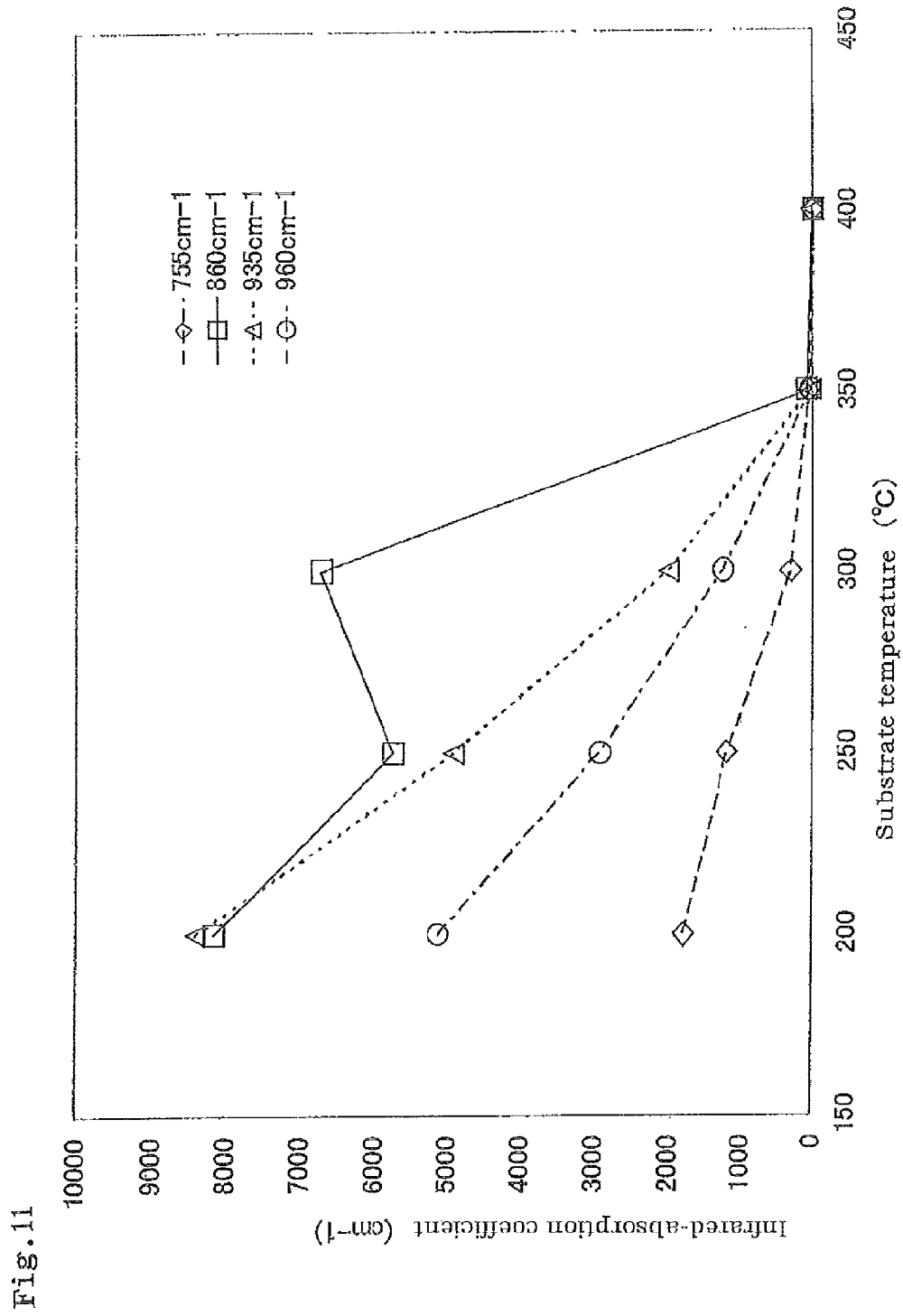
FIG. 11 shows an absorption coefficient at a peak of each of wave numbers 755 $cm^{-1}$, 860 $cm^{-1}$, 935 $cm^{-1}$ and 960 $cm^{-1}$, measured by FTIR relative to a substrate temperature upon forming a crystalline germanium photoelectric conversion layer.

FIG. 11 shows an absorption coefficient at a peak of each of wave numbers 755 cm$^{-1}$, 860 cm$^{-1}$, 935 cm$^{-1}$ and 960 cm$^{-1}$, measured by FTIR relative to a substrate temperature upon forming a crystalline germanium photoelectric conversion layer. The absorption coefficient at a peak of each of wave numbers 755 cm$^{-1}$, 935 cm$^{-1}$ and 960 cm$^{-1}$, is monotonically reduced relative to the increase in the substrate temperature, and reaches less than 500 cm$^{-1}$ at 350° C. or more. At the substrate temperature of 250° C. or more, the absorption coefficient at the peak of 935 cm$^{-1}$ becomes less than 6000 cm$^{-1}$, the absorption coefficient at the peak of 960 cm$^{-1}$ becomes less than 4000 cm$^{-1}$, and the absorption coefficient at the peak of 755 cm$^{-1}$ becomes less than 1500 cm$^{-1}$. In contrast, the absorption coefficient at the peak of 860 cm$^{-1}$ has a minimum value at 250° C. and a maximum value at 300° C., and becomes less than 500 cm$^{-1}$ at 350° C. or more, relative to the increase in the substrate temperature.

Figure 12:
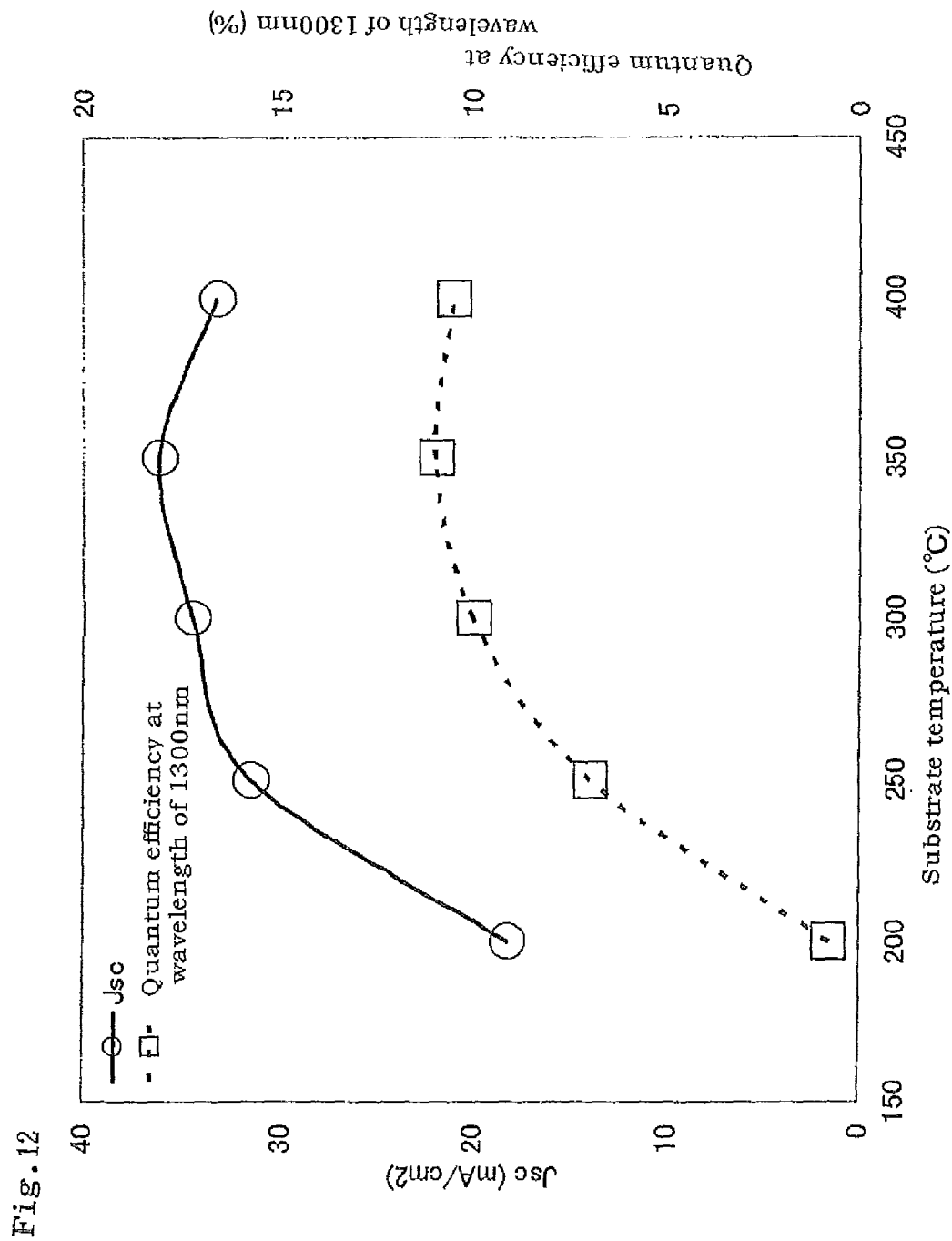
FIG. 12 shows a short circuit current density Jsc and a quantum efficiency at a wavelength of 1300 nm of a thin-film photoelectric converter relative to a substrate temperature upon forming a crystalline germanium photoelectric conversion layer.

FIG. 12 shows the Jsc and quantum efficiency at a wavelength of 1300 nm of a thin-film photoelectric converter relative to a substrate temperature upon forming a crystalline germanium photoelectric conversion layer. The Jsc and quantum efficiency abruptly increase from the substrate temperature of 200° C. to 250° C., and at temperatures above this range, these tend to be brought into saturated states. At the substrate temperature of 250° C. or more, the Jsc becomes mA/cm$^2$ or more, and the quantum efficiency at a wavelength of 1300 nm has a high value exceeding 5%.

Figure 13:
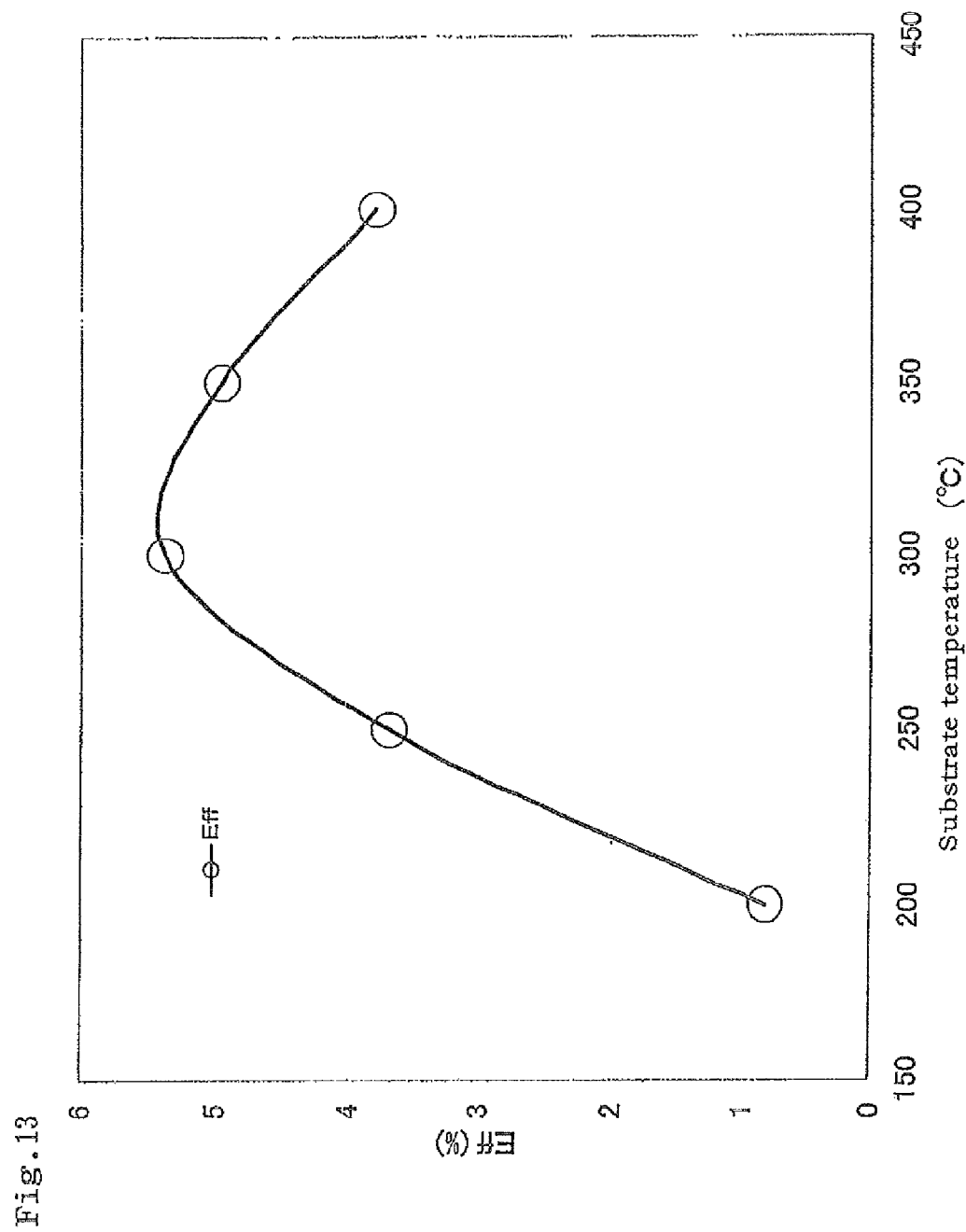
FIG. 13 shows a conversion efficiency Eff of a thin-film photoelectric converter relative to a substrate temperature upon forming a crystalline germanium photoelectric conversion layer.

FIG. 13 shows the Eff of a thin-film photoelectric converter relative to the substrate temperature upon forming a crystalline germanium photoelectric conversion layer. The Eff exhibits a value of 3% or more at 250° C. or more, and has a maximum value at 300° C.

Figure 14:
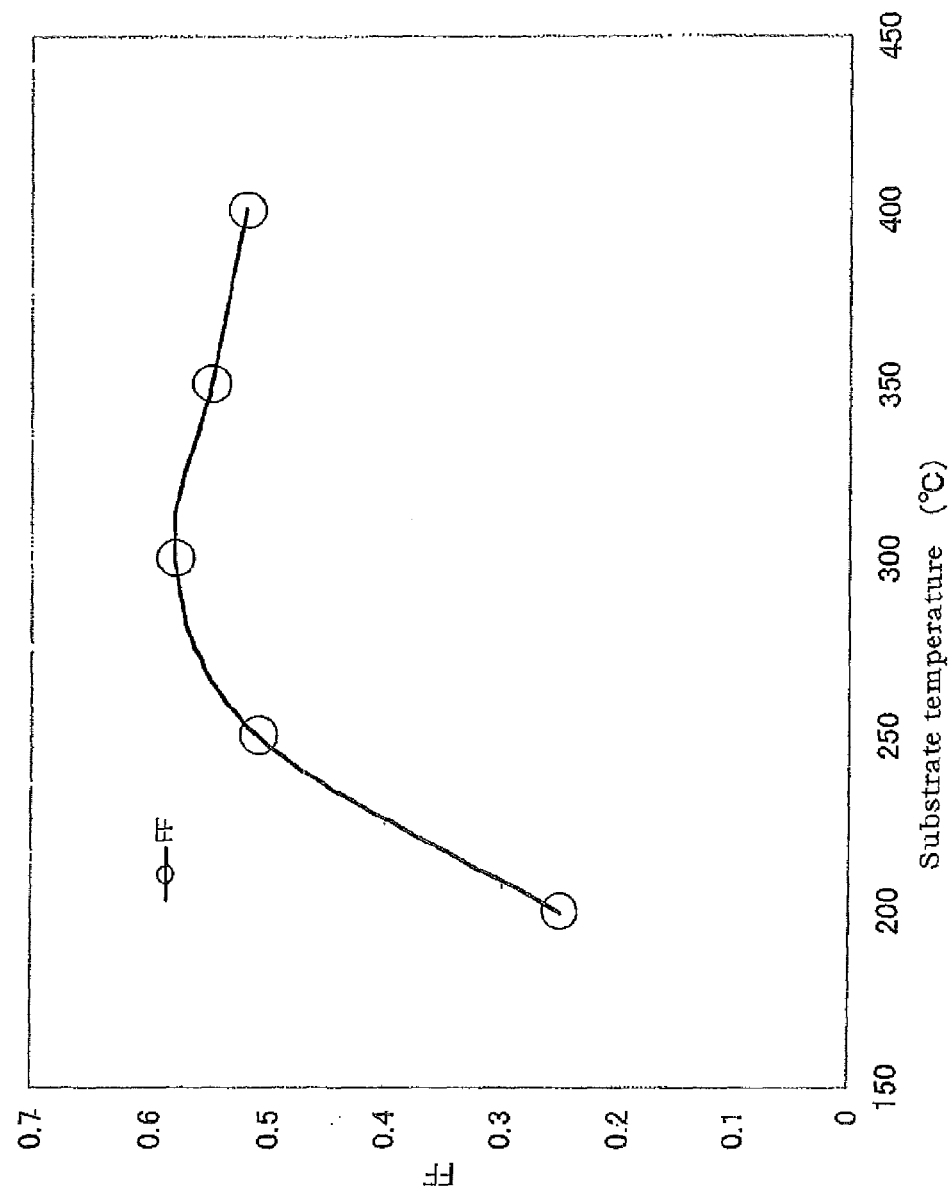
FIG. 14 shows a fill factor FF of a thin-film photoelectric converter relative to a substrate temperature upon forming a crystalline germanium photoelectric conversion layer.

FIG. 14 shows the FF of a thin-film photoelectric converter relative to the substrate temperature upon forming a crystalline germanium photoelectric conversion layer. The FF abruptly increases from the substrate temperature of 200° C. to 250° C., and tends to be brought into a saturated state at temperatures above this range.

Figure 15:
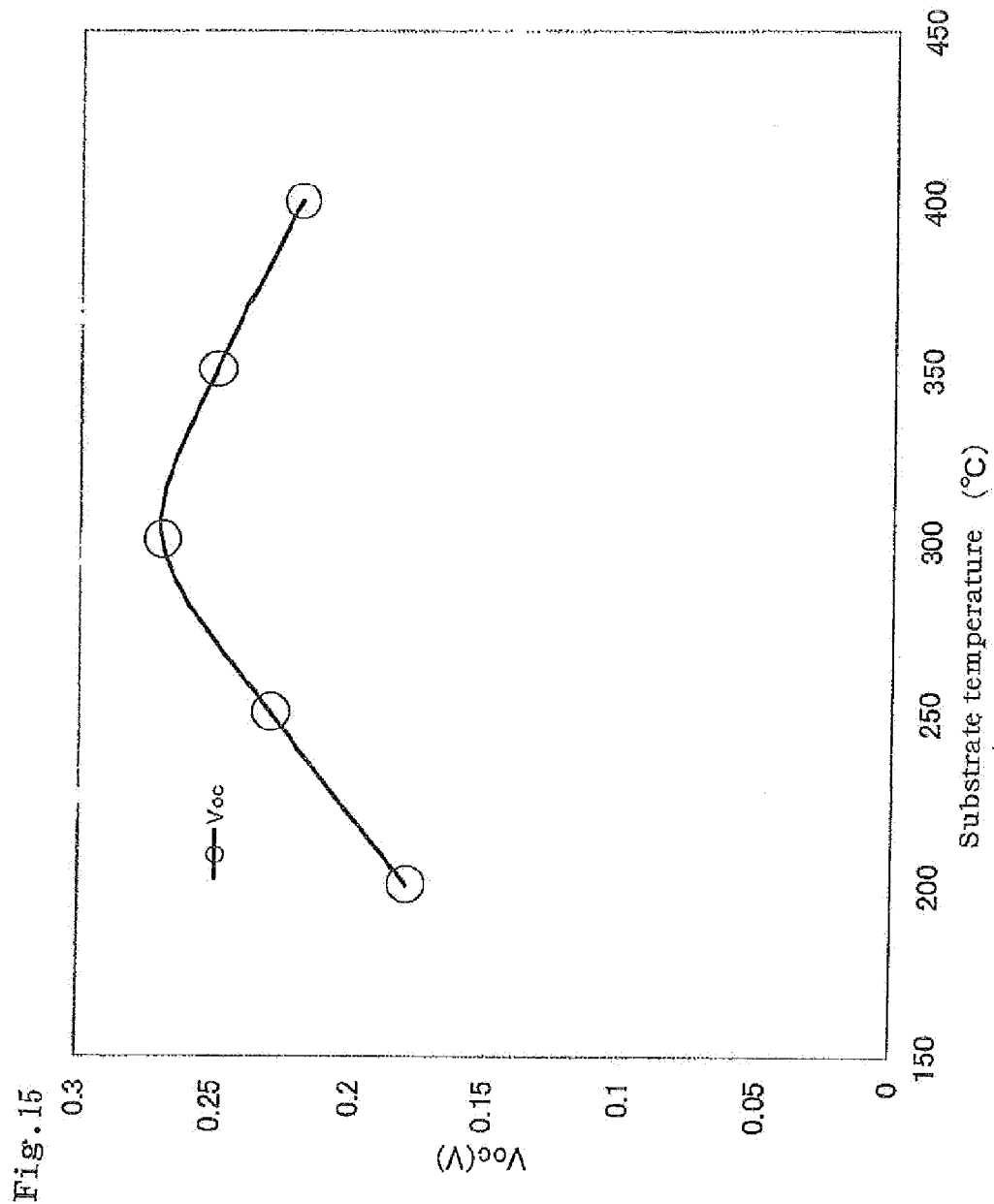
FIG. 15 shows an open circuit voltage Voc of a thin-film photoelectric converter relative to a substrate temperature upon forming a crystalline germanium photoelectric conversion layer.

FIG. 15 illustrates the Voc of a thin-film photoelectric converter relative to the substrate temperature upon forming a crystalline germanium photoelectric conversion layer. The Voc has a maximum value at the substrate temperature of 300° C.

As described above, in the case where the substrate temperature is 250° C. or more, the absorption coefficient in an infrared-absorption peak at 935±5 cm$^{-1}$ becomes less than 6000 cm$^{-1}$, and the Jsc becomes 30 mA/cm$^2$ or more, a quantum efficiency at a wavelength of 1300 nm exhibits a value exceeding 5%, and thus it is found that light having long wavelengths can be utilized to improve the characteristics of the thin-film photoelectric converter.

Examples 6, 7, and 8

As Examples 6, 7 and 8, a single-junction thin-film photoelectric converter similar to that of Example 3 was manufactured, respectively. The same manufacturing processes as those of Example 3 were carried out except that, upon forming the crystalline germanium photoelectric conversion layer of FIG. 1, the high-frequency power density was set to 550 mW/cm$^2$ in Example 6, 850 mW/cm$^2$ in Example 7, and 1400 mW/cm$^2$ in Example 8, respectively. Moreover, a crystalline germanium layer was formed on the crystalline silicon substrate under the same conditions as those of the photoelectric conversion layer of the thin-film photoelectric converter of Example 3, and an infrared-absorption spectrum was measured by FTIR.

Examples 3, 6, 7, and 8, and Comparative Example 2

With respect to Examples 3, 6, 7 and 8 and Comparative Example 2, the absorption coefficient of the infrared-absorption peak and characteristics of each photoelectric converter relative to the high-frequency power density of the crystalline germanium photoelectric conversion layer are shown in Table 2.

Figure 16:
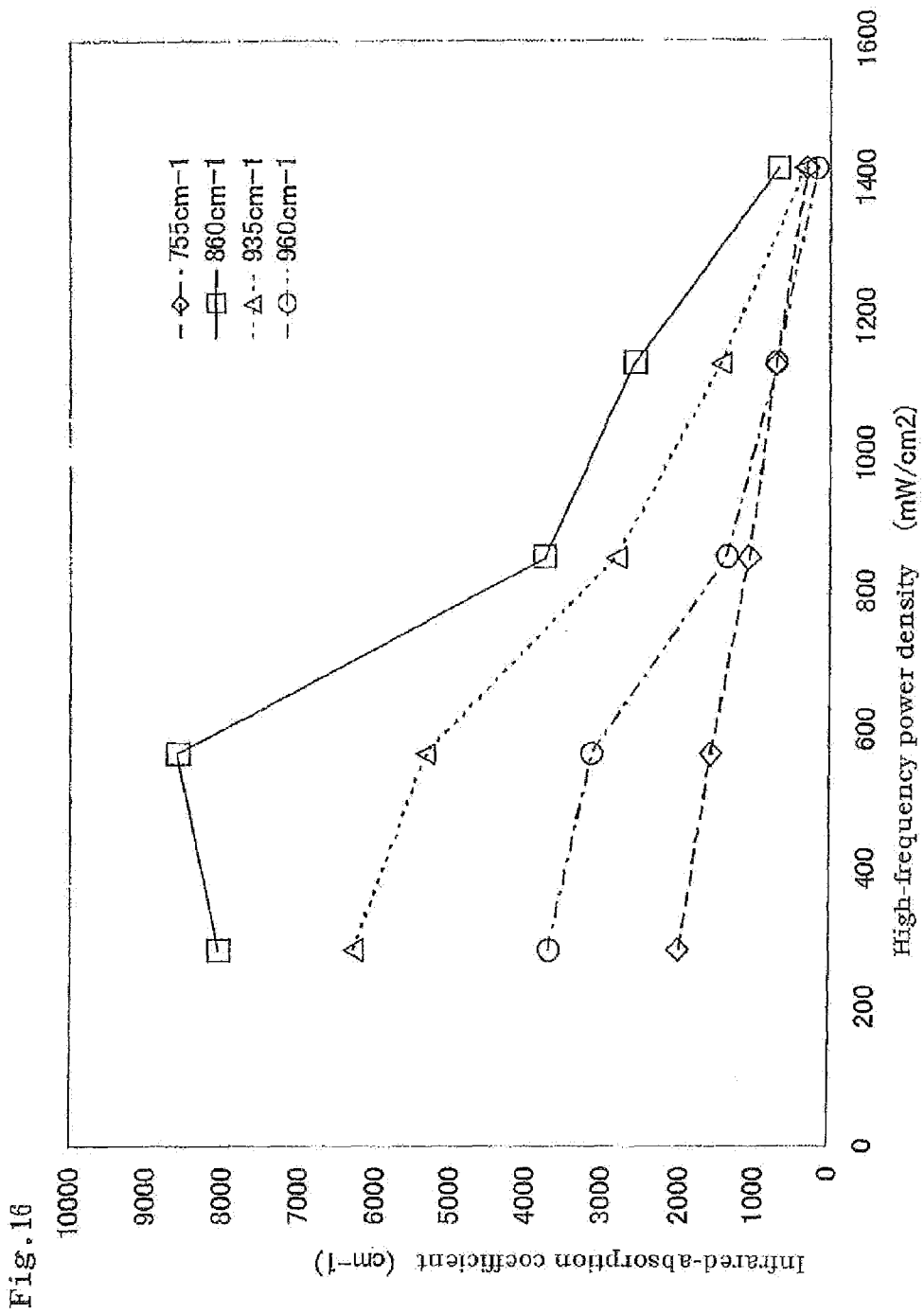
FIG. 16 shows an absorption coefficient at a peak of each of wave numbers 755 $cm^{-1}$, 860 $cm^{-1}$, 935 $cm^{-1}$ and 960 $cm^{-1}$, measured by FTIR relative to a high-frequency power density upon forming a crystalline germanium photoelectric conversion layer.

FIG. 16 shows an absorption coefficient at a peak of each of wave numbers 755 cm$^{-1}$, 860 cm$^{-1}$, 935 cm$^{-1}$ and 960 cm$^{-1}$ measured by FTIR relative to a high-frequency power density upon forming a crystalline germanium photoelectric conversion layer. The absorption coefficient at a peak of each of wave numbers 755 cm$^{-1}$, 935 cm$^{-1}$ and 960 cm$^{-1}$, is monotonically reduced relative to the increase in the high-frequency power density. At the high-frequency power density of 550 mW/cm$^2$ or more, the absorption coefficient at the peak of 935 cm$^{-1}$ becomes less than 6000 cm$^{-1}$, the absorption coefficient at the peak of 960 cm$^{-1}$ becomes less than 4000 cm$^{-1}$, and the absorption coefficient at the peak of 755 cm$^{-1}$ becomes less than 1500 cm$^{-1}$. In contrast, the absorption coefficient at the peak of 860 cm$^{-1}$ has a maximum value at 550 mW/cm$^2$, in response to an increase in the high-frequency power density.

Figure 17:
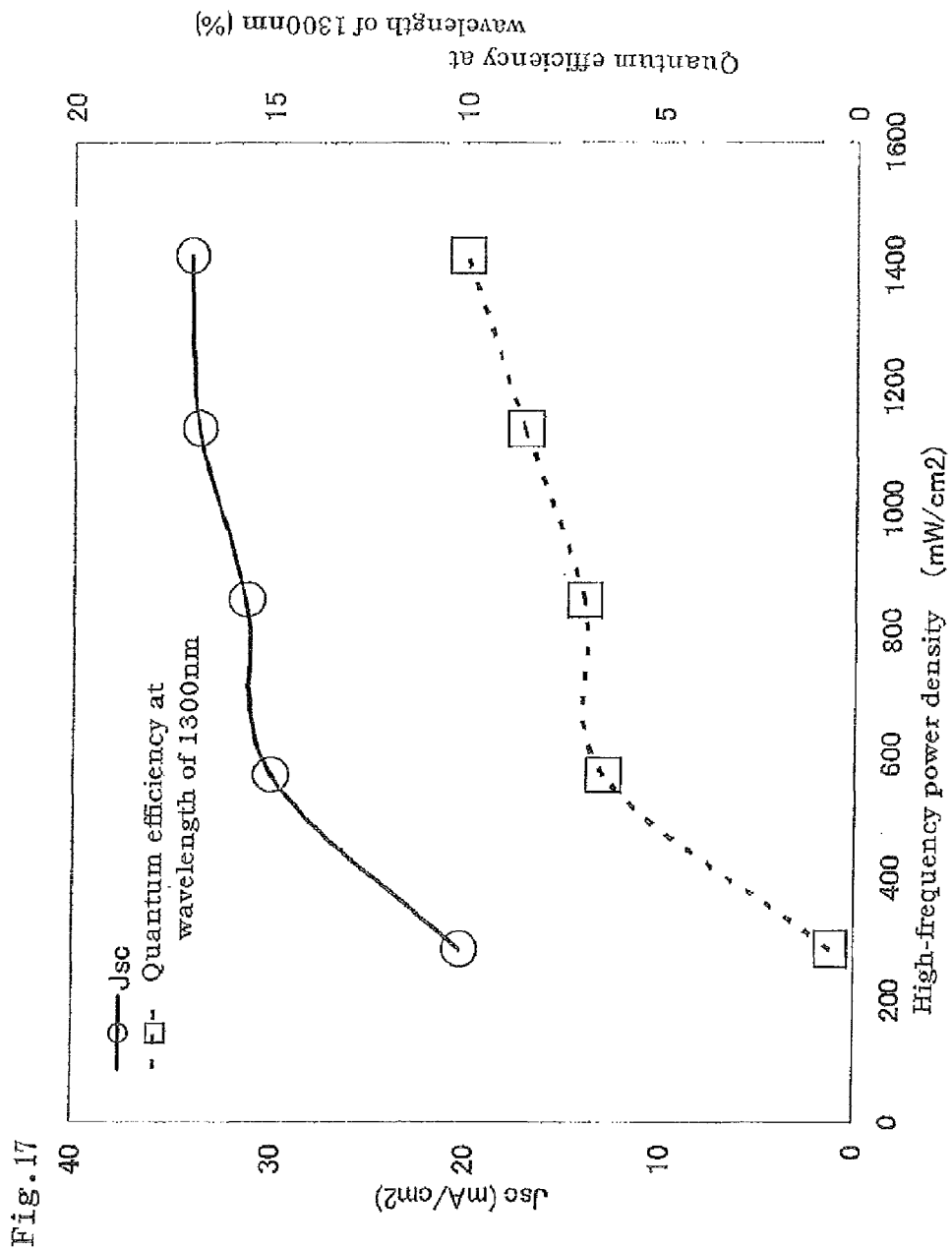
FIG. 17 shows a short circuit current density Jsc and a quantum efficiency at a wavelength of 1300 nm of a thin-film photoelectric converter relative to a high-frequency power density upon forming a crystalline germanium photoelectric conversion layer.

FIG. 17 shows the Jsc and quantum efficiency at a wavelength of 1300 nm of a thin-film photoelectric converter relative to a high-frequency power density upon forming a crystalline germanium photoelectric conversion layer. The Jsc and quantum efficiency abruptly increase when the high-frequency power density is increased from 300 mW/cm$^2$ to 550 mW/cm$^2$, and moderately increase at the high-frequency power density exceeding this range. The Jsc becomes 30 mA/cm$^2$ or more at the high-frequency power density of 550 mW/cm$^2$ or more, and the quantum efficiency at a wavelength of 1300 nm has a high value exceeding 5%.

Figure 18:
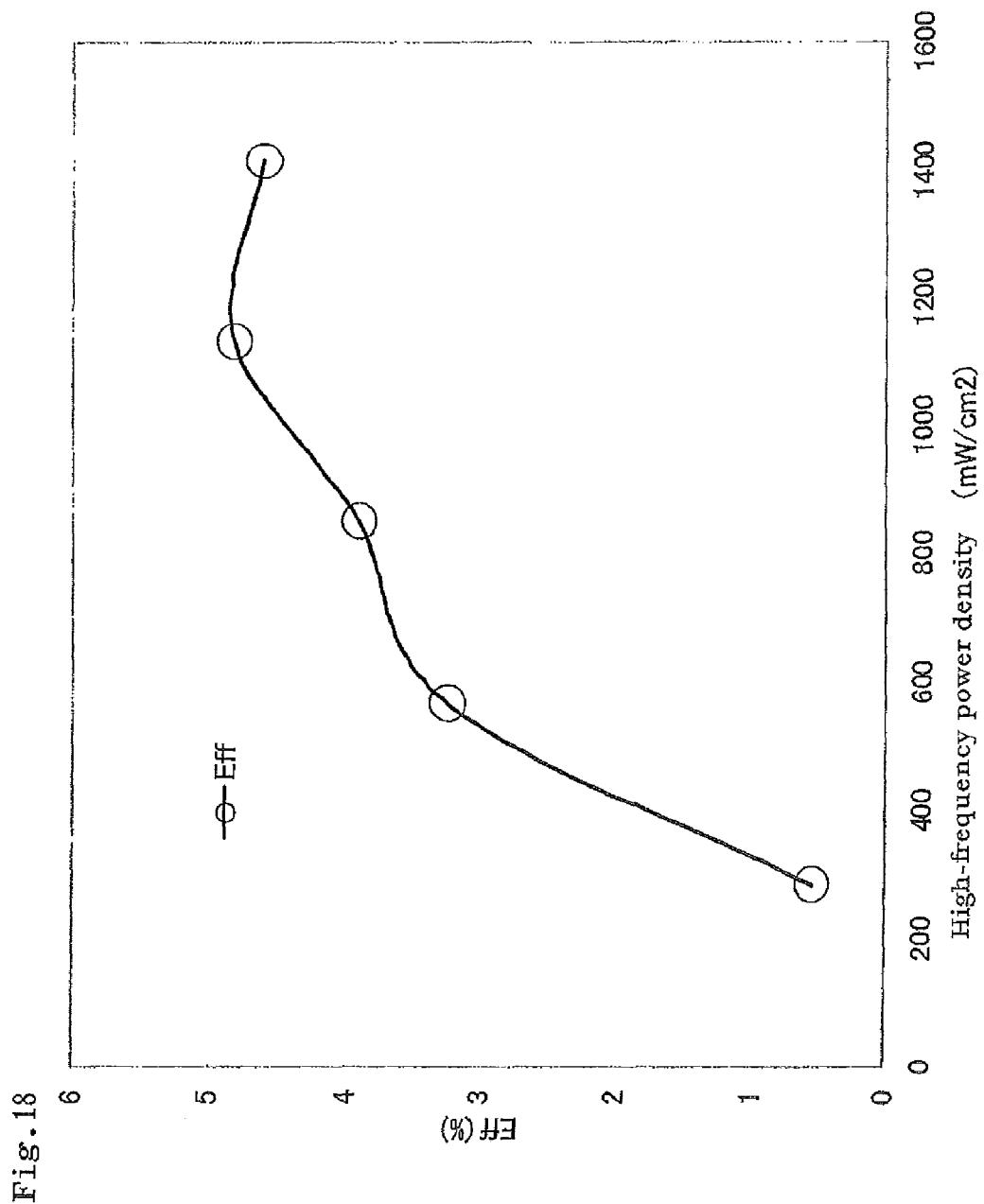
FIG. 18 shows a conversion efficiency Eff of a thin-film photoelectric converter relative to a high-frequency power density upon forming a crystalline germanium photoelectric conversion layer.

FIG. 18 shows the Eff of a thin-film photoelectric converter relative to the high-frequency power density upon forming a crystalline germanium photoelectric conversion layer. The Eff exhibits a value of 3% or more at 550 mW/cm$^2$ or more, and has a maximum value at 1100 mW/cm$^2$.

Figure 19:
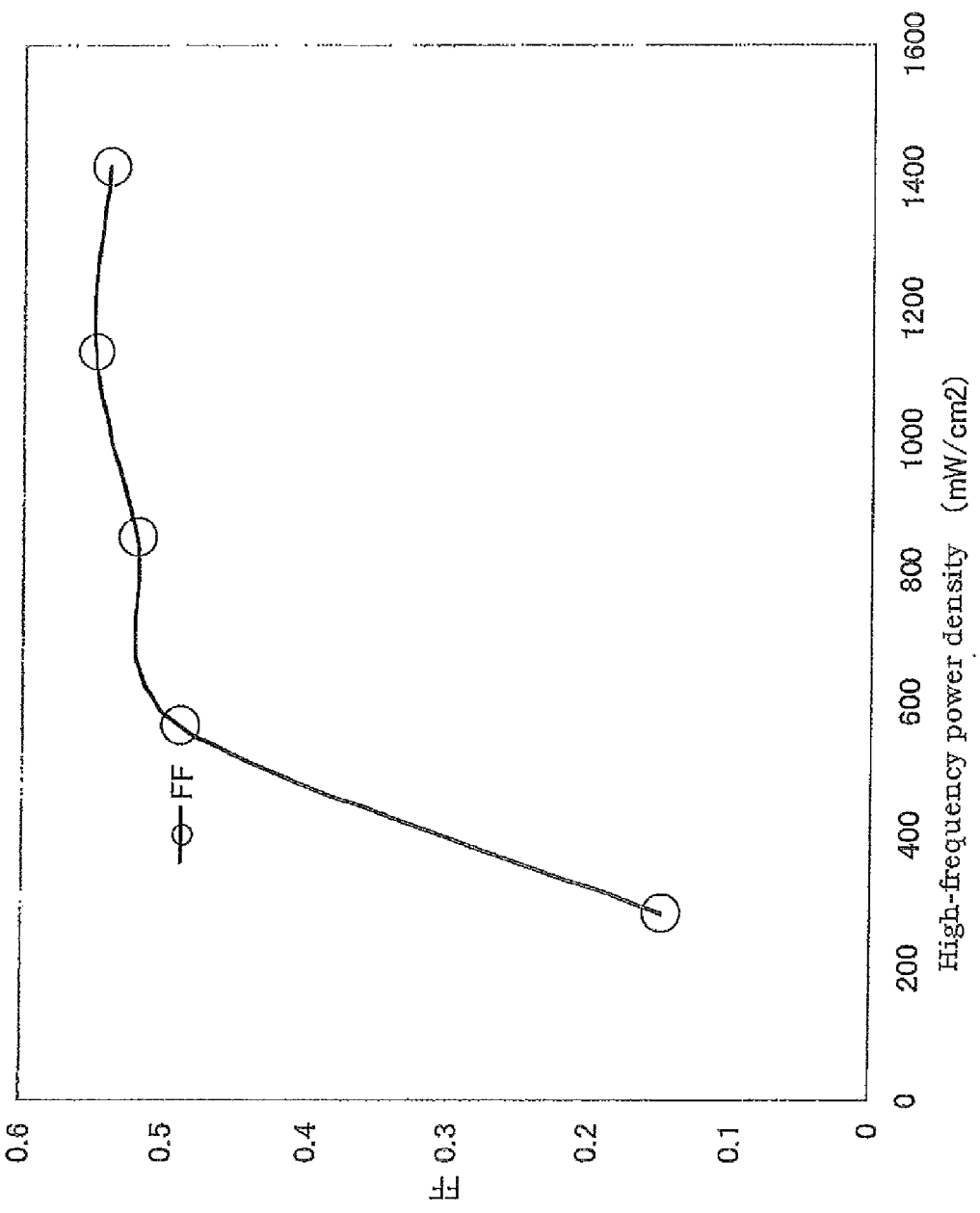
FIG. 19 shows a fill factor FF of a thin-film photoelectric converter relative to a high-frequency power density upon forming a crystalline germanium photoelectric conversion layer.

FIG. 19 shows the FF of a thin-film photoelectric converter relative to the high-frequency power density upon forming a crystalline germanium photoelectric conversion layer. The FF abruptly increases from 300 mW/cm$^2$ to 550 mW/cm$^2$ of the high-frequency power density, and tends to be brought into a saturated state at the high-frequency power density above this range.

Figure 20:
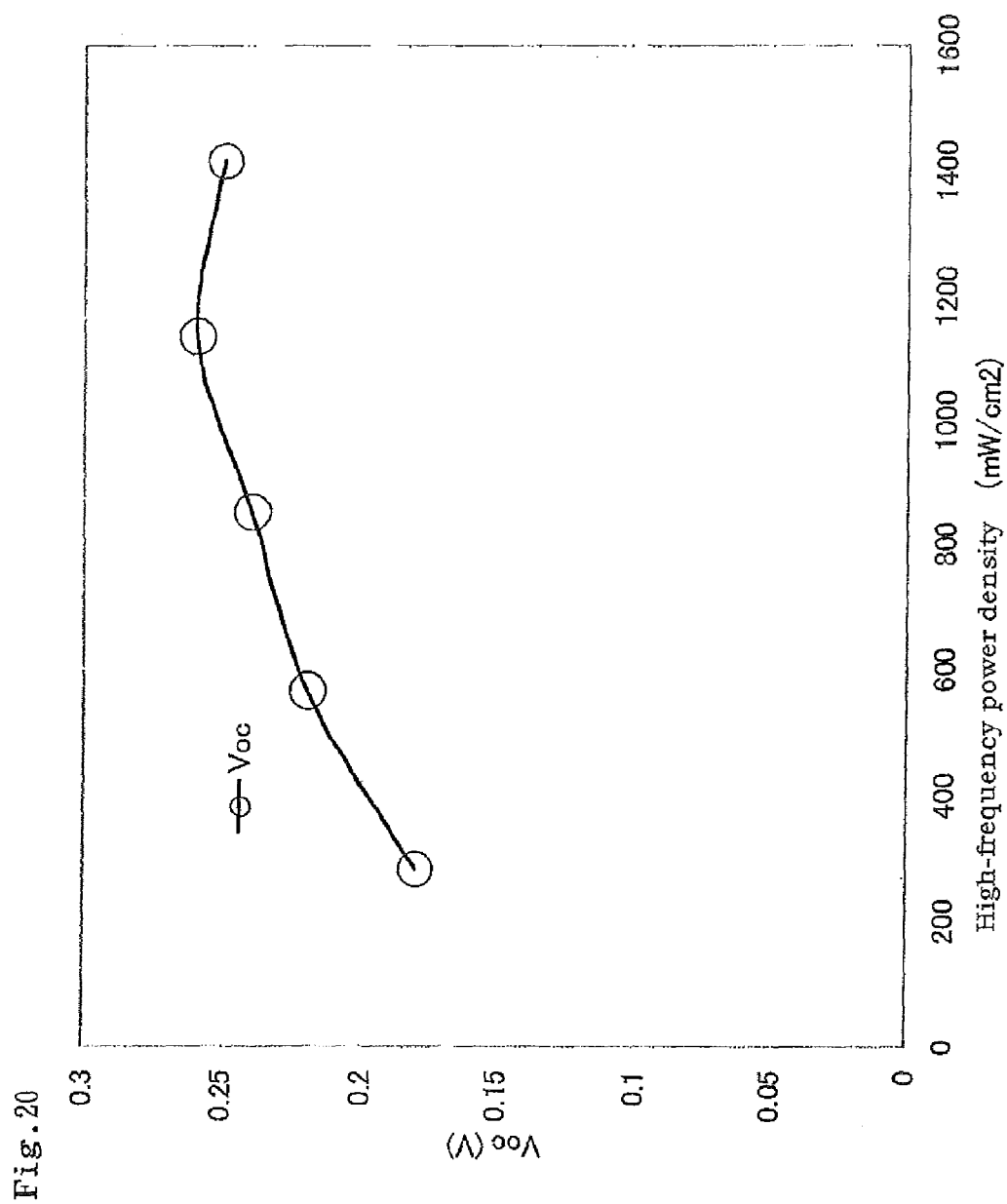
FIG. 20 shows an open circuit voltage Voc of a thin-film photoelectric converter relative to a high-frequency power density upon forming a crystalline germanium photoelectric conversion layer.

FIG. 20 illustrates the Voc of a thin-film photoelectric converter relative to the high-frequency power density upon forming a crystalline germanium photoelectric conversion layer. The Voc has a maximum value at 1100 mW/cm$^2$ of the high-frequency power density.

As described above, even in the case where the substrate temperature is as low as 200° C. upon forming a crystalline germanium photoelectric conversion layer, the absorption coefficient of an infrared-absorption peak of 935 cm$^{-1}$ becomes less than 6000 cm$^{-1}$ under the high-frequency power density of 550 mW/cm$^2$ or more, and the Jsc exhibits a value of 30 mA/cm$^2$ or more, with the quantum efficiency at a wavelength of 1300 nm exhibiting a value exceeding 5%, so that it is found that light having long wavelengths can be utilized to improve the characteristics of the thin-film photoelectric converter.

Examples 1 to 8, and Comparative Examples 1 and 2

With respect to Examples 1 to 8 and Comparative Examples 1 and 2, photoelectric conversion characteristics of a crystalline germanium photoelectric conversion layer relative to the absorption coefficient of an infrared-absorption peak at the wave number of 935 cm$^{-1}$ will be described in the following.

Figure 21:
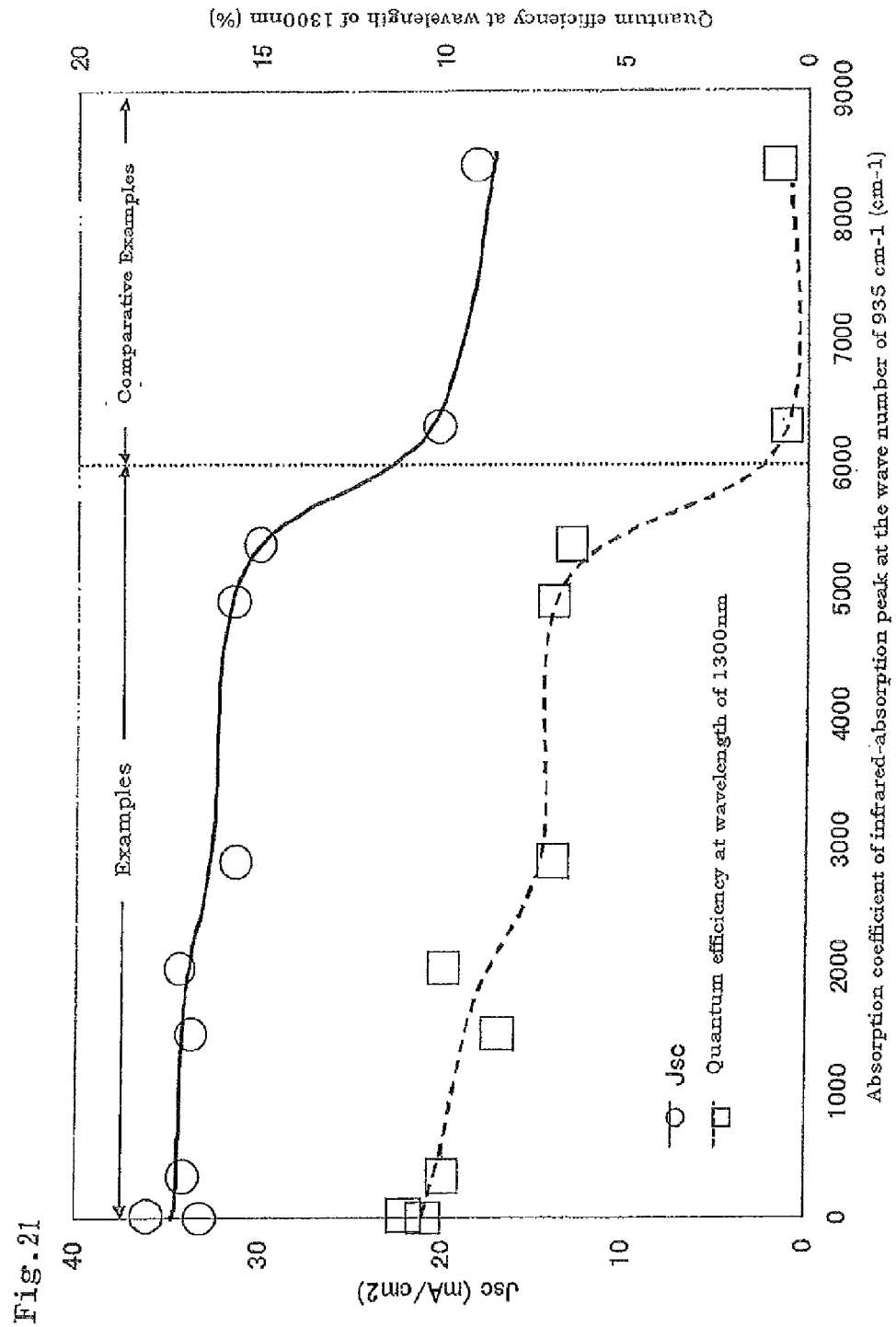
FIG. 21 shows a short circuit current density Jsc and a quantum efficiency at a wavelength of 1300 nm of a thin-film photoelectric converter relative to an absorption coefficient of the infrared-absorption peak at the wave number of 935 $cm^{-1}$ of a crystalline germanium photoelectric conversion layer.

FIG. 21 shows the Jsc and the quantum efficiency at a wavelength of 1300 nm of a thin-film photoelectric converter relative to the absorption coefficient of an infrared-absorption peak at the wave number of 935 cm$^{-1}$. Independent of changes in the substrate temperature and changes in the high-frequency power density, when the absorption coefficient at the wave number of 935 cm$^{-1}$ becomes less than 6000 cm$^{-1}$, the Jsc exhibits a high value of 30 mA/cm$^2$ or more, and the quantum efficiency at a wavelength of 1300 nm also exhibits a high value of 5% or more.

Figure 22:
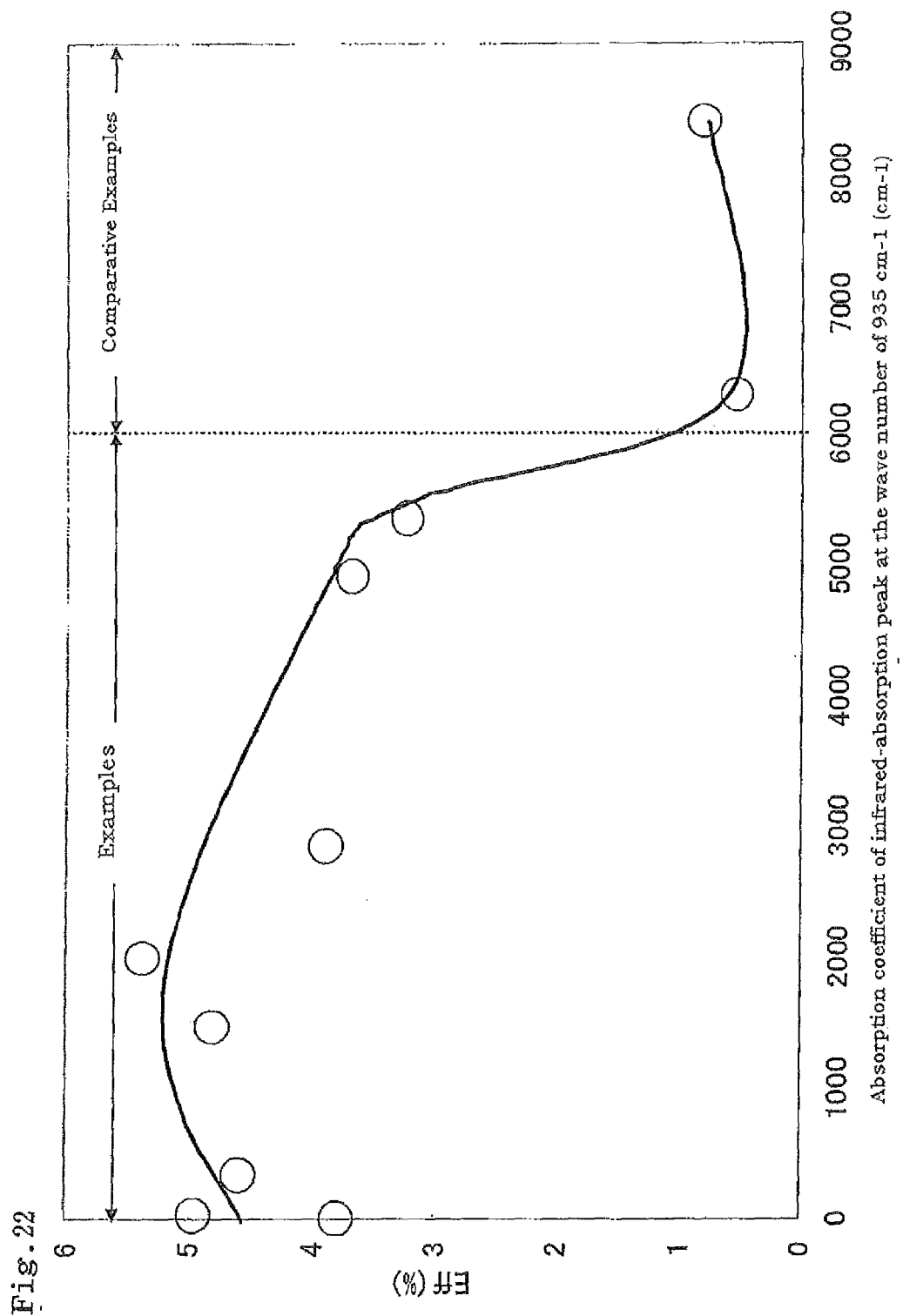
FIG. 22 shows a conversion efficiency Eff of a thin-film photoelectric converter relative to an absorption coefficient of the infrared-absorption peak at the wave number of 935 $cm^{-1}$ of a crystalline germanium photoelectric conversion layer.

FIG. 22 shows the Eff of a thin-film photoelectric converter relative to the absorption coefficient of an infrared-absorption peak at the wave number of 935 cm$^{-1}$. Independent of changes in the substrate temperature and changes in the high-frequency power density, when the absorption coefficient at the wave number of 935 cm$^{-1}$ becomes less than 6000 cm$^{-1}$, the Eff exhibits a high value of 3% or more. Moreover, when the absorption coefficient of the infrared-absorption peak at the wave number of 935±5 cm$^{-1}$ becomes less than 5000 cm$^{-1}$, the Eff exceeds 3.5%, which is more preferable. In the case where the absorption coefficient of an infrared-absorption peak at the wave number of 935±5 cm$^{-1}$ becomes 10 cm$^{-1}$ or more and less than 2500 cm$^{-1}$, this state is further preferable because the Eff exceeds 4.5%.

Figure 23:
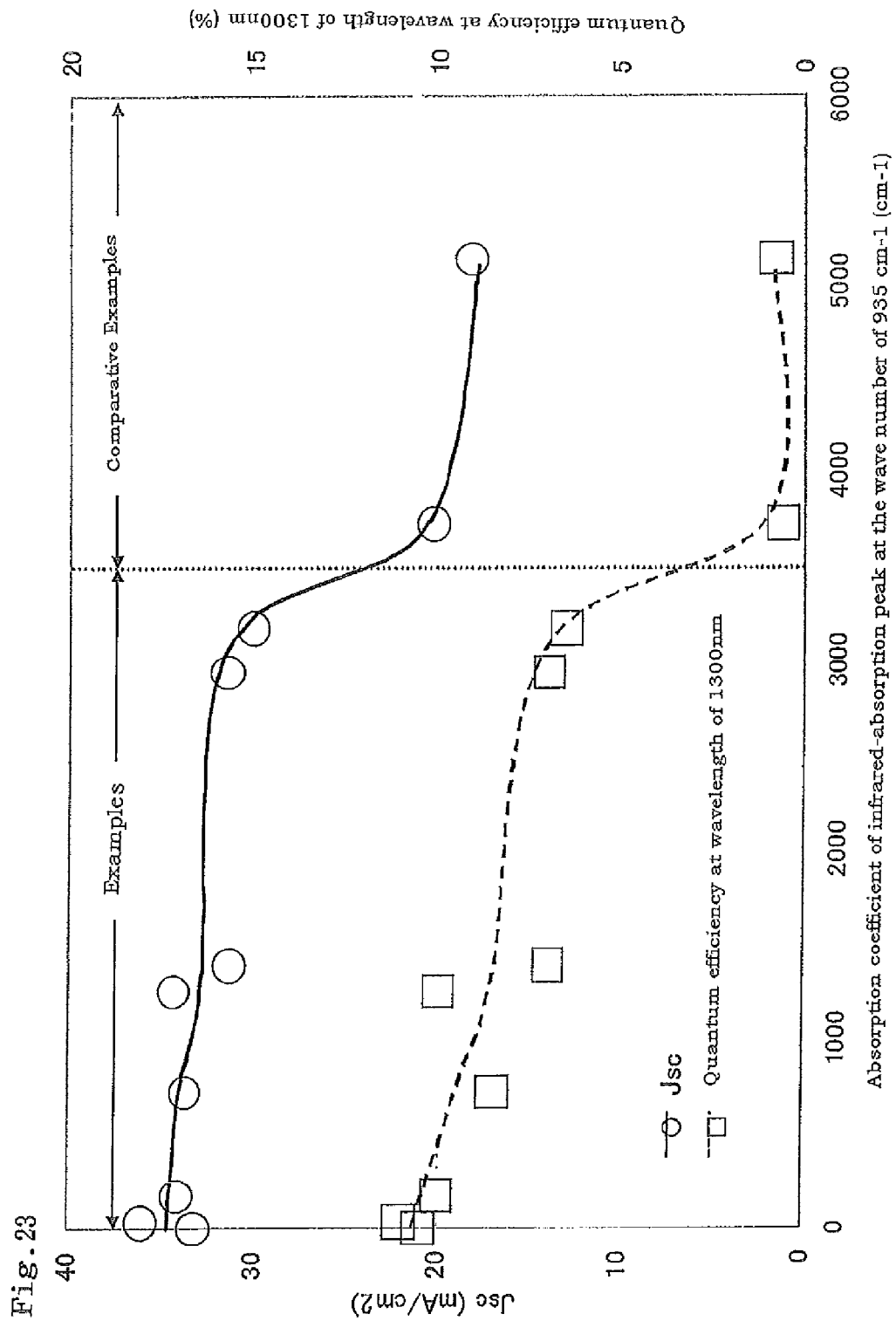
FIG. 23 shows a short circuit current density Jsc and a quantum efficiency at a wavelength of 1300 nm of a thin-film photoelectric converter relative to an absorption coefficient of the infrared-absorption peak at the wave number of 960 $cm^{-1}$ of a crystalline germanium photoelectric conversion layer.

FIG. 23 shows the Jsc and quantum efficiency at a wavelength of 1300 nm of a thin-film photoelectric converter relative to the absorption coefficient of an infrared-absorption peak at the wave number of 960 cm$^{-1}$. Independent of changes in the substrate temperature and changes in the high-frequency power density, when the absorption coefficient at the wave number of 960 cm$^{-1}$ becomes less than 3500 cm$^{-1}$, the Jsc exhibits a high value of 30 mA/cm$^2$ or more, with the quantum efficiency at a wavelength of 1300 nm exhibiting a high value exceeding 5% or more.

Figure 24:
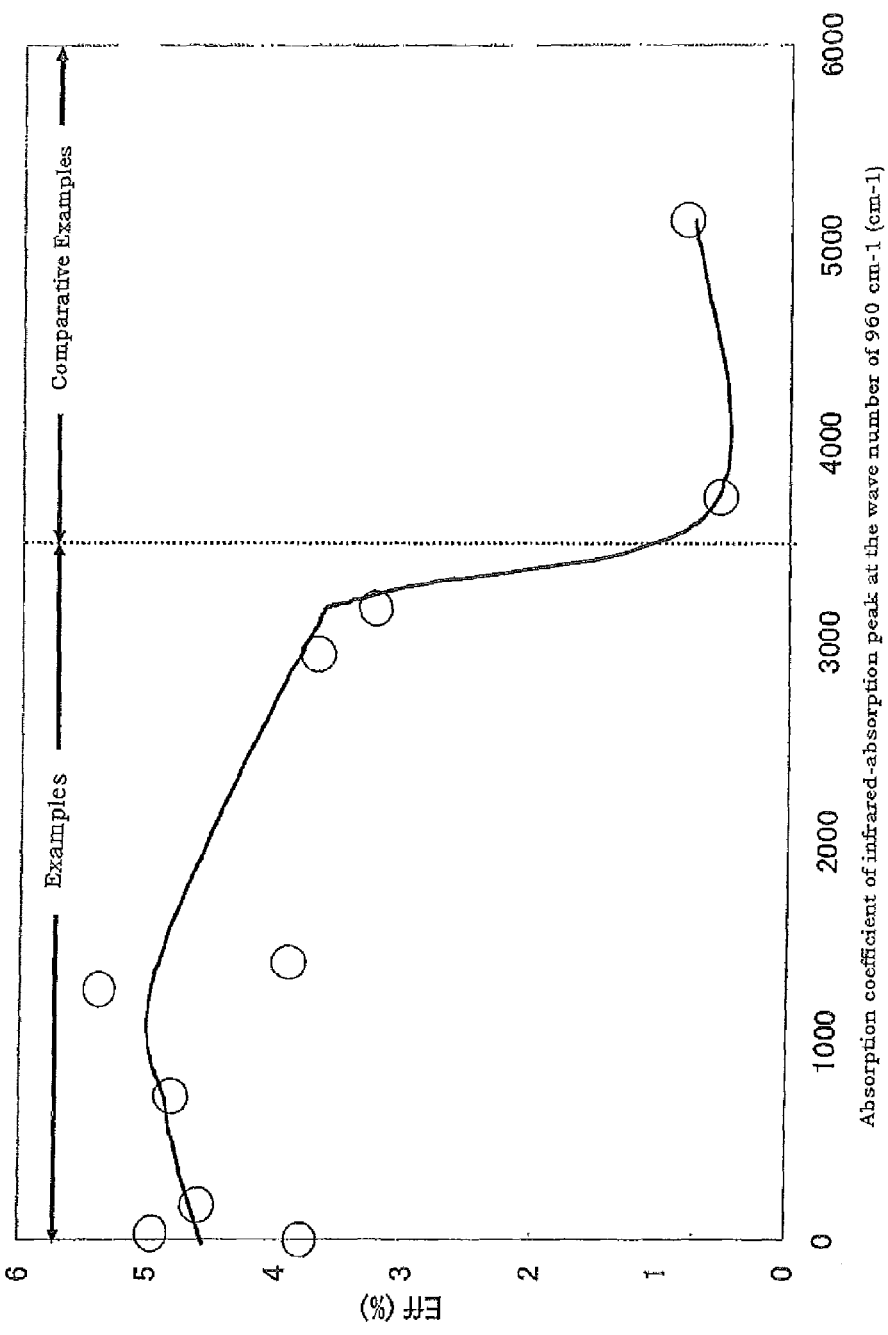
FIG. 24 shows a conversion efficiency Eff of a thin-film photoelectric converter relative to an absorption coefficient of the infrared-absorption peak at the wave number of 960 $cm^{-1}$ of a crystalline germanium photoelectric conversion layer.

FIG. 24 shows the Eff of a thin-film photoelectric converter relative to the absorption coefficient of an infrared-absorption peak at the wave number of 960 cm$^{-1}$. Independent of changes in the substrate temperature and changes in the high-frequency power density, when the absorption coefficient at the wave number of 960 cm$^{-1}$ becomes less than 3500 cm$^{-1}$, the Eff exhibits a high value of 3% or more. Moreover, when the absorption coefficient of the infrared-absorption peak at the wave number of 935±5 cm$^{-1}$ becomes less than 3000 cm$^{-1}$, the Eff exceeds 3.5%, which is more preferable. In the case where the absorption coefficient of an infrared-absorption peak at the wave number of 935±5 cm$^{-1}$ becomes less than 1300 cm$^{-1}$, this state is further preferable because the Eff exceeds 4.5%.

Examples 1 to 3, and Comparative Example 1

With respect to Examples 1 to 3 and Comparative Example 1, photoelectric conversion characteristics of a thin-film photoelectric converter relative to a (220)/(111) peak intensity ratio measured by X-ray diffraction of a crystalline germanium photoelectric conversion layer are shown.

Figure 25:
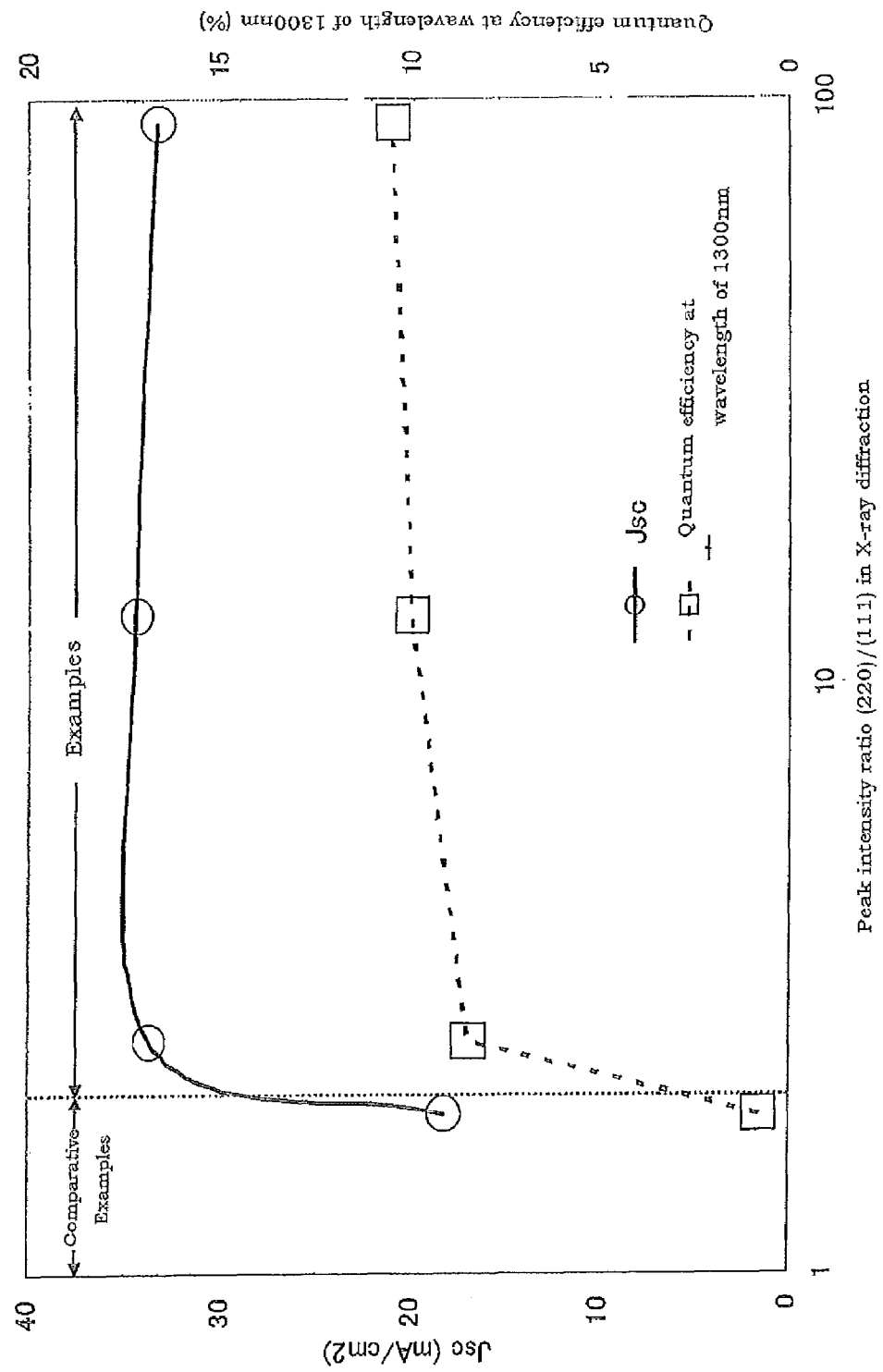
FIG. 25 shows a short circuit current density Jsc and a quantum efficiency at a wavelength of 1300 nm of a thin-film photoelectric converter relative to a peak intensity ratio (220)/(111) measured by X-ray diffraction of a crystalline germanium photoelectric conversion layer.

FIG. 25 shows the Jsc and quantum efficiency at a wavelength of 1300 nm of a thin-film photoelectric converter relative to the (220)/(111) peak intensity ratio. When the (220)/(111) peak intensity ratio becomes 2 or more, the Jsc exhibits a high value of 30 mA/cm$^2$ or more, with the quantum efficiency at a wavelength of 1300 nm exhibiting a high value exceeding 5% or more.

FIG. 26 shows the Eff of a thin-film photoelectric converter relative to the (220)/(111) peak intensity ratio. When the (220)/(111) peak intensity ratio becomes 2 or more, the Eff exhibits a high value of 3% or more. In the case where the (220)/(111) peak intensity ratio becomes 2.1 or more and 70 or less, this state is more preferable because the Eff exhibits a high value of 4% or more.

Example 9

Figure 2:
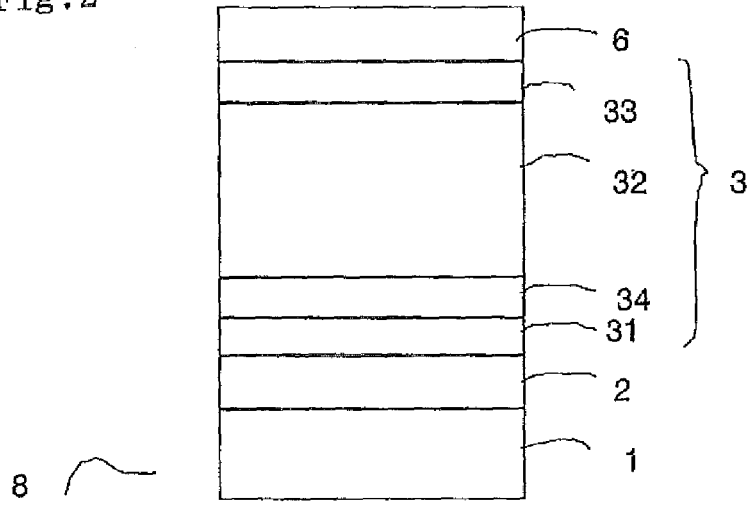
FIG. 2 is a schematic cross-sectional view that shows a single-junction thin-film photoelectric converter in accordance with another embodiment of the invention.

As Example 9, a single-junction thin-film photoelectric converter 8 similar to that of Example 1 was manufactured. The converter of Example 9 was manufactured in the same manner as in Example 1, except that, as shown in FIG. 2, a substantially intrinsic crystalline silicon layer 34 was placed between the p-type microcrystalline silicon layer 31 and the crystalline germanium photoelectric conversion layer 32. The intrinsic crystalline silicon layer 34 was formed with a film thickness of 100 nm by a high-frequency plasma enhanced CVD method, by using SiH$_4$ and H$_2$ as reaction gases.

The output characteristics of the photoelectric converter of Example 9 were measured in the same manner as in Example 1, and the following values were obtained: Voc=0.29 V, Jsc=34.6 mA/cm$^2$, FF=0.60, and Eff=6.0%. The quantum efficiency at a wavelength of 1300 nm was 9.8%. By disposing the substantially intrinsic crystalline silicon layer 34 between the p-type microcrystalline silicon layer 31 and the crystalline germanium photoelectric conversion layer 32, the Voc and FF were allowed to increase, and the Eff exhibited a high value of 6.0%. This is presumably because that the crystallinity of the crystalline germanium photoelectric conversion layer was improved and/or the defects in an interface between the p-type layer and the photoelectric conversion layer were reduced.

Example 10

As Example 10, a single-junction thin-film photoelectric converter similar to that of Example 9 was manufactured. The converter of Example 10 was manufactured in the same manner as in Example 9, except that a substantially intrinsic crystalline silicon layer 35 was placed between the crystalline germanium photoelectric conversion layer 32 and the n-type microcrystalline silicon layer 33. The intrinsic crystalline silicon layer 35 was formed with a film thickness of 100 nm by a high-frequency plasma enhanced CVD method, by using SiH$_4$ and H$_2$ as reaction gases.

The output characteristics of the photoelectric converter of Example 10 were measured in the same manner as in Example 1, and the following values were obtained: Voc=0.32 V, Jsc=34.5 mA/cm$^2$, FF=0.63, and Eff=7.0%. The quantum efficiency at a wavelength of 1300 nm was 9.9%. By disposing the substantially intrinsic crystalline silicon layer 35 between the crystalline germanium photoelectric conversion layer 32 and the n-type microcrystalline silicon layer 33, the Voc and FF were allowed to increase, and the Eff exhibited a high value of 7.0%. This is presumably because that the defects in an interface between the photoelectric conversion layer and the n-type layer were reduced.

Example 11

As Example 11, a triple-junction thin-film photoelectric converter 9 shown in FIG. 3 was manufactured. In Example 11, the same processes as those of Example 1 were carried out except for the following three points: that is, (1) an amorphous silicon photoelectric conversion unit 4 and a crystalline silicon photoelectric conversion unit 5 were successively disposed between the transparent electrode layer 2 and the crystalline germanium photoelectric conversion unit 3 of Example 1, (2) the film thickness of the crystalline germanium photoelectric conversion layer 32 was set to 2.5 µm, and (3) the transparent electrode layer 2 was made from only SnO$_2$.

On the transparent substrate 1, only SnO$_2$ was stacked as the transparent electrode layer 2.

An amorphous silicon photoelectric conversion unit 4 was formed on the transparent electrode layer 2 by using a plasma enhanced CVD device. As reaction gases, SiH$_4$, H$_2$, CH$_4$ and B$_2$H$_6$ were introduced so that a p-type amorphous silicon carbide layer 41 was formed with a thickness of 15 nm, and on this, an amorphous silicon photoelectric conversion layer 42 was then formed with a thickness of 80 nm by introducing SiH$_4$ as a reaction gas, and thereafter, by introducing SiH$_4$, H$_2$ and PH$_3$ as reaction gases, an n-type microcrystalline silicon layer 43 was formed with a thickness of 10 nm so that an amorphous silicon photoelectric conversion unit 3 was formed.

After forming the amorphous silicon photoelectric conversion unit 4, a p-type microcrystalline silicon layer 51 was formed with a thickness of 10 nm by introducing SiH$_4$, H$_2$ and B$_2$H$_6$ as reaction gases, and by introducing SiH$_4$ and H$_2$ as reaction gases, a crystalline silicon photoelectric conversion layer 52 was formed thereon with a thickness of 1.5 µm, and by introducing SiH$_4$, H$_2$ and PH$_3$ as reaction gases, an n-type microcrystalline silicon layer 53 was then formed with a thickness of 15 nm so that a crystalline silicon photoelectric conversion unit 5 was formed.

After the formation of the crystalline silicon photoelectric conversion unit 5, a crystalline germanium photoelectric conversion unit 3 and a back electrode layer 6 were successively formed.

The triple-junction thin-film photoelectric converter 9 (light-receiving area: 1 cm$^2$) thus obtained was irradiated with light of AM 1.5 at a intensity of light of 100 mW/cm$^2$ so that its output characteristic was measured; thus, an open circuit voltage (Voc) of 1.72 V, a short circuit current density (Jsc) of 11.5 mA/cm$^2$, a fill factor (FF) of 0.71, and a conversion efficiency (Eff) of 14.0% were obtained. The quantum efficiency at a wavelength of 1300 nm was 10.1%.

Example 12

As Example 12, a single-junction thin-film photoelectric converter similar to that of Example 1 was manufactured. In Example 12, the same processes as those of Example 1 were carried out to produce the crystalline germanium photoelectric conversion layer of FIG. 1, except for the following two points: that is, (1) the distance (ES) between the electrodes was set to 15 mm, and (2) the high-frequency power density was set to 850 mW/cm$^2$. In the same manner as in Example 1, a crystalline germanium layer was formed on a crystal silicon substrate and a glass substrate under the same conditions as those of the photoelectric conversion layer of the thin-film photoelectric converter, and the infrared-absorption spectrum was measured by the FTIR and the refractive index was measured by the spectral ellipsometry. Table 3 shows an absorption coefficient of an infrared-absorption peak at each of wave numbers 935 cm$^{-1}$ and 960 cm$^{-1}$, and a refractive index at a wavelength of 600 nm.

Upon forming the crystalline germanium photoelectric conversion layer of Example 12, the emission spectrum was measured by a measuring device shown in FIG. 32. FIGS. 33 and 34 show emission spectra. Ge atom light emission peaks were clearly observed at wavelengths of 265 nm and 304 nm.

As shown in Table 3, the output characteristics of the photoelectric converter of Example 12 were measured in the same manner as in Example 1, and the following values were obtained: Voc=0.25 V, Jsc=33.5 mA/cm$^2$, FF=0.63, and Eff=5.3%. The quantum efficiency at a wavelength of 1300 nm was 9.5%.

Example 13

As Example 13, a single-junction thin-film photoelectric converter similar to that of Example 12 was manufactured. In Example 13, upon forming the crystalline germanium photoelectric conversion layer, the same processes as those of Example 12 were carried out except that the distance between the electrodes ES was set to 12 mm. Table 3 shows the infrared-absorption coefficient and the refractive index in the same manner as in Example 12.

FIGS. 33 and 34 show emission spectra measured in the same manner as in Example 12. In Example 13, different from Example 12, only peaks in the noise level were found at wavelengths of 265 nm and 304 nm, and no Ge atom light emission peak was detected.

As shown in Table 3, the output characteristics of the photoelectric converter of Example 13 were measured in the same manner as in Example 1, and the following values were obtained: Voc=0.26 V, Jsc=34.9 mA/cm$^2$, FF=0.63, and Eff=5.7%. The quantum efficiency at a wavelength of 1300 nm was 11%.

Example 14

As Example 14, a single-junction thin-film photoelectric converter similar to that of Example 12 was manufactured. In Example 14, the same processes as those of Example 12 were carried out except that upon forming the crystalline germanium photoelectric conversion layer, plasma generation was started with the distance between the electrodes ES being set to 12 mm, and that the ES was changed to 15 mm without stopping the plasma. Table 3 shows the infrared-absorption coefficient and the refractive index in the same manner as in Example 12.

FIGS. 33 and 34 show emission spectra measured in the same manner as in Example 12. The measurements of the emission spectra were carried out after the ES was changed to 15 mm. In Example 14, different from Example 12, only peaks in the noise level were found at wavelengths of 265 nm and 304 nm, and no Ge atom light emission peak was detected.

As shown in Table 3, the output characteristics of the photoelectric converter of Example 14 were measured in the same manner as in Example 1, and the following values were obtained: Voc=0.27 V, Jsc=34.9 mA/cm$^2$, FF=0.60, and Eff=5.7%. Moreover, the quantum efficiency at a wavelength of 1300 nm was 11%.

Summary of Examples 12, 13 and 14

In Example 12, the Ge atom light emission peak was detected, and the quantum efficiency of light with long wavelengths was 9.5% and the Jsc was 33.5 mA/cm$^2$. In contrast, in Example 13, no Ge atom light emission peak was detected, and the quantum efficiency of light with long wavelengths was improved to 11%, and the Jsc was improved to 34.9 mA/cm$^2$. Since no Ge atom light emission peak was detected in Example 13, it was found that the density of Ge atoms having high reactivity was low. Therefore, it is considered that the chain reaction, as shown in formula 2, hardly occurs, with the result that the generation of a polymer and a cluster is suppressed, and a dense crystalline germanium semiconductor is consequently formed, thereby making it possible to improve the characteristics of a thin-film photoelectric converter.

The film-forming conditions were different between Examples 12 and 13 in that the ES's thereof are set to 15 mm and 12 mm, respectively. In Example 14, a plasma is generated with the ES being set to 12 mm, and with the plasma being not stopped and kept as it is, the ES is changed to 15 mm. Although Example 14 had the ES of 15 mm in the same manner as in Example 12, except at the start of film formation, no Ge atom light emission peak was detected. In addition, the characteristics of the thin-film photoelectric converters were substantially the same as those of Example 13, with Eff=5.7% being exhibited. Based upon this, it can be said that even when the ES is the same, the film characteristics of the crystalline germanium photoelectric conversion layer become different when a plasma state upon film-forming process is different.

Examples 15, 16, and 17

As Examples 15, 16 and 17, a single-junction thin-film photoelectric converter similar to that of Example 12 was manufactured. In Example 14, the same processes as those of Example 12 were carried out except that upon forming the crystalline germanium photoelectric conversion layer of FIG. 1, the ES was set to 9 mm in Example 15, 7.5 mm in Example 16, and 6.5 mm in Example 17. The infrared-absorption coefficient, the refractive index and characteristics of the thin-film photoelectric converter are shown in Table 3 in the same manner as in Example 12.

Examples 12, 13, 15, 16, and 17

With respect to Examples 12, 13, 15, 16 and 17, the absorption coefficient of the infrared-absorption peak, the refractive index at a wavelength of 600 nm and the characteristics of the photoelectric converter, relative to the ES of the crystalline germanium photoelectric conversion layer are shown in Table 3.

Figure 35:
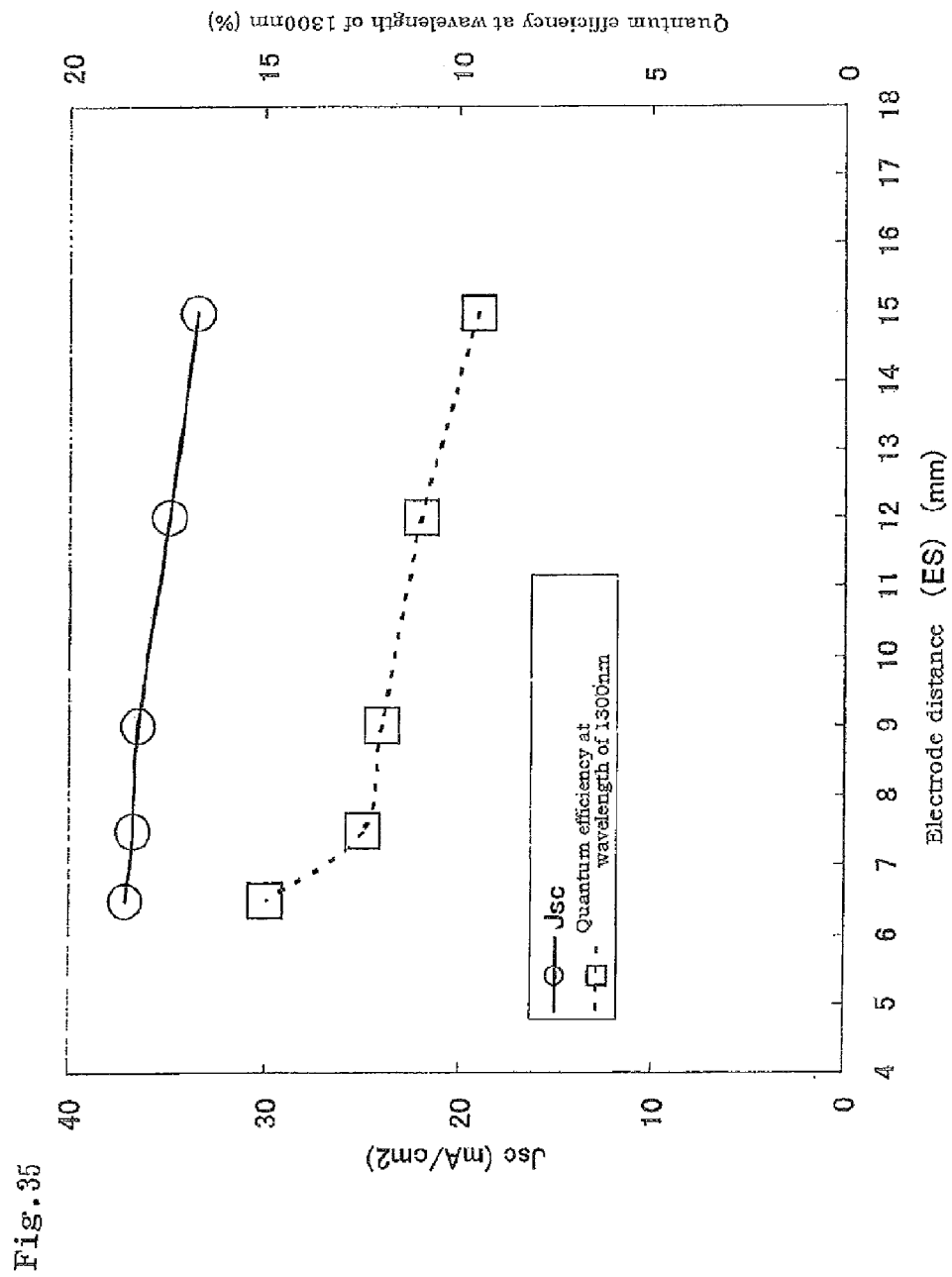
FIG. 35 shows a short circuit current density Jsc and a quantum efficiency at a wavelength of 1300 nm of a thin-film photoelectric converter relative to an electrode distance ES upon forming a crystalline germanium photoelectric conversion layer.

FIG. 35 illustrates the Jsc and the quantum efficiency at a wavelength of 1300 nm of the thin-film photoelectric converter relative to the ES when the crystalline germanium photoelectric conversion layer is formed. When the ES is reduced from 15 mm to 6.5 mm, the Jsc and quantum efficiency monotonically increase. When the ES is 12 mm or less, the Jsc has a value of about 35 mA/cm$^2$ or more, and the quantum efficiency at a wavelength of 1300 nm has a value exceeding 10%. Moreover, when the ES is set to 7.5 mm or less, the quantum efficiency at a wavelength of 1300 nm abruptly increases.

Figure 36:
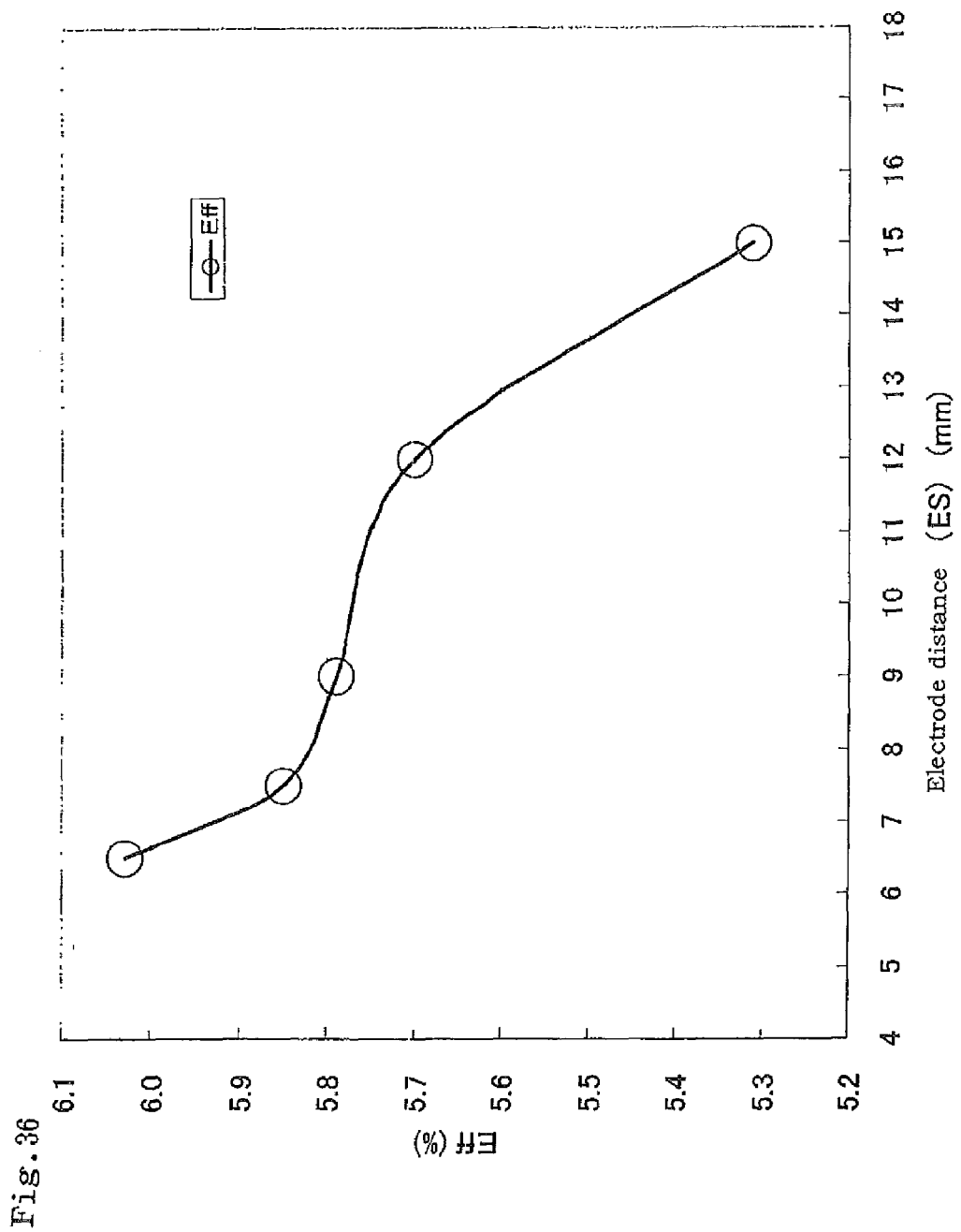
FIG. 36 shows a conversion efficiency Eff of a thin-film photoelectric converter relative to an electrode distance ES upon forming a crystalline germanium photoelectric conversion layer.

FIG. 36 shows the Eff of the thin-film photoelectric converter relative to the ES upon forming the crystalline germanium photoelectric conversion layer. As the ES reduces, the Eff increases, and when the ES is set to 12 mm or less, the Eff has a value of 5.5% or more. Moreover, when the ES is set to 7.5 mm or less, the Eff further increases.

Example 18

As Example 18, a single-junction thin-film photoelectric converter similar to that of Example 16 was manufactured. In Example 18, the same processes as those of Example 16 were carried out except that upon forming the crystalline germanium photoelectric conversion layer, a plasma enhanced CVD device provided with a hollow cathode-type electrode shown in FIG. 31 was used. A plurality of concave sections, each 3 mmϕ in diameter, 3 mm in depth and 5 mm in pitches, were formed as the concave sections of the hollow cathode. Moreover, a gas introduction hole was formed in the center of each of the concave sections. The infrared-absorption coefficient, the refractive index and the characteristics of the thin-film photoelectric converter are shown in Table 3 in the same manner as in Example 12.

As shown in Table 3, the infrared-absorption coefficient in Example 18 was not different so much from that of Example 16. In contrast, the refractive index of Example 18 was 5.38, that was higher than 5.01 of Example 16. With respect to the uniformity, the film-thickness distribution was ±7% in Example 16, while that of Example 18 was ±4%.

As shown in Table 3, the output characteristics of the photoelectric converter of Example 18 were measured in the same manner as in Example 1, and the following values were obtained: Voc=0.27 V, Jsc=38.3 mA/cm², FF=0.61, and Eff=6.3%. The quantum efficiency at a wavelength of 1300 nm was 16%. By using the hollow cathode-type electrode, the uniformity was improved even in the case of a narrow ES, and the characteristics of the crystalline germanium photoelectric conversion layer were improved; that is, the refractive index was increased, and the Jsc, the quantum efficiency of light with long wavelengths and the Eff were improved. The reason for the improvement in uniformity is because the electron density becomes higher by the concave sections of the hollow cathode and the stability of plasma improves. Although not clarified, in the plasma enhanced CVD device provided with a hollow cathode-type electrode, the reason for the improvement of the crystalline germanium photoelectric conversion layer is presumably because a desirable state is prepared for accelerating the generation of radicals that effectively function upon film-forming, as well as for suppressing polymer and cluster generation.

Examples 19 to 23

As Examples 19 to 23, a single-junction thin-film photoelectric converter similar to that of Example 16 was manufactured. The same manufacturing processes as those of Example 16 were carried out except that upon forming the crystalline germanium photoelectric conversion layer of FIG. 1, the pressure was set to 670 Pa in Example 19, 850 Pa in Example 20, 930 Pa in Example 21, 1000 Pa in Example 22 and 1330 Pa in Example 23. The infrared-absorption coefficient, the refractive index and characteristics of the thin-film photoelectric converter are shown in Table 4.

FIG. 37 shows the Jsc and the quantum efficiency at a wavelength of 1300 nm of the thin-film photoelectric converter relative to the pressure upon forming the crystalline germanium photoelectric conversion layer. When the pressure is raised from 670 Pa, the Jsc increases, and is brought into a nearly saturated state at a pressure of 800 Pa or more. In addition, the quantum efficiency is also brought into a saturated state after an increase along with the increase in the pressure. At the pressure of 800 Pa, the Jsc becomes 35 mA/cm² or more, and the quantum efficiency at a wavelength of 1300 nm becomes a value exceeding 10%.

FIG. 38 shows the Eff of the thin-film photoelectric converter relative to the pressure upon forming the crystalline germanium photoelectric conversion layer. As the pressure increases, the Eff increases, and becomes a maximum value at 850 Pa, and then gradually decreases. In a pressure range from 800 Pa to 1330 Pa, the Eff exhibits a high value of 5.9% or more, and at a pressure of 850 Pa, the Eff exhibits a high value of 6.1%.

Upon forming the crystalline germanium photoelectric conversion layer, the pressure is preferably set to 800 Pa or more, based upon FIGS. 37 and 38. The upper limit of the pressure is desirably set to 2000 Pa or less in order to enhance the crystallinity, and is further desirably set to 1500 Pa or less in order to improve the uniformity, and is more desirably set to 1330 Pa or less, based upon FIGS. 37 and 38.

Example 24

As Example 24, a single-junction thin-film photoelectric converter similar to that of Example 1 was manufactured, and characteristics of the thin-film photoelectric converter relative to the refractive index at a wavelength of 600 nm were examined. A large number of thin-film photoelectric converters were manufactured, while conditions upon forming the crystalline germanium photoelectric conversion layer of FIG. 1 were changed in the following manner: that is, with the substrate temperature being changed within 200 to 300° C., the high-frequency power density being changed within 300 to 1400 mW/cm², the flow ratio of $H_2/GeH_4$ being changed within 500 to 2000 times, the ES being changed within 6.5 to 15 mm, and the pressure being changed within 670 to 1330 Pa. In any of the photoelectric converters, the infrared-absorption coefficient at a peak of 935 cm$^{-1}$ was set to less than 6000 cm$^{-1}$, and the infrared-absorption coefficient at a peak of 960 cm$^{-1}$ was set to less than 4000 cm$^{-1}$.

FIG. 39 shows the Jsc and the quantum efficiency at a wavelength of 1300 nm of the thin-film photoelectric converter relative to the refractive index at a wavelength of 600 nm of the crystalline germanium photoelectric conversion layer. As a reference, data of Comparative Examples 1 and 2 are shown in the drawing as comparative examples. As the refractive index increases, the quantum efficiency of light having long wavelengths, which has been 1% or less, increases, and becomes 5% or more at a refractive index of 4.0 or more. As the refractive index increases, the Jsc also increases, and at the refractive index of 4.0 or more, the Jsc has a high value of 30 mA/cm² or more, and the Jsc then exhibits a higher value exceeding 35 mA/cm² at the refractive index of 4.9 or more.

FIG. 40 shows the Eff of the thin-film photoelectric converter relative to the refractive index at a wavelength of 600 nm of the crystalline germanium photoelectric conversion layer. As a reference, data of Comparative Examples 1 and 2 are shown in the drawing as comparative examples. As the refractive index increases, the Eff increases, and the Eff exhibits a value of 3.0% or more when the refractive index becomes 4.0 or more. Moreover, by further increasing the refractive index to 4.7 or more, the Eff tends to be brought into a saturated state. By setting the refractive index to 4.7 or more, the Eff is allowed to stably exhibit a high value of 5.5% or more.

FIG. 41 shows an absorption coefficient at 935 cm$^{-1}$ (α@935 cm$^{-1}$) obtained by FTIR, and a refractive index (n) relative to light having a wavelength of 600 nm of a crystalline germanium photoelectric conversion layer, relative to the Eff of a single-junction photoelectric converter having a crystalline germanium photoelectric conversion layer. With respect to the photoelectric converter having good characteristics with the Eff being set to 3.7% or more, there is great fluctuation in the infrared-absorption spectrum to cause a difficulty in determining the quality; however, the refractive index has a good correlation with the Eff, indicating that it is desirably used as an index for determining the quality of a crystalline germanium semiconductor.

From FIGS. 39 to 41, the refractive index is preferably set to 4.0 or more, more preferably to 4.7 or more, further preferably to 4.9 or more. However, when the refractive index exceeds 5.6, it becomes greater than the refractive index of single crystal germanium, which may cause a fear of impurity contamination with heavy metals, so that the refractive index is desirably set to 5.6 or less.

TABLE 3

| | Electrode Distance ES (mm) | Electrode | Voc (V) | Jsc (mA/cm$^2$) | FF | Eff (%) | Quantum Efficiency at Wavelength of 1300 nm (%) | Absorption Coefficient of Infrared-Absorption Peak | | Refractive index at 600 nm |
|---|---|---|---|---|---|---|---|---|---|---|
| | | | | | | | | 935 cm$^{-1}$ (cm$^{-1}$) | 960 cm$^{-1}$ (cm$^{-1}$) | |
| Example 12 | 15 | Parallel plane | 0.25 | 33.5 | 0.93 | 5.3 | 9.5 | 2150 | 1320 | 4.55 |
| Example 13 | 12 | Parallel plane | 0.26 | 34.9 | 0.63 | 5.7 | 11 | 900 | 470 | 4.73 |
| Example 14 | Changed from 12 to 15 | Parallel plane | 0.27 | 34.9 | 0.60 | 5.7 | 11 | 930 | 520 | 4.71 |
| Example 15 | 9 | Parallel plane | 0.26 | 36.5 | 0.61 | 5.8 | 12 | 850 | 400 | 4.97 |
| Example 16 | 7.5 | Parallel plane | 0.27 | 36.8 | 0.59 | 5.9 | 12.5 | 670 | 340 | 5.01 |
| Example 17 | 6.5 | Parallel plane | 0.26 | 37.2 | 0.62 | 6.0 | 15 | 720 | 360 | 5.19 |
| Example 18 | 7.5 | hollow cathode | 0.27 | 38.3 | 0.61 | 6.3 | 16 | 650 | 290 | 5.38 |

TABLE 4

| | Pressure (Pa) | Electrode | Voc (V) | Jsc (mA/cm$^2$) | FF | Eff (%) | Quantum Efficiency at Wavelength of 1300 nm (%) | Absorption Coefficient of Infrared-Absorption Peak | | Refractive index at 600 nm |
|---|---|---|---|---|---|---|---|---|---|---|
| | | | | | | | | 935 cm$^{-1}$ (cm$^{-1}$) | 960 cm$^{-1}$ (cm$^{-1}$) | |
| Example 19 | 670 | Parallel plane | 0.36 | 33.9 | 0.61 | 5.4 | 9.9 | 630 | 280 | 4.67 |
| Example 16 | 800 | Parallel plane | 0.27 | 36.8 | 0.59 | 5.9 | 12.5 | 670 | 340 | 5.01 |
| Example 20 | 850 | Parallel plane | 0.27 | 38.1 | 0.59 | 6.1 | 15.8 | 600 | 250 | 5.35 |
| Example 21 | 930 | Parallel plane | 0.27 | 37.4 | 0.60 | 6.1 | 15.1 | 680 | 310 | 5.18 |
| Example 22 | 1000 | Parallel plane | 0.26 | 37.6 | 0.62 | 6.0 | 15.3 | 650 | 300 | 5.22 |
| Example 23 | 1330 | Parallel plane | 0.26 | 37.2 | 0.61 | 5.9 | 14.8 | 720 | 390 | 5.23 |

DESCRIPTION OF REFERENCE NUMERALS

1 Transparent substrate
2 Transparent electrode layer
3 Crystalline germanium photoelectric conversion unit
31 p-type microcrystalline silicon layer
32 Crystalline germanium photoelectric conversion layer
33 n-type microcrystalline silicon layer
34 Substantially intrinsic crystalline silicon layer
35 Substantially intrinsic crystalline silicon layer
4 Amorphous silicon photoelectric conversion unit
41 p-type amorphous silicon carbide layer
42 Substantially intrinsic amorphous silicon photoelectric conversion layer
43 n-type microcrystalline silicon layer
5 Crystalline silicon photoelectric conversion unit
51 p-type microcrystalline silicon layer
52 Photoelectric conversion layer with substantially intrinsic crystalline silicon layer
53 n-type microcrystalline silicon layer
6 Back electrode layer
7 Thin-film photoelectric converter
8 Thin-film photoelectric converter
9 Thin-film photoelectric converter
10 Vacuum chamber
11 High-frequency electrode
12 Substrate-side electrode
13 Substrate
14 Plasma
15 Gas introduction tube
16 Insulating member
17 Exhaust pipe
18 High-frequency power supply
19 Hollow cathode-type electrode
20 Window
21 Lens
22 Optical fiber
23 Spectrometer

The invention claimed is:

1. A thin-film photoelectric converter, comprising:
one or more photoelectric conversion units, each provided with a photoelectric conversion layer sandwiched between a p-type semiconductor layer and an n-type semiconductor layer, wherein
at least one of the photoelectric conversion layers of the one or more photoelectric conversion units comprises an intrinsic or weak n-type crystalline germanium semiconductor, the crystalline germanium semiconductor has an absorption coefficient of less than 6000 cm$^{-1}$ for an infrared-absorption peak at a wave number of 935±5 cm$^{-1}$, and a Raman scattering spectrum of the crystalline germanium semiconductor shows no peak in a wave number range of 400±10 cm$^{-1}$.

2. The thin-film photoelectric converter according to claim 1, wherein the crystalline germanium semiconductor has an absorption coefficient of less than 3500 cm$^{-1}$ for an infrared-absorption peak at a wave number of 960±5 cm$^{-1}$.

3. The thin-film photoelectric converter according to claim 1, wherein the crystalline germanium semiconductor has an intensity ratio between a (220) peak and a (111) peak measured by X-ray diffraction that is set to 2 or more.

4. The thin-film photoelectric converter according to claim 1, wherein the photoelectric conversion layer has a structure in which a substantially intrinsic crystalline silicon semiconductor and the crystalline germanium semiconductor are stacked.

5. The thin-film photoelectric converter according to claim 1, wherein the thin-film photoelectric converter has three photoelectric conversion units, and wherein a first photoelectric conversion unit having an amorphous silicon semiconductor as the photoelectric conversion layer, a second photoelectric conversion unit having a crystalline silicon semiconductor as the photoelectric conversion layer, and a third photoelectric conversion unit including the crystalline germanium semiconductor as the photoelectric conversion layer are successively stacked from a light incident side.

6. A method for manufacturing a thin-film photoelectric converter, the thin-film photoelectric converter comprising one or more photoelectric conversion units, each provided with a photoelectric conversion layer sandwiched between a p-type semiconductor layer and an n-type semiconductor layer, at least one of the photoelectric conversion layers of the one or more photoelectric conversion units comprising an intrinsic or weak n-type crystalline germanium semiconductor, wherein the crystalline germanium semiconductor is formed by using a high-frequency discharging plasma enhanced CVD method using a frequency of from 10 to 100 MHz, thereby having an absorption coefficient of less than 6000 cm$^{-1}$ for an infrared-absorption peak at a wave number of 935±5 cm$^{-1}$, and a Raman scattering spectrum of the crystalline germanium semiconductor shows no peak in a wave number range of −400±10 cm$^{-1}$.

7. The method for manufacturing a thin-film photoelectric converter according to claim 6, wherein the crystalline germanium semiconductor is formed at a substrate temperature of 250° C. or more.

8. The method for manufacturing a thin-film photoelectric converter according to claim 6, wherein the crystalline germanium semiconductor is formed at a high-frequency power density of 550 mW/cm$^2$ or more.

9. The method for manufacturing a thin-film photoelectric converter according to claim 6, wherein the crystalline germanium semiconductor is formed by using a plasma enhanced CVD device, the device being provided with a substrate-side electrode and a high-frequency electrode, a substrate being arranged on the substrate-side electrode, and wherein a distance (E/S) between the high-frequency electrode and the substrate is set to 12 mm or less.

10. The method for manufacturing a thin-film photoelectric converter according to claim 6, wherein the crystalline germanium semiconductor is formed by using a plasma enhanced CVD device, the device being provided with a substrate-side electrode and a high-frequency electrode, a substrate being arranged on the substrate-side electrode, and wherein the high-frequency electrode is a hollow-cathode type electrode.

11. The method for manufacturing a thin-film photoelectric converter according to claim 6, wherein, upon forming the crystalline germanium semiconductor, neither a Ge atom light emission peak having a peak at a wavelength of 265 nm±2 nm nor a Ge atom light emission peak having a peak at a wavelength of 304 nm±2 nm is detected in an emission spectrum of a high-frequency discharging plasma.

12. The method for manufacturing a thin-film photoelectric converter according to claim 6, wherein the crystalline germanium semiconductor is formed at a pressure of 800 Pa or more.

13. The thin-film photoelectric converter according to claim 1, wherein the crystalline germanium semiconductor has a refractive index of 4.0 or more relative to light having a wavelength of 600 nm.

14. The thin-film photoelectric converter according to claim 1, wherein the crystalline germanium semiconductor has a refractive index of 4.7 or more relative to light having a wavelength of 600 nm.

15. The thin-film photoelectric converter according to claim 1, wherein the crystalline germanium semiconductor has a refractive index of 4.9 or more relative to light having a wavelength of 600 nm.

* * * * *